(12) United States Patent
Koshido

(10) Patent No.: US 7,042,056 B2
(45) Date of Patent: May 9, 2006

(54) CHIP-SIZE PACKAGE PIEZOELECTRIC COMPONENT

(75) Inventor: Yoshihiro Koshido, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 202 days.

(21) Appl. No.: 10/484,832

(22) PCT Filed: Jul. 23, 2003

(86) PCT No.: PCT/JP03/09309

§ 371 (c)(1),
(2), (4) Date: Jan. 26, 2004

(87) PCT Pub. No.: WO2004/012331

PCT Pub. Date: Feb. 5, 2004

(65) Prior Publication Data

US 2004/0232802 A1    Nov. 25, 2004

(30) Foreign Application Priority Data

Jul. 31, 2002   (JP) .............................. 2002-222608
Jul. 16, 2003   (JP) .............................. 2003-198053

(51) Int. Cl.
H01L 29/84     (2006.01)
H01L 41/04     (2006.01)

(52) U.S. Cl. ..................... 257/414; 257/415; 257/416; 257/420; 257/E27.006; 310/328; 310/348; 29/25.35

(58) Field of Classification Search ..................... None
See application file for complete search history.

(56) References Cited

U.S. PATENT DOCUMENTS 5,448,014 A * 9/1995 Kong et al. ................. 174/52.3
6,231,169 B1 * 5/2001 Yazaki et al. ................. 347/70

FOREIGN PATENT DOCUMENTS

| EP | 0 939 485 A1 | 9/1999 |
|----|----|----|
| JP | 64-051707 | 2/1989 |
| JP | 04-086012 A | 3/1992 |
| JP | 05-090885 | 4/1993 |
| JP | 06-318625 | 11/1994 |
| JP | 08-116227 | 5/1996 |
| JP | 08-213874 | 8/1996 |
| JP | 09-246905 | 9/1997 |
| JP | 10-032293 | 2/1998 |
| JP | 10-093383 | 4/1998 |
| JP | 10-303690 A | 11/1998 |
| JP | 11-150441 | 6/1999 |
| JP | 2001-060642 | 3/2001 |
| JP | 2001-094390 | 4/2001 |
| JP | 2001-244785 | 9/2001 |
| JP | 2003-037471 | 2/2003 |

* cited by examiner

Primary Examiner—David Nelms
Assistant Examiner—Long Tran
(74) Attorney, Agent, or Firm—Keating & Bennett, LLP

(57) ABSTRACT

A surface acoustic wave device includes a SAW having an IDT disposed on a piezoelectric substrate, a conductive pad connected to the IDT, and a bonding substrate, wherein the SAW is bonded to the bonding substrate such that a protective space of the IDT is provided. The bonding substrate includes a through-hole in which an external terminal connection member connected to the conductive pad and an external terminal are disposed. The SAW is bonded to the bonding substrate by an adhesive layer including a solder layer.

17 Claims, 46 Drawing Sheets

PROCESS STEP 1

PROCESS STEP 2

PROCESS STEP 3

PROCESS STEP 4

PROCESS STEP 5

PROCESS STEP 6

PROCESS STEP 7

PROCESS STEP 8

PROCESS STEP 9

PROCESS STEP 1

PROCESS STEP 2

PROCESS STEP 3

PROCESS STEP 1

PROCESS STEP 2

PROCESS STEP 3

PROCESS STEP 4

PROCESS STEP 5

PROCESS STEP 6

PROCESS STEP 7

PROCESS STEP 8

PROCESS STEP 9

PROCESS STEP 10

PROCESS STEP 1

PROCESS STEP 2

PROCESS STEP 3

PROCESS STEP 1

PROCESS STEP 2

PROCESS STEP 3

PROCESS STEP 4

PROCESS STEP 5

PROCESS STEP 6

PROCESS STEP 7

PROCESS STEP 8

PROCESS STEP 9

PROCESS STEP 10

PROCESS STEP 11

CHIP-SIZE PACKAGE PIEZOELECTRIC COMPONENT

BACKGROUND OF THE INVENTION

1. Field of the Invention

The present invention relates to a piezoelectric component, such as a surface acoustic wave device or a piezoelectric thin film filter used in a delay line, a filter, other suitable component, and a method for manufacturing the piezoelectric component, and, particularly, to a chip-size packaged piezoelectric component and a method for manufacturing the chip-size packaged piezoelectric component.

2. Description of the Related Art

With compact and lightweight designs used in electronic apparatuses today, multi-function electronic components are required. Compact and lightweight design is also required for a piezoelectric component including a surface acoustic wave filter (hereinafter referred to as a SAW filter) and a piezoelectric thin-film resonator, which defines a surface acoustic wave device for use in communication apparatuses, such as cellular phones.

A piezoelectric filter includes piezoelectric resonators arranged in a ladder configuration or a lattice configuration. The piezoelectric resonator includes an Si substrate having one of an opening and a recess, and a vibrator disposed in the opening or the recess of the Si substrate and having a structure in which a thin film section, including at least one piezoelectric thin film layer (of ZnO or AlN), is sandwiched between at least a pair of opposed upper and lower electrodes with the top surface and the bottom surface of the thin film section respectively facing the upper electrode and the lower electrode. Alternatively, the piezoelectric resonator includes the Si substrate which does not have an opening or a recess, and the vibrator wherein space is arranged between the lower electrode and the Si substrate. Since such a piezoelectric filter uses vibration of a thickness-longitudinal mode generated in a vibrator, a vibration space must be provided and the vibrator must be protected from moisture and dirt.

The surface acoustic wave filter includes a pair of comb-like electrodes (interdigital transducers, hereinafter referred to as IDT) made of a metal, such as Al, and arranged on a piezoelectric substrate made of a crystal, $LiTaO_3$, or $LiNbO_3$. In the surface acoustic wave filter, a vibration space such as a propagation path of a surface acoustic wave of the IDT or the piezoelectric substrate must be provided and the IDT must be protected from moisture and dirt.

In the above-mentioned piezoelectric filter and surface acoustic wave filter, a die bond agent is applied to the bottom surface of a package made of a ceramic, such as alumina, elements of a piezoelectric filter and a surface acoustic wave filter are die bonded to the package, and terminals on the inside of the package are wire bonded to electrodes of the elements. The package is then encapsulated with a lid. To miniaturize the piezoelectric filter and the surface acoustic wave filter, electrode lands are disposed on the bottom surface of the package made of alumina, for example, the piezoelectric filter and the surface acoustic wave filter are mounted on the package using flip-chip bonding, and the package is then encapsulated with a lid.

Even if the piezoelectric filter and the surface acoustic wave filter are miniaturized in the above-described arrangement, a compact and low profile design cannot be implemented unless the package is miniaturized. Furthermore, miniaturized packages are costly. In the piezoelectric filter, in particular, the vibrator is disposed in the opening portion or a recess of the substrate. The vibrator is susceptible to damage due to an impact in a dicing step of the element or in pickup and die bond steps of the element during mounting of the element.

In contrast, elements are mounted using bumps as disclosed in Patent Document 1 (Japanese Unexamined Patent Application Publication No. 2001-94390), Patent Document 2 (Japanese Unexamined Patent Application Publication No. 11-150441), and Patent Document 3 (Japanese Unexamined Patent Application Publication No. 2001-60642). According to these documents, flip-chip bonding is used to bond SAW elements to bumps provided on a base substrate, thereby eliminating the space required for wire bonding. Thus, the SAW filters are miniaturized. However, a conductive pad for a bump must be arranged on the SAW element, which reduces an effective area of the SAW element. Thus, miniaturization is difficult and the costs of producing bumps are incurred.

According to Patent Document 4 (Japanese Unexamined Patent Application Publication No. 2001-244785), a SAW element is mounted on a base substrate having a through-hole facing an extension electrode of the SAW element. An electrically conductive agent fills the through-hole, thereby forming an external circuit connection portion. The SAW filter is thus miniaturized.

In the arrangement disclosed in Patent Document 4, a SAW element and a base substrate are bonded together using a resin sealant. A corrosive component included in the resin, and moisture permeating the resin can corrode the IDT of the SAW element. With the IDT corroded, the performance of the SAW filter deteriorates.

SUMMARY OF THE INVENTION

To overcome the problems described above, preferred embodiments of the present invention provide a piezoelectric component which enables miniaturization and prevents performance deterioration, and a method for manufacturing such a novel piezoelectric component.

The piezoelectric component according to a preferred embodiment of the present invention includes a piezoelectric element having at least one vibrator and an element wiring line connected to the vibrator disposed on a substrate, and a bonding substrate that is bonded to the vibrator such that a protective space is provided for the vibrator, wherein the bonding substrate includes a through-hole and an external terminal that is connected to the element wiring line through an external connection terminal member disposed in the through-hole, and wherein the piezoelectric element is bonded to the bonding substrate by an adhesive layer including a solder layer.

In the arrangement described above, the piezoelectric element is bonded to the bonding substrate using solder, and the vibrator is encapsulated. This arrangement keeps moisture from the outside (the atmosphere) away from the vibrator, and prevents corrosion of the vibrator. The solder does not emit a corrosive gas. For this reason, the performance of the piezoelectric element does not deteriorate.

A piezoelectric component according to another preferred embodiment of the present invention includes a piezoelectric element having at least one vibrator and an element wiring line connected to the vibrator disposed on a substrate, and a bonding substrate that is bonded to the vibrator such that a protective space is provided for the vibrator, wherein the piezoelectric element is bonded to the bonding substrate by an adhesive layer including a solder layer, wherein the piezoelectric component includes a resin layer between the piezoelectric element and the bonding substrate, which has a desired thickness to provide a protective space for the vibrator and having an opening portion, and a first wiring line arranged in the opening portion in the resin layer and connected to the element wiring line, and wherein the bonding substrate includes a through-hole and the first wiring line is connected to an external terminal through an external connection terminal member disposed in the through-hole.

In the above-described arrangement, the piezoelectric element is bonded to the bonding substrate using solder, and the vibrator is encapsulated. This arrangement keeps moisture from the outside (the atmosphere) away from the vibrator, and prevents corrosion of the vibrator. The solder does not emit a corrosive gas. For this reason, performance of the piezoelectric component does not deteriorate. The resin layer maintains the protective space of the vibrator. For this reason, reliability in maintaining the protective space is improved, and the performance of the piezoelectric element does not deteriorate. The use of the external terminal connection member in the above-described arrangement reduces the number of wiring lines. Thus, the piezoelectric component is miniaturized.

In the piezoelectric component according to preferred embodiments of the present invention, the first wiring line preferably includes one of a capacitance and an inductor. This arrangement eliminates the need for a separate capacitance or a separate inductor, thereby further miniaturizing the piezoelectric component.

A piezoelectric component according to another preferred embodiment of the present invention includes a piezoelectric element having at least one vibrator disposed on a substrate and an element wiring line connected to the vibrator, and a bonding substrate that is bonded to the vibrator such that a protective space is provided for the vibrator, wherein the piezoelectric element is bonded to the bonding substrate by an adhesive layer including a solder layer, wherein the bonding substrate includes a through-hole and a second wiring line that is connected to the element wiring line through the through-hole, wherein the piezoelectric component includes an upper insulating layer having an opening portion that is arranged such that the second wiring line is partially exposed, and wherein the second wiring line is connected to an external terminal through an external terminal connection member disposed in the opening portion.

In the above-described arrangement, the piezoelectric element is bonded to the bonding substrate using solder, and the vibrator is encapsulated. This arrangement keeps moisture from the outside (the atmosphere) away from the vibrator, and prevents corrosion of the vibrator. The solder does not emit a corrosive gas. For this reason, performance of the piezoelectric component does not deteriorate. The use of the external terminal connection member in the above-described arrangement reduces the number of wiring lines. Thus, the piezoelectric component is miniaturized.

In the piezoelectric component according to this preferred embodiment of the present invention, the second wiring line preferably includes one of a capacitance and an inductor. This arrangement eliminates the need for a separate capacitance or a separate inductor, thereby further miniaturizing the piezoelectric component.

The piezoelectric component of a preferred embodiment of the present invention preferably includes a resin layer provided between the piezoelectric element and the bonding substrate, and having a desired thickness to provide a protective space of the vibrator.

In the piezoelectric component of a preferred embodiment of the present invention, the resin layer preferably includes an opening portion corresponding to at least the vibrator and a portion of the element wiring line connected to the vibrator.

The above-described arrangement prevents molten solder from spreading, thereby preventing contact with the electrodes of the vibrator and short circuits.

In the piezoelectric component of a preferred embodiment of the present invention, the adhesive layer including the solder layer is disposed in an outline extending along the wiring line of at least the piezoelectric element and the bonding substrate.

In the piezoelectric component of a preferred embodiment of the present invention, the protective space may be maintained by the thickness of the adhesive layer.

In the piezoelectric component of a preferred embodiment of the present invention, the protective space is preferably maintained by a recess that is provided in the bonding substrate at a location facing the vibrator of the piezoelectric element. In this arrangement, the protective space of the vibrator is more reliably maintained.

In the piezoelectric component of a preferred embodiment of the present invention, a metal layer is preferably disposed in the recess. The metal layer blocks the effect of electromagnetic waves from the outside.

The solder layer preferably includes a plurality of sublayers, including, at least, an Sn sublayer, and a sublayer made of one of Au, Ag, Cu, and Ni or other suitable material.

The piezoelectric component preferably includes a bonding layer between the element wiring line of the piezoelectric element and the solder layer of the adhesive layer. The bonding layer preferably includes a plurality of sublayers, and the top most sublayer is preferably made of one of Au and Ag or other suitable material. The bonding layer preferably includes a plurality of sublayers, and the bottom most sublayer is preferably made of one of Ti and NiCr or other suitable material.

The bonding layer preferably includes an underlayer between the bonding substrate and the solder layer, wherein the underlayer is a laminate of a layer made of one of Ni, Cu, Pt, and Pd, or other suitable material, and a layer made of one of Ti and NiCr or other suitable material.

The piezoelectric element may be a surface acoustic wave element having the vibrator including at least one interdigital transducer disposed on a piezoelectric substrate.

The piezoelectric element may be a thin-film piezoelectric element disposed in a recess or an opening portion of the substrate, wherein the thin-film piezoelectric element includes at least one piezoelectric resonator having the vibrator that includes a thin film section, including at least one piezoelectric thin film layer, that is sandwiched between at least a pair of opposed upper and lower electrodes with the top surface and the bottom surface of the thin film section respectively facing the upper electrode and the lower electrode.

The piezoelectric element may be a thin-film piezoelectric element including the vibrator disposed on the substrate, and in which a thin film section including at least one piezoelectric thin film layer is sandwiched between at least a pair of opposed upper and lower electrodes with the top surface and the bottom surface of the thin film section respectively facing the upper electrode and the lower electrode, and wherein the piezoelectric thin film element includes a space between the substrate and the lower electrode of the vibrator.

Preferably, the substrate of the piezoelectric element is made of Si, and the bonding substrate is made of hard glass.

Since Si and hard glass have similar linear thermal expansion coefficients, stress, deflection, and distortion caused by a difference in linear thermal expansion coefficient are controlled. Thus, the reliability of the piezoelectric component is improved.

A method for manufacturing a piezoelectric component according to another preferred embodiment of the present invention including a piezoelectric element, having at least one vibrator disposed on a substrate and an element wiring line connected to the vibrator, and a bonding substrate that is bonded to the vibrator by an adhesive layer including a solder layer such that the bonding substrate faces the vibrator, includes a step of manufacturing the piezoelectric element by disposing the at least one vibrator, and the element wiring line connected to the vibrator on the substrate, a step of forming a through-hole in the bonding substrate, a step of bonding the piezoelectric element to the bonding substrate by the adhesive layer including the solder layer such that a protective space of the vibrator is maintained, a step of disposing an external terminal connection member for connection to the element wiring line through the through-hole, and a step of disposing an external terminal for connection to the external terminal connection member.

The element wiring line is preferably aligned with the through-hole in the step of bonding the piezoelectric element to the bonding substrate using the solder layer such that the protective space of the vibrator is maintained.

A method for manufacturing a piezoelectric component according to another preferred embodiment of the present invention including a piezoelectric element, having at least one vibrator and an element wiring line connected to the vibrator disposed on a substrate, and a bonding substrate that is bonded to the vibrator by an adhesive layer including a solder layer such that the bonding substrate faces the vibrator, includes a step of manufacturing the piezoelectric element by disposing the at least one vibrator on the substrate, and the element wiring line connected to the vibrator, a step of bonding the piezoelectric element to the bonding substrate by the adhesive layer including the solder layer such that a protective space of the vibrator is maintained, a step of forming a through-hole in the bonding substrate, a step of disposing an external terminal connection member for connection to the element wiring line through the through-hole, and a step of disposing an external terminal for connection to the external terminal connection member.

In the above-described arrangement, the piezoelectric element is bonded to the bonding substrate using solder, and the vibrator is encapsulated. This arrangement keeps moisture from the outside (the atmosphere) away from the vibrator, and prevents corrosion of the vibrator. The solder does not emit a corrosive gas. For this reason, performance of the piezoelectric component does not deteriorate. Elements to be connected to the external terminal, such as bumps and wires, which enlarge the component, are eliminated. The piezoelectric component is thus miniaturized. The external terminal may be mounted at any appropriate location which improves design freedom. Thus, an external circuit is easily connected.

In a method for manufacturing a piezoelectric component of a preferred embodiment of the present invention, as an alternative method to the above-described method, the piezoelectric element is preferably bonded to the bonding substrate by forming the solder layer by printing after forming a resin layer on one of the piezoelectric element and the bonding substrate, in the step of bonding the piezoelectric element to the bonding substrate by the adhesive layer including the solder layer such that the protective space of the vibrator is maintained.

The above-described arrangement prevents molten solder from spreading, thereby preventing contact with the electrodes of the vibrator and short circuits. Thus, the manufacturing yield of the piezoelectric component is improved.

In a method for manufacturing a piezoelectric component of a preferred embodiment of the present invention, as an alternative method to the above-described method, the piezoelectric element is preferably bonded to the bonding substrate by alloying a first metal layer disposed on the piezoelectric component with a second metal layer disposed on the bonding substrate, in the step of bonding the piezoelectric element to the bonding substrate by the adhesive layer including the solder layer such that the protective space of the vibrator is maintained.

In accordance with the above-described method, the piezoelectric element is bonded to the bonding substrate by alloying the first metal with the second metal, and the vibrator is encapsulated. This arrangement keeps moisture from the outside (the atmosphere) away from the vibrator, and prevents corrosion of the vibrator. The solder does not emit a corrosive gas. For this reason, performance of the piezoelectric component does not deteriorate.

The protective space of the vibrator is preferably maintained by forming a recess in the bonding substrate. In this manner, a miniaturized piezoelectric component is easily obtained.

In a method for manufacturing a piezoelectric component of a preferred embodiment of the present invention, the through-hole is preferably formed using wet etching with a resist pattern or a sand blast process.

In a method for manufacturing a piezoelectric component of a preferred embodiment of the present invention, as an alternative method to the above-described method, the through-hole is preferably formed using a laser etching process.

In a method for manufacturing a piezoelectric component of a preferred embodiment of the present invention, as an alternative method to the above-described method, the external terminal connection member and/or the external terminal is preferably formed using metal vapor deposition.

In a method for manufacturing a piezoelectric component of a preferred embodiment of the present invention, as an alternative method to the above-described method, the external terminal connection member and/or the external terminal is preferably produced using a sintering process after printing electrically conductive paste. The external terminal is preferably produced by disposing a wiring line of electrically conductive paste after printing the electrically conductive paste in the through-hole.

In a method for manufacturing a piezoelectric component of a preferred embodiment of the present invention, as an alternative method to the above-described method, a mother substrate having a plurality of piezoelectric elements is preferably produced, and the mother substrate is preferably diced after the bonding substrate is bonded to the mother substrate.

The above-described arrangement substantially prevents misalignment between the bonding substrate and the piezoelectric element. Thus, high-quality piezoelectric components are manufactured in bulk.

The bonding substrate is preferably smaller than the mother substrate. This arrangement substantially reduces deviation due to a difference in linear thermal expansion coefficient between the piezoelectric element and the bonding substrate during bonding. High-quality piezoelectric components are thus manufactured.

The piezoelectric element is preferably a surface acoustic wave element having a vibrator including an interdigital transducer disposed on the substrate.

The piezoelectric element is preferably a thin-film piezoelectric element disposed in a recess or an opening portion of the substrate, wherein the thin-film piezoelectric element includes the vibrator that has a thin film section including at least one piezoelectric thin film layer that is sandwiched between at least a pair of opposed upper and lower electrodes with the top surface and the bottom surface of the thin film section respectively facing the upper electrode and the lower electrode.

The piezoelectric element is preferably a thin-film piezoelectric element having a vibrator disposed on the substrate, and having a thin film section including at least one piezoelectric thin film layer that is sandwiched between at least a pair of opposed upper and lower electrodes with the top surface and the bottom surface of the thin film section respectively facing the upper electrode and the lower electrode, and wherein the piezoelectric thin film element includes a space between the substrate and the lower electrode of the vibrator.

In the piezoelectric component of various preferred embodiments of the present invention, the piezoelectric element, such as the surface acoustic wave element or the piezoelectric thin-film element, is bonded to the bonding substrate using solder to encapsulate the vibrator of the surface acoustic wave element, or the piezoelectric thin-film resonator. Preferred embodiments of the present invention thus provide a piezoelectric component in which the vibrator is not corroded by corrosive gases, which could develop from moisture or a resin if the resin were used for bonding. The performance of the piezoelectric component according to preferred embodiments of the present invention is also free from performance deterioration.

Other features, elements, characteristics, steps and advantages of the present invention will become more apparent from the following detailed description of preferred embodiments with reference to the attached drawings.

DETAILED DESCRIPTION OF PREFERRED EMBODIMENTS

First Preferred Embodiment

One preferred embodiment of the present invention will now be discussed with reference to FIG. 1 through FIG. 3, and FIG. 9 through FIG. 13.

Figure 3:
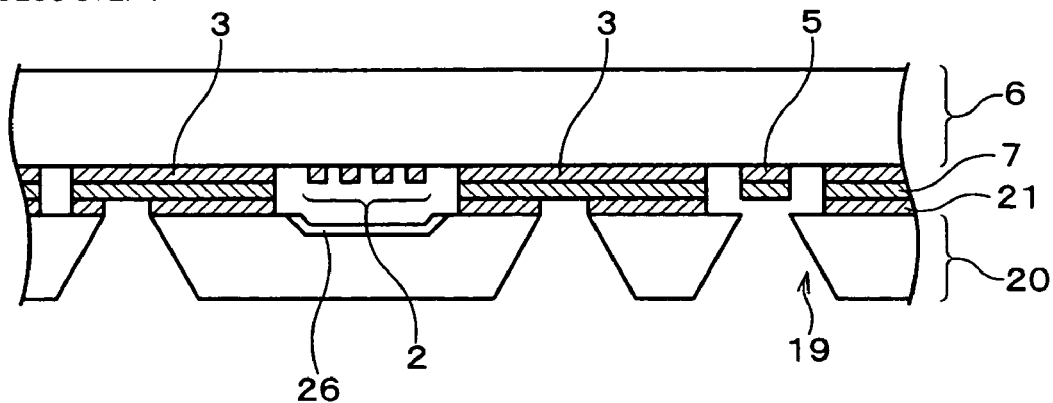
FIG. 3 illustrates, in cross section, process steps of manufacturing the surface acoustic wave device in accordance with the first preferred embodiment of the present invention.
Figure 3:
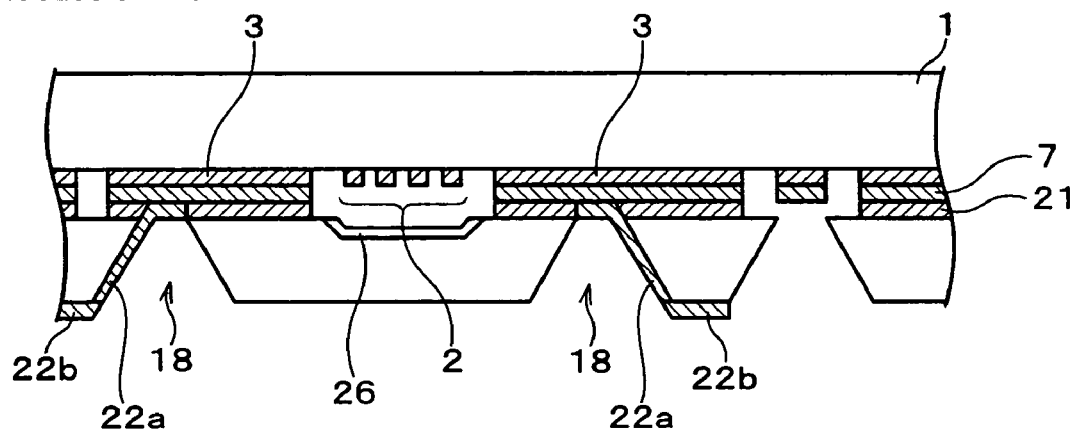
Figure 3:
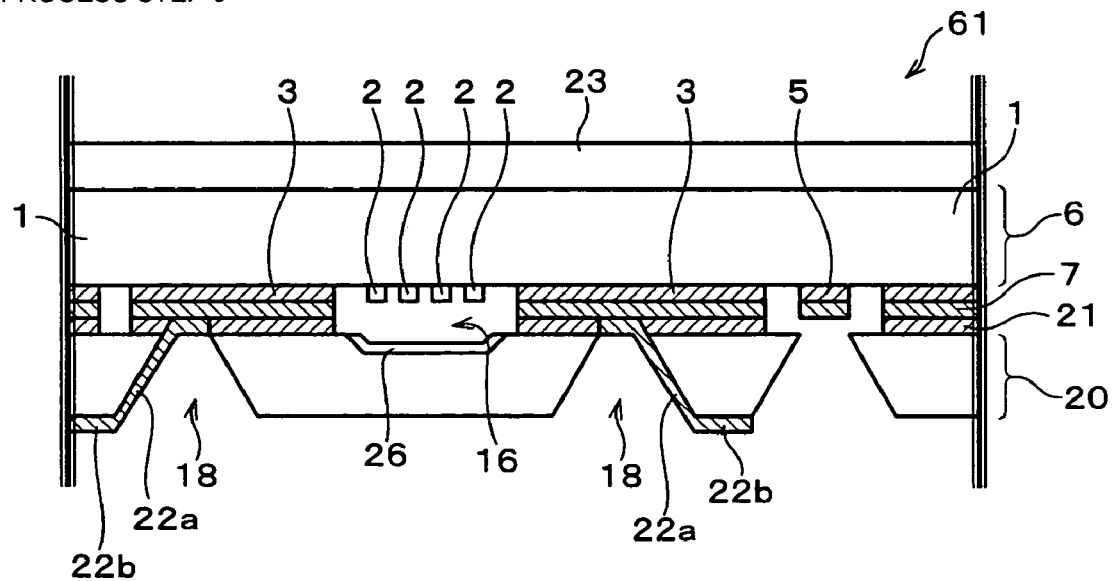

Referring to FIG. 3, a surface acoustic wave filter of the present preferred embodiment is a chip-size packaged SAW filter (piezoelectric component) 61 in which a SAW element (piezoelectric element) 6 and a bonding substrate 20 are bonded together using an adhesive layer 21 including a solder layer.

The SAW element 6 includes at least one IDT (vibrator) 2 and a conductive pad (element wiring line) 3 on the surface thereof facing the bonding substrate 20. When the bonding substrate 20 is bonded to the SAW element 6, an excitation portion protection cavity (recess) 16 for protecting an excitation portion of a surface acoustic wave of the IDT 2 (to prevent contact of the IDT with the bonding substrate) is produced in the bonding substrate 20 on the surface thereof facing the SAW element 6. The excitation portion protection cavity 16 and the thickness of the adhesive layer 21 maintain a space for protecting the excitation portion of the surface acoustic wave of the IDT 2 of the SAW element 6. The use of the excitation portion protection cavity 16 provides a low-profile design in the SAW filter. If the excitation portion protection cavity is not provided, only the thickness of the adhesive layer 21 is used to define a space to protect the excitation portion of the surface acoustic wave of the IDT 2. The thickness of the adhesive layer 21 may be adjusted using a tool that controls the height of two parallel metal plates. The two metal plates having a high flatness have a spacer, manufactured with high precision, sandwiched therebetween.

The bonding substrate 20 includes a through-hole 18 to connect the conductive pad 3 of the SAW element 6 to the outside. An external terminal connection member 22a and an external terminal 22b are disposed along the through-hole 18. The external terminal connection member 22a and the external terminal 22b extend along the through-hole 18 on a surface of the bonding substrate that is different than the surface of the bonding substrate that includes a recess. The location of external terminal connection member 22a and the external terminal 22b may be shifted from a location in alignment with an external circuit. That is to say, the design freedom of the mounting position of the external terminal is improved.

A metal layer 26 is preferably disposed in the excitation portion protection cavity. The metal layer 26 controls the effect of the electromagnetic wave from the outside.

A method for manufacturing the SAW filter is discussed in detail with reference to FIG. 1 through FIG. 3.

Figure 1:
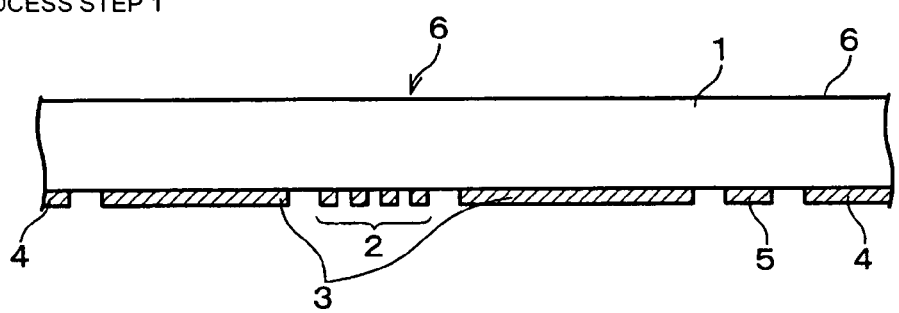
FIG. 1 illustrates, in cross section, process steps of manufacturing a surface acoustic wave device in accordance with a first preferred embodiment of the present invention.
Figure 1:
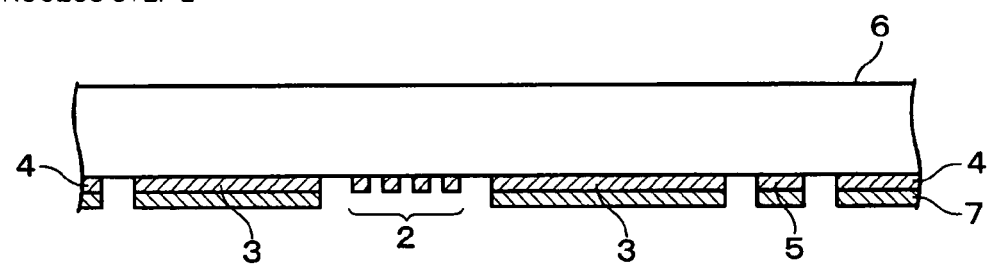

Referring to FIG. 1, a SAW element is manufactured in process steps 1–2.

In process step 1, the IDT 2, the conductive pad 3, a reflector (not shown), and a routed wiring line (element wiring line) (not shown) are formed on a piezoelectric substrate 1 preferably made of LiTaO$_3$ and preferably having a thickness of, for example, about 0.35 mm and a diameter of, for example, about 100 mm. In other words, the IDT 2, the conductive pad 3, the reflector (not shown), and the routed wiring line (element wiring line) are preferably made of Al, for example, on the piezoelectric substrate 1 preferably made of LiTaO$_3$ using a deposition liftoff method. In this manner, the SAW element 6 is produced. During a deposition liftoff process, an outline frame is arranged along an outline (dicing line) of a SAW chip. The outline frame is preferably used as an underlayer for hermetically sealing outline frame 4 when the SAW chip is bonded to the bonding substrate later. The dicing line may be thickened to function as an underlayer of the hermetically sealed outline frame. An alignment mark 5 is provided. The alignment mark 5 is used to align the SAW element 6 with the bonding substrate when the SAW element 6 is bonded to the bonding substrate. The alignment mark 5 is not limited to any particular shape or dimensions. The alignment mark 5 here is preferably a circle having a diameter of, for example, about 10 µm.

In process step 2, a bonding layer 7 to be bonded to the bonding substrate is disposed in desired locations other than on the IDT 2 and the reflector (not shown). The bonding layer 7 is preferably made of a material having a high solder wettability, such as Au, Ag, Cu, or Pt, or other suitable material. The bonding layer 7 is preferably formed using the liftoff method, for example. More than a single bonding layer 7 may be deposited to reduce the resistance in the conductive pad 3 and routed wiring lines (not shown). For example, layers of Ti (100 nm)/Pd (100 nm)/Au (200 nm) may be successively laminated in that order on the conductive pad 3 and the routed wiring lines (not shown). The Pd layer is formed to prevent spreading of solder, and, in some instances, may be omitted. Instead of the Pd layer, a Ni layer may be formed. The Ti layer is an adhesive layer which causes the Au layer or the Pd layer to bond to the SAW element 6. Instead of the Ti layer, a NiCr layer may be formed.

The Au layer in the bonding layer 7 is also referred to as a solder layer because connection is established when Sn of the solder layer spreads. In the bonding layer 7, Ag or Cu may be used instead of Au.

When the bonding layer 7 is deposited, a layer for reinforcing the strength of the SAW element 6 is concurrently formed on the surface of the piezoelectric substrate 1 such that the characteristics of the SAW element are not affected. Referring to FIG. 1, a single SAW element 6 is provided, however, a piezoelectric substrate 1 may include a plurality of SAW elements 6 arranged thereon as a mother substrate.

Figure 2:
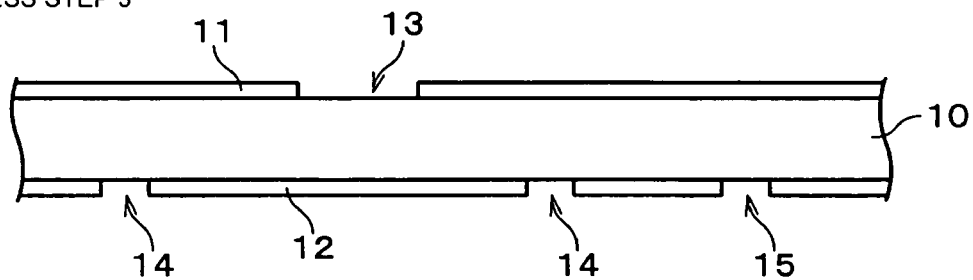
FIG. 2 illustrates, in cross section, process steps of manufacturing the surface acoustic wave device in accordance with the first preferred embodiment of the present invention.
Figure 2:
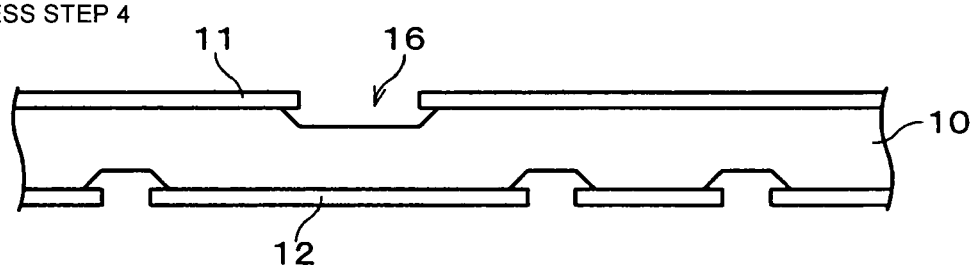
Figure 2:
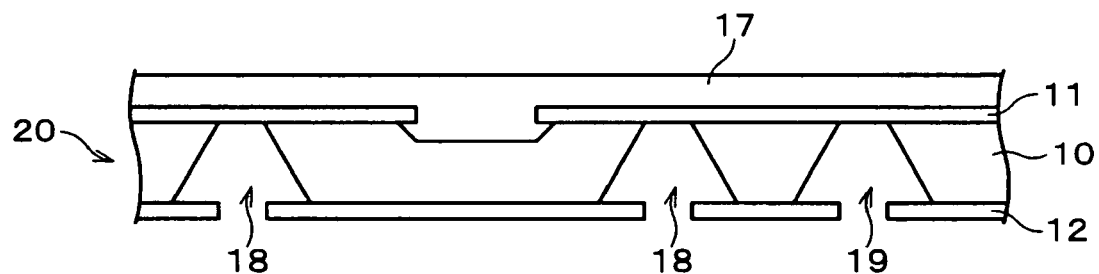
Figure 2:
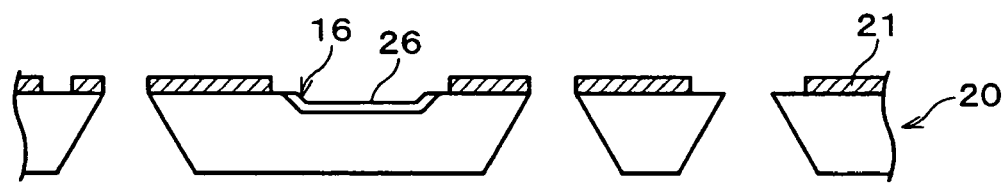

As shown in FIG. 2, the bonding substrate is manufactured in process step 3—process step 6.

In process step 3, a resist pattern 11 having an opening portion 13 is disposed on one surface of a glass substrate 10 preferably having a thickness of, for example, about 0.10 mm and a diameter of, for example, about 100 mm (a surface of the glass substrate 10 facing a surface of the LiTaO$_3$ piezoelectric substrate 1 bearing the IDT 2 (hereinafter referred to as a surface A)). The opening portion 13 forms a cavity structure to protect the IDT 2.

A resist pattern 12 having an opening portion 14 and an opening portion 15 for an alignment mark is disposed on the other surface of the glass substrate 10 (hereinafter referred to as a surface B). The opening portion 14 defines a through-hole through which a connection to the conductive pad is established. The opening portion 15 for the alignment mark is preferably also substantially circular and is concentric with the alignment mark.

In process step 4, the two surfaces of the glass substrate 10 are half etched by a depth of, for example, about 30 µm with hydrofluoric acid. In this manner, the excitation portion protection cavity 16 is produced.

In process step 5, a resist pattern 17 is applied on the entire surface A of the glass substrate 10 to protect the excitation portion protection cavity 16. The glass substrate 10 is full-etched with hydrofluoric acid or other suitable etching material in accordance with the resist pattern 12 of the surface B of the glass substrate 10 to form the through-holes 18 and 19. Since the etching is performed from one surface, the through-holes 18 and 19 are tapered. The resist patterns 11, 12, and 17 are then peeled off. The bonding substrate 20 is thus produced. Referring to FIG. 2, a single bonding substrate 20 is shown. However, a plurality of bonding substrates 20 may be formed on the glass substrate 10.

In process step 6, the adhesive layer 21 is disposed on the surface A of the bonding substrate (glass substrate 10) 20. The adhesive layer 21 is formed by depositing a resist pattern having an opening facing the bonding layer 7, and by subjecting the opening to the liftoff method. The adhesive layer 21 includes an underlayer of Ti (100 nm)/Ni (1 µm) deposited on the bonding substrate 20 using vapor deposition and a solder layer deposited on the underlayer using vapor deposition. The solder layer has a thickness at which the solder is difficult to spread. For example, the solder layer is preferably about 5 µm thick, for example. The solder is preferably made of Sn—Ag for following reason. When the solder is molten, Ni spreads, and a Sn—Ag—Ni alloy having a high melting point is created. Re-melting is avoided in subsequent process steps. The solder may be a Sn—Au solder, or a Sn—Zn solder. In view of environmental concerns, the solder is preferably Pb free.

In this process step 6, a metal layer 26 made of the same metal as the underlayer is preferably deposited in the excitation portion protection cavity 16. The metal layer 26 provides shield effects, which control the effects of the electromagnetic wave from the outside. In process step 6, solder is prevented from sticking to the areas of the excitation portion protection cavity 16, and the through-holes 18 and 19. The adhesive layer 21, disposed on the bonding substrate 20, prevents solder from sticking to the IDT 2.

As shown in FIG. 3, in process step 7, the SAW element 6 produced in process steps 1–2 is disposed on and bonded to the adhesive layer 21 produced in process steps 3–6 in a reflow furnace. In this manner, the IDT 2 is encapsulated by the bonding layer 7 and the adhesive layer 21. This arrangement keeps moisture, corrosive gas, and other impurities away from the IDT 2, and the IDT 2 is prevented from corroding. Performance drop of a finished SAW filter is thus controlled. During placement, the alignment mark 5 of the SAW element 6 is aligned with an alignment through-hole 19 of the bonding substrate 20. In this manner, the conductive pad 3 of the SAW element 6 is also aligned with the through-hole 18 of the bonding substrate 20. Since the glass substrate and the LiTaO$_3$ piezoelectric substrate have a high flatness, temporary fixing is easily performed during placement. Since the transparent glass substrate is used, alignment is performed with high precision. The alignment marks are reduced in size, an element effective area in the LiTaO$_3$ piezoelectric substrate is increased, and multiple functions may be provided. The required area of the LiTaO$_3$ piezoelectric substrate is reduced, thereby reducing the size of the element itself. Referring to FIG. 3, a pair of the SAW element 6 and the bonding substrate 20 is shown, however, a plurality of pairs is produced in practice.

In process step 8, a liftoff resist (not shown) having an opening matching a predetermined wiring line pattern is disposed on the surface B of the bonding substrate 20. The opening of the resist is formed such that an external terminal connection member to be connected to the conductive pad 3 of the SAW element 6 is formed in the through-hole 18 of the bonding substrate 20 (the glass substrate 10). The wiring line pattern is produced such that an L component or a C component is provided on the surface B of the bonding substrate 20. A laminate of metal layers of Au (200 nm)/Pd (100 nm)/Ti (100 nm) defining a wiring line is deposited onto the liftoff resist using vapor deposition, and the resist is then lifted off. In this manner, the external terminal connection member 22a and the external terminal 22b are arranged on the bonding substrate 20. External terminals connected to the conductive pad 3 of the SAW element 6 are produced.

In process step 9, a buffering resin layer 23 is disposed on substantially the entire surface of the SAW element 6 to buffer an impact expected during mounting. The buffering resin layer 23 can be omitted. Finally, the SAW filter is completed by dicing the laminate along a desired line.

In the above-described method, a glass substrate is used for the bonding substrate 20. The present invention is not limited to the glass substrate. For example, a monocrystal $SiO_2$ (crystal) substrate or a fused silica substrate may be used. Since these substrates permit wet etching, the through-hole, and the excitation portion protection cavity are easily formed at low costs. The bonding substrate 20, in particular, is preferably transparent to facilitate an alignment process.

The bonding substrate 20 is preferably segmented into a smaller size (chip). In this manner, deviation between the SAW element and the bonding substrate occurring due to a difference in linear thermal expansion coefficient between the two elements during bonding is reduced. The dicing operation dices the laminate into the individual SAW filters.

When the solder layer is formed by printing, a heat resistant resin pattern (resin layer), made of a heat resistant resin such as photosensitive polyimide, benzocyclobutene, cyclic olefin resin, or epoxy resin, is preferably arranged beforehand so as to surround the solder layer such that the solder layer maintains a desired thickness. This arrangement prevents short-circuits that could occur if molten solder spreads and contacts the IDT. Before the formation of the solder layer by printing, the heat resistant resin is applied in a desired pattern on the piezoelectric substrate 1 of the SAW element 6 or the bonding substrate such that an opening is formed on the IDT 2 and a portion of the conductive pad 3. The heat resistant resin pattern is preferably cured at a high temperature. The heat resistant resin pattern, if cured at a high temperature, emits no corrosive gases. The heat resistant resin pattern is preferably arranged beforehand so as to surround an excitation portion of the surface acoustic wave of the IDT. This arrangement reliably prevents molten solder from contacting the IDT. The use of the heat resistant resin pattern improves manufacturing yields of the SAW filters.

For example, a metal layer, such as a Ti layer, is preferably disposed on the surface of the $LiTaO_3$ piezoelectric substrate 1 of the SAW element 6 having no IDT 2. The Ti metal layer controls the effects of the electromagnetic layer from the outside.

The buffering resin layer 23 may be made of a resin with electrical conductivity or a resin without electrical conductivity. The buffering resin layer 23 having electrical conductivity is preferable. For example, the buffering resin layer 23 may be an epoxy resin including Ag particles. By imparting electrical conductivity to the buffering resin layer 23, the effects of the electromagnetic wave from the outside are effectively controlled.

The formation method of the external terminal in the bonding substrate 20 is not limited to the above-described method. For example, the through-hole 18 of the bonding substrate 20 is filled with an electrically conductive paste, or a sufficient thickness of the electrically conductive paste is printed on the through-hole 18. The electrically conductive paste is then sintered to produce the external terminal connection member 22a and the external terminal 22b. The electrically conductive paste may be a resin based Ag paste, a solder paste, and an Sn paste and a Zn paste, both sintered at a low temperature. Since the wiring lines on the bonding substrate 20 are disposed at the same time, the manufacturing process of the SAW filter is simplified.

The wiring line may be formed by etching after a metal is deposited on the entire surface B of the bonding substrate 20.

In the description above, the bonding layer 7 of the SAW element 6 is bonded to the adhesive layer 21 of the bonding substrate 10 using solder. Alternatively, the bonding layer 7 may be made of a Zn layer (a first metal layer) (having a melting point of 420° C.), the adhesive layer 21 may be made of an Sn layer (a second metal layer) (having a melting point of 232° C.), and these two layers may be processed at a temperature of, for example, about 300° C. to create an Sn—Zn alloy for bonding. The Zn layer and the Sn layer may be disposed on the bonding layer and the adhesive layer, respectively, or may be disposed on the adhesive layer and the bonding layer, respectively. Any metals are acceptable for the bonding layer and the adhesive layer as long as the metals have a relatively low melting point and form an alloy.

The use of an electrically conductive material for the adhesive layer provides a shielding effect to thereby improve filter performance.

A modification of the surface acoustic wave filter of the present preferred embodiment will now be discussed with reference to FIG. 9 through FIG. 12. In this modification, a resin layer disposed on the SAW element maintains a space to protect the excitation portion of the surface acoustic wave of the IDT in the SAW element.

Figure 9:
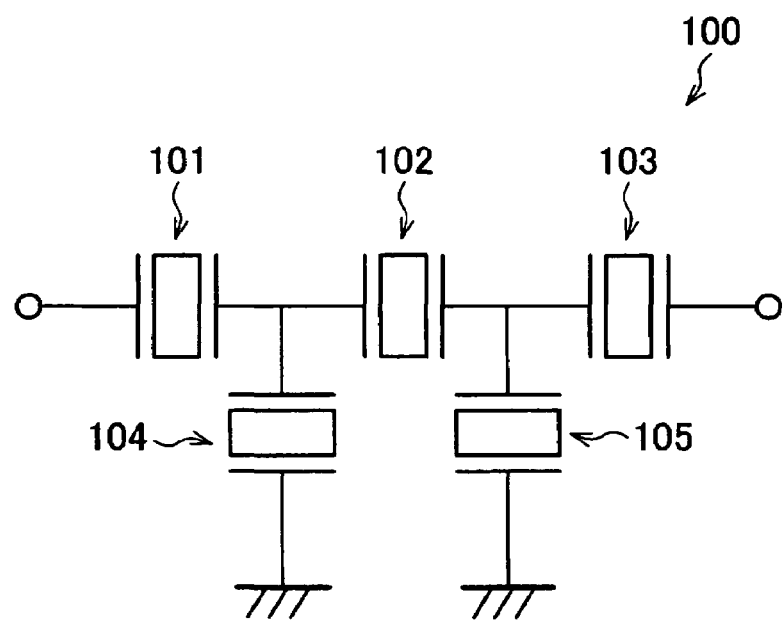
FIG. 9 is a circuit diagram of a surface acoustic wave device in accordance with a modification of the first preferred embodiment of the present invention.

FIG. 9 is a circuit diagram of a surface acoustic wave filter 100 in accordance with the modification of the present preferred embodiment. The surface acoustic wave filter 100 includes surface acoustic wave resonators 101–105, each having an IDT (vibrator), arranged in a ladder configuration. The surface acoustic wave resonators 101–103 are serial resonators, and the surface acoustic wave resonators 104 and 105 are parallel resonators.

The surface acoustic wave filter 100 is now discussed with reference to FIG. 10 and FIG. 11.

Figure 10:
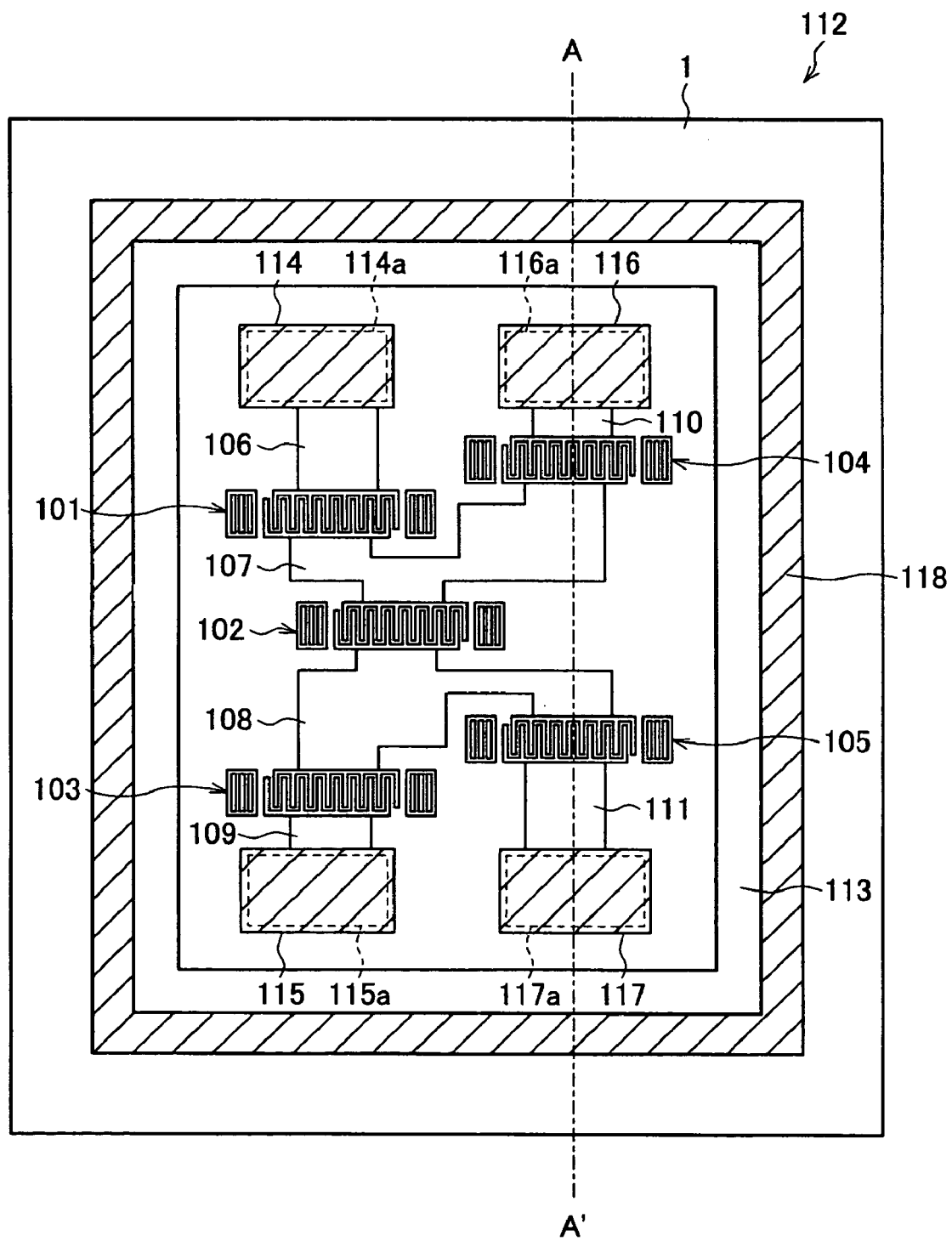
FIG. 10 is a plan view of a surface acoustic wave element of the surface acoustic wave device in accordance with the modification of the first preferred embodiment of the present invention.

Referring to FIG. 10, the surface acoustic wave resonators 101–105, electrode pads (element wiring lines) 114a–117a, and routed wiring lines (element wiring lines) 106–111 are disposed on the piezoelectric substrate 1 to produce a SAW element 112. A resin layer 113 is disposed on the piezoelectric substrate 1 such that the resin layer 113 surrounds the surface acoustic wave resonators 101–105, the electrode pads 114a–117a, and the routed wiring lines 106–111. Adhesive layers 114–117 made of an electrically conductive material, such as solder, are disposed on the electrode pads 114a–117a, and an adhesive layer 118 made of solder is disposed on the piezoelectric substrate 1 surrounding the resin layer 113. The adhesive layers 114–117 and the adhesive layer 118 may be concurrently formed.

Figure 11:
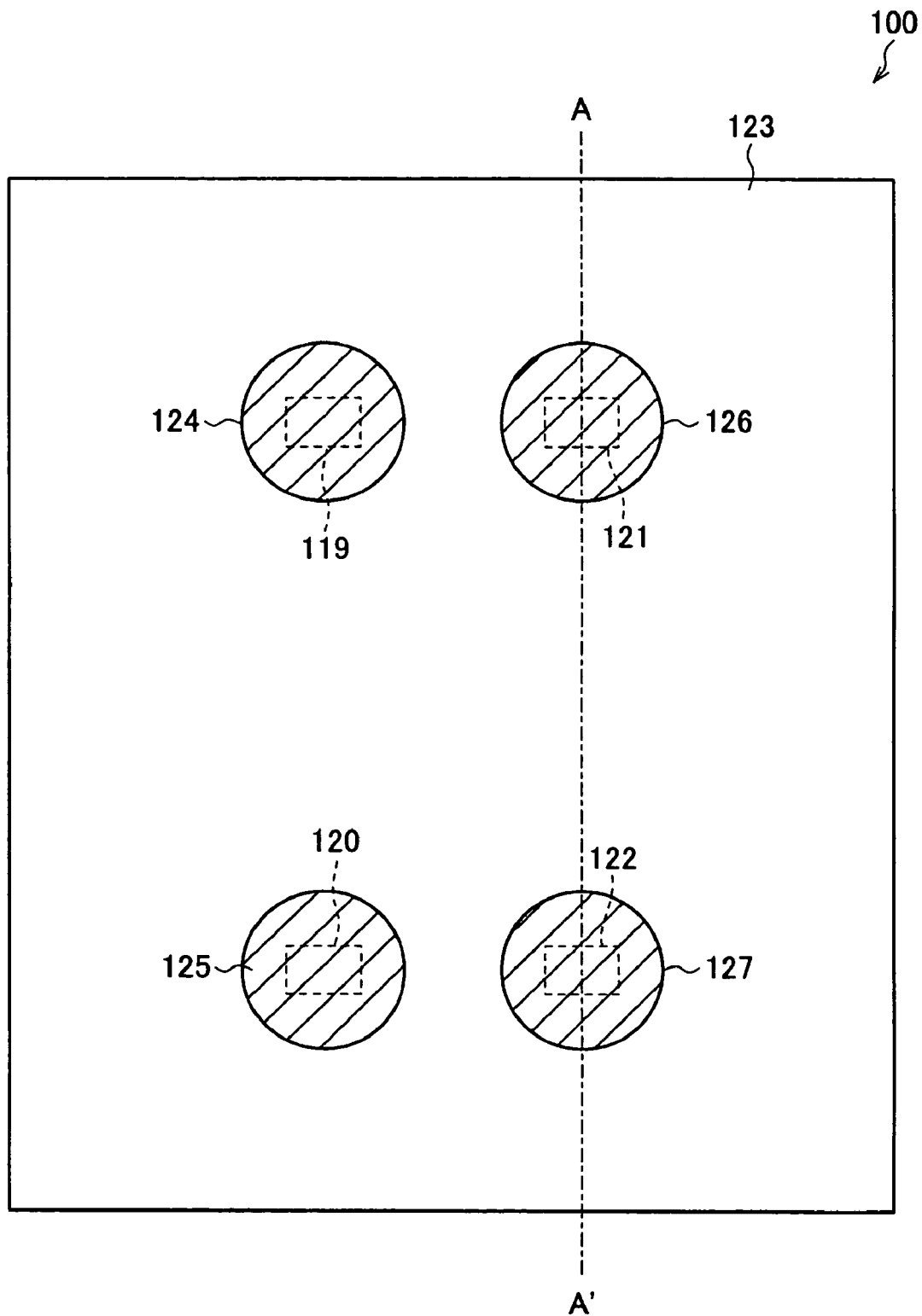
FIG. 11 is a plan view of the surface acoustic wave element of FIG. 10 with a bonding substrate placed thereon to produce an external terminal.

Referring to FIG. 11, a bonding substrate 123 having through-holes 119–122 to expose the adhesive layers 114–117 is aligned with and disposed on the SAW element 112, and the SAW element 112 is bonded to the bonding substrate 123. By producing external terminals 124–127 through the through-holes 119–122 of the bonding substrate 123, the manufacturing of the surface acoustic wave filter is completed. The external terminals 124–127 are connected to the adhesive layers 114–117, which in turn are electrically connected to electrode pads 114a–117a. Portions of the external terminals 124–127 within the regions of the through-holes 119–122 define external terminal connection members. Each of the external terminals 124–127 has a unitary body including the external terminal connection member and the external terminal. The external terminal connection members and the external terminals 124–127 are produced, for example, by filling the through-holes 119–122 with Au—Sn solder using a printing technique, and by heat treating the solder. The external terminals may be a thin film produced using a liftoff process. The external terminal connection member and the external terminal may be separate elements produced by a different method.

Figure 12:
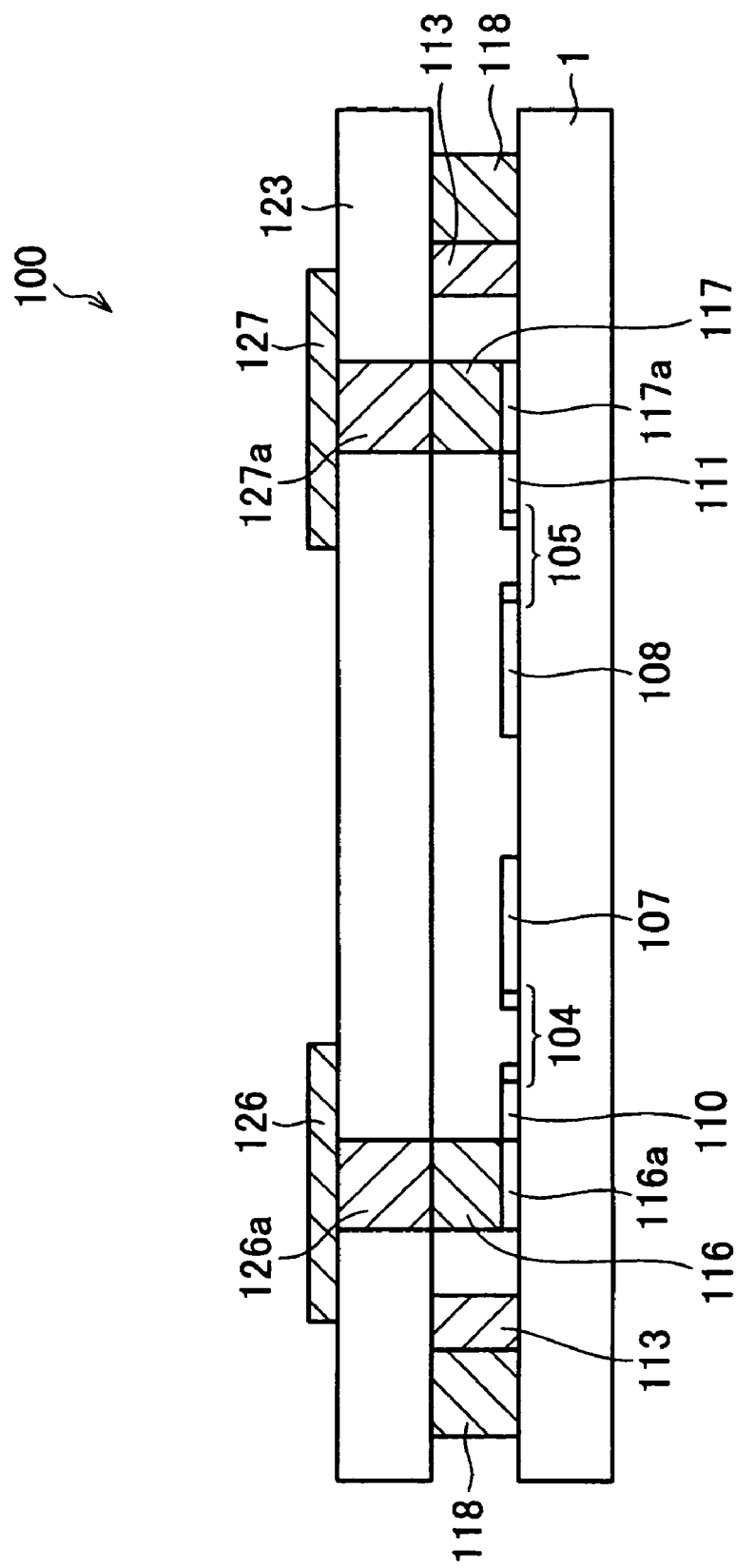
FIG. 12 is a cross sectional view of the surface acoustic wave device in accordance with the modification of the first preferred embodiment of the present invention.

FIG. 12 is a cross sectional view of the finished surface acoustic wave filter 100 taken along line A–A' in FIG. 10 and FIG. 11.

In the surface acoustic wave filter 100 shown in FIG. 12, the external terminals 126 and 127 are shown separately from the external terminal connection members 126a and 127a.

In the surface acoustic wave filter 100, the resin layer 113 is arranged to maintain the protective space for the IDT in each surface acoustic wave resonator. The protective space may be maintained by only the thickness of the adhesive layer without using the resin layer.

Figure 13:
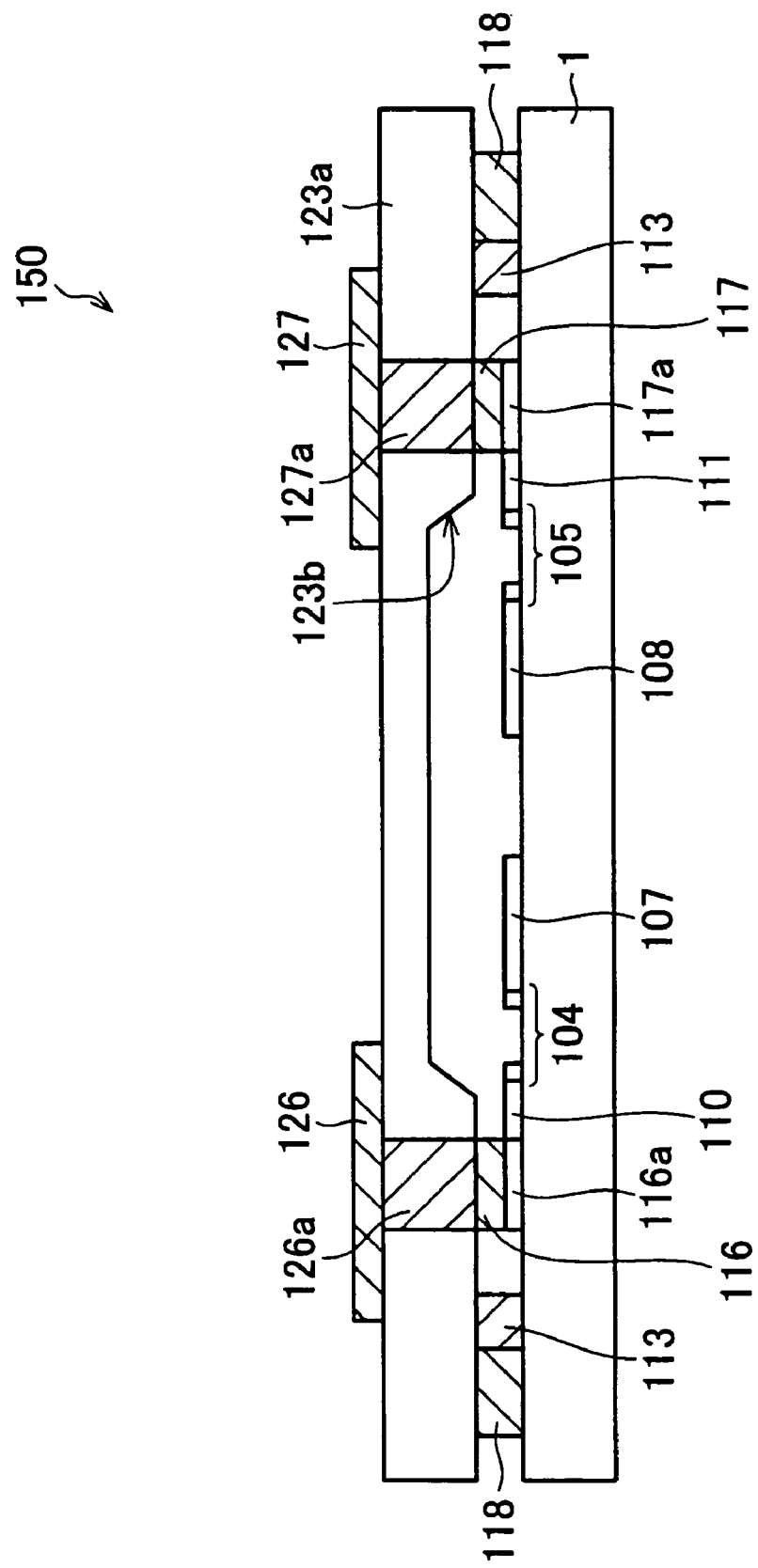
FIG. 13 is a cross sectional view of a surface acoustic wave device in accordance with another modification of the first preferred embodiment of the present invention.

In a surface acoustic wave filter 150 according to another modification shown in FIG. 13, the bonding substrate 123 in the surface acoustic wave filter 100 is replaced with a bonding substrate 123a that includes a recess 123b at a location facing the IDT of each surface acoustic wave resonator. The protective space of the IDT of each surface acoustic wave resonator is thus maintained by the recess 123b.

Second Preferred Embodiment

Figure 4:
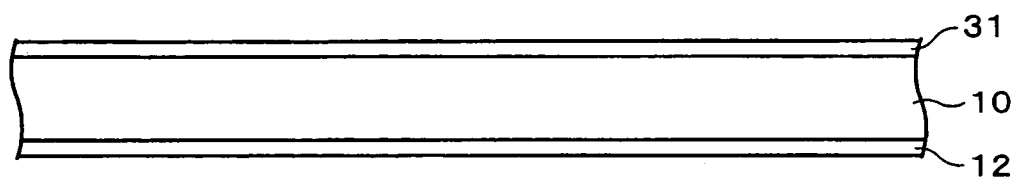
FIG. 4 illustrates, in cross section, process steps of manufacturing a surface acoustic wave device in accordance with a second preferred embodiment of the present invention.
Figure 4:
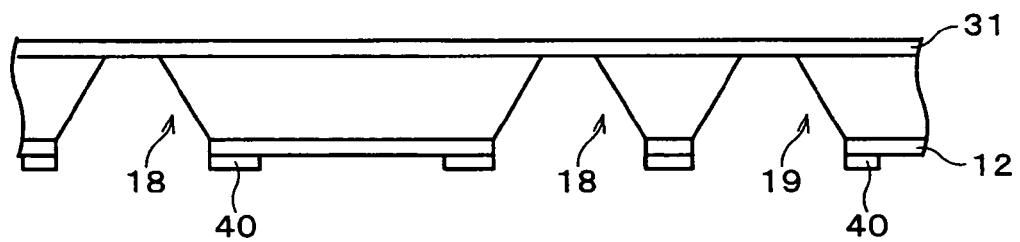
Figure 4:

With reference to FIG. 4, another preferred embodiment of the present invention will now be discussed. For convenience of explanation, elements identical in function to those described in connection with the first preferred embodiment are designated with the same reference numerals, and the discussion thereof is omitted.

In the present preferred embodiment, the through-hole 18 for the conductive pad of the bonding substrate 20 and the through-hole 19 for the alignment mark in the first preferred embodiment are produced using a laser.

Process steps 3–5 in the first preferred embodiment are replaced with process steps 1–3 shown in FIG. 4. A bonding substrate 30 of the present preferred embodiment, different from the first preferred embodiment, includes no excitation portion protection cavity. Only the bonding layer 7 and the adhesive layer 21 of the first preferred embodiment maintain the excitation portion of the surface acoustic wave of the IDT 2.

More specifically, in process step 3 in the first preferred embodiment, resists 12 and 31 are disposed on substantially the entire surfaces without a photolithographical patterning process (process step 1). Etching processes in process step 4 and process step 5 are performed using a laser, and the through-holes 18 and 19 are formed (process step 2). Since the photolithographic step is omitted as described, manufacturing costs of the filter are reduced. By controlling the output of the laser, the through-holes 18 and 19 are forward tapered. When the laser is used, a fused material called dross 40 sticks to the periphery of the through-holes 18 and 19. Since the dross 40 is easily removed together with the resist 12 in process step 3, no further process steps are required. The dross 40 may be removed using half etching with hydrofluoric acid. The resist 31 is deposited to control corrosion by hydrofluoric acid in the half etching process.

The resist 31 is also removed.

The SAW filter is manufactured thereafter in accordance with process step 6 and subsequent process steps in accordance with the first preferred embodiment.

When the laser etching process is performed, a sapphire (monocrystal of $Al_2O_3$) substrate, an MgF substrate, an MgO substrate, an LiF substrate, a $CaF_2$ substrate, a BaF substrate, or other suitable substrate may be used instead of the glass substrate 10.

Third Preferred Embodiment

Yet another preferred embodiment of the present invention will now be discussed with reference to FIG. 5 through FIG. 7. For convenience of explanation, elements identical in function to those described in connection with the first and the second preferred embodiments are designated with the same reference numerals, and the discussion thereof is omitted.

The difference between the present preferred embodiment and the first preferred embodiment is that the through-hole 18 is formed by wet etching after the bonding substrate 20 is bonded to the SAW element 6.

Figure 5:
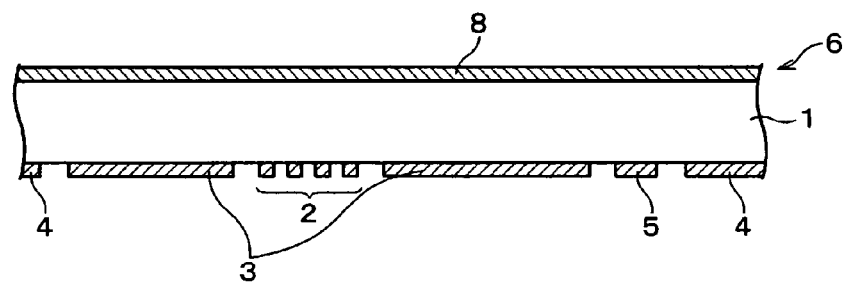
FIG. 5 illustrates, in cross section, process steps of manufacturing a surface acoustic wave device in accordance with a third preferred embodiment of the present invention.
Figure 5:
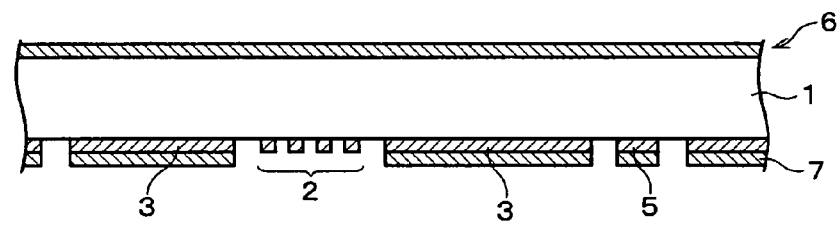

More specifically, the SAW element 6 is manufactured in process step 1— process step 2 as shown in FIG. 5 in the same manner as in the first preferred embodiment. The SAW element 6 includes the IDT 2, the conductive pad 3, the reflector (not shown), the alignment mark 5, the routed wiring lines (not shown), and the hermetically sealed outline frame 4 are disposed on the $LiTaO_3$ piezoelectric substrate 1. However, in the present preferred embodiment, a protective layer 8, such as Au/Ti layers, is disposed on the surface of the $LiTaO_3$ piezoelectric substrate 1 having no IDT 2 thereon. Furthermore, a bonding layer 7 to be bonded to the bonding substrate is disposed in desired locations other than the IDT 2 and the reflector.

Figure 6:
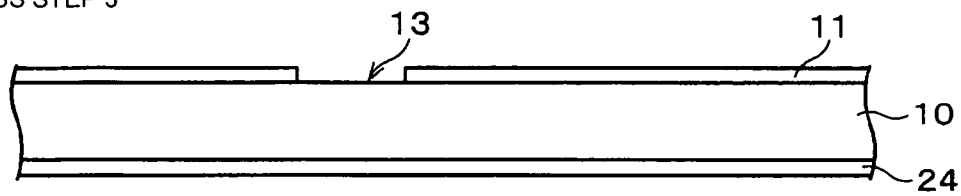
FIG. 6 illustrates, in cross section, process steps of manufacturing the surface acoustic wave device in accordance with the third preferred embodiment of the present invention.
Figure 6:
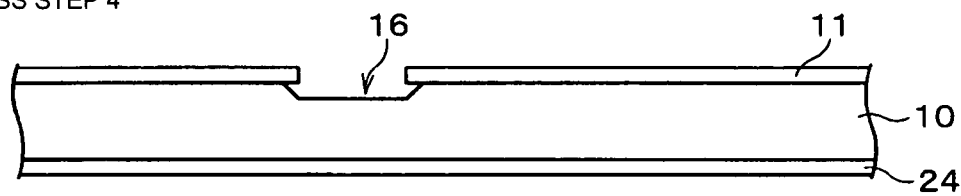
Figure 6:
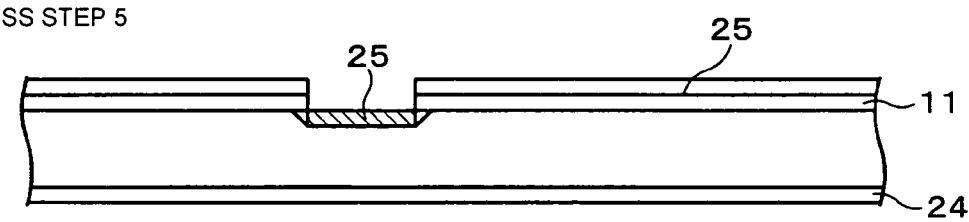
Figure 6:
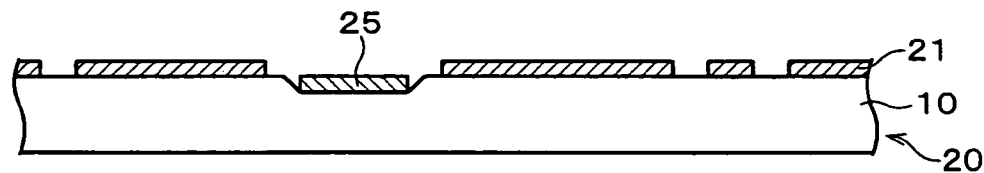
Figure 7:
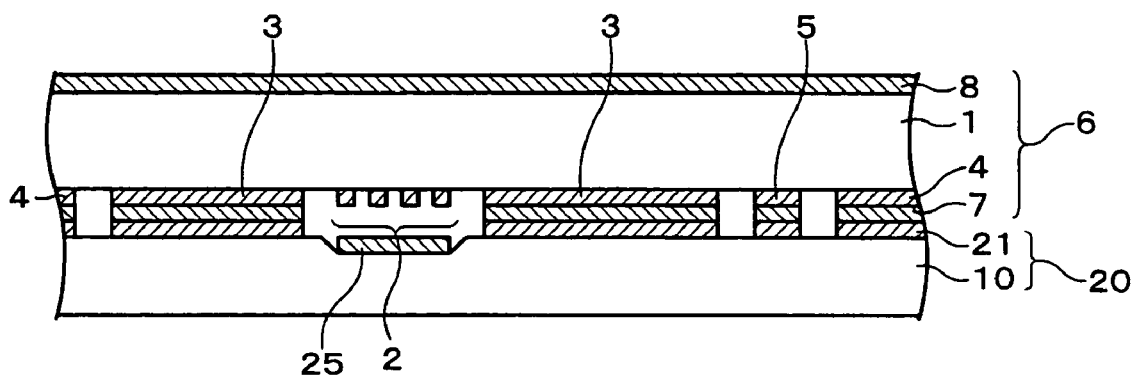
FIG. 7 illustrates, in cross section, process steps of manufacturing the surface acoustic wave device in accordance with the third preferred embodiment of the present invention.
Figure 7:
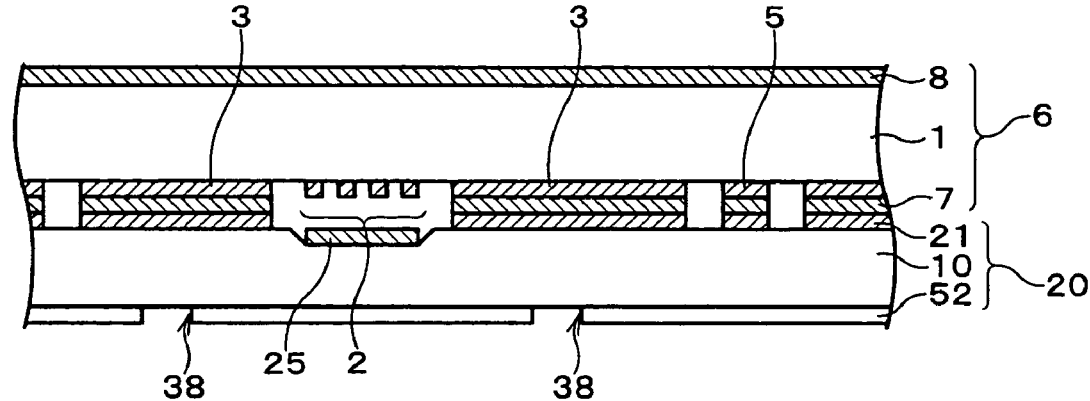
Figure 7:
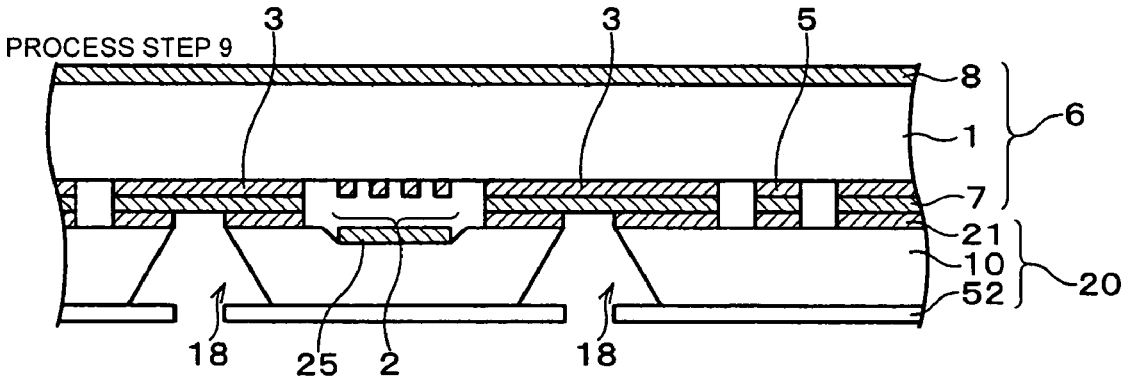
Figure 7:
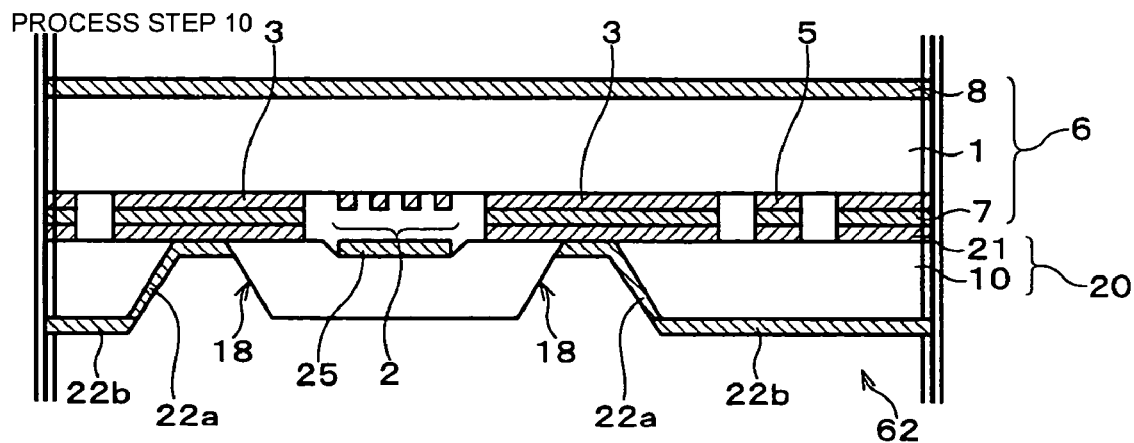

Referring to FIG. 6, the bonding substrate 20 made of a glass substrate having the excitation portion protection cavity is manufactured in process steps 3–6.

In process step 3, a resist pattern 11 having an opening portion 13 is deposited on one surface of a glass substrate 10, becoming a bonding substrate and having a thickness of, for example, about 0.20 mm and a diameter of, for example, about 100 mm, and facing the SAW element 6. The opening portion 13 defines a cavity (an excitation portion protection cavity) to protect the IDT 2. A resist 24 is deposited on substantially the other entire surface of the glass substrate 10.

In process step 4, the glass substrate 10 is half etched by a depth of, for example, about 30 μm with hydrofluoric acid. In this manner, the excitation portion protection cavity 16 is produced.

In process step 5, an Al/Ti layer 25 is deposited on the excitation portion protection cavity 16 using vapor deposition, and a liftoff process is performed. The resist pattern 11 and the resist 24 are peeled off. The Al/Ti layer 25 is preferably thinner than an etch depth of about 30 μm to maintain the space for protecting the excitation portion of the surface acoustic wave of the IDT, etc. The Al/Ti layer 25 enables the excitation portion protection cavity 16 to be easily recognized, and facilitates the alignment process in the bonding to the SAW element 6.

In process step 6, the adhesive layer 21 is disposed on the surface A of the bonding substrate (glass substrate 10) 20 in the same manner as in the first preferred embodiment.

The above process steps 3–5 are not performed if the thickness of only the bonding layer 7 and the adhesive layer 21 maintain the space for protecting the excitation portion of the surface acoustic wave of the IDT 2. An opening portion is simply formed in the adhesive layer 21 to protect the excitation portion of the surface acoustic wave of the IDT 2. A metal layer made of a solder layer may be disposed instead of the Al/Ti layer 25.

In process step 7, the alignment mark 5 is used to align the SAW element 6 with the bonding substrate 20 having the adhesive layer 21, and the SAW element 6 and the bonding substrate 20 are bonded in a reflow furnace.

In process step 8, a resist pattern 52 for forming through-holes is deposited on the glass substrate 10 (bonding substrate 20). The through-hole exposes at least the adhesive layer 21 connected to the conductive pad 3 of the SAW element 6. An opening 38 is formed where the through-hole is to be drilled.

In process step 9, the glass substrate 10 is full-etched in accordance with the resist pattern 52 with hydrofluoric acid. The through-hole 18 is thus formed, thereby exposing at least the adhesive layer 21 electrically connected to the conductive pad 3. Ti, Ni, and Sn—Ag of the adhesive layer 21 are dissolved by hydrofluoric acid. However, if the bonding layer 7 includes an Au layer or a Pt layer, an etching process does not proceed any further because Au and Pt cannot be dissolved by hydrofluoric acid. If at least the adhesive layer 21 is exposed, connection to the conductive pad 3 is reliably established when the external terminal connection member 22a and the external terminal 22b are produced later. The protective layer 8, such as an Au/Ti layer, may be disposed on the surface of the LiTaO$_3$ piezoelectric substrate 1 of the SAW element 6 having no IDT 2. With the protective layer 8, the LiTaO$_3$ piezoelectric substrate 1 is prevented from being etched by hydrofluoric acid. If the LiTaO$_3$ piezoelectric substrate 1 is etched, a finished SAW filter may not perform to desired specifications. After the etching operation, the resist pattern 52 is peeled off.

In process step 10, the external terminal connection member 22a and the external terminal 22b are produced along the through-hole 18 for the conductive pad in the same manner as in the preceding preferred embodiment, and the dicing operation completes the manufacturing of a SAW filter 62.

Fourth Preferred Embodiment

A further preferred embodiment of the present invention will now be discussed with reference to FIG. 8.

For convenience of explanation, elements identical in function to those described in connection with the first through third preferred embodiments are designated with the same reference numerals, and the discussion thereof is omitted.

Figure 8:
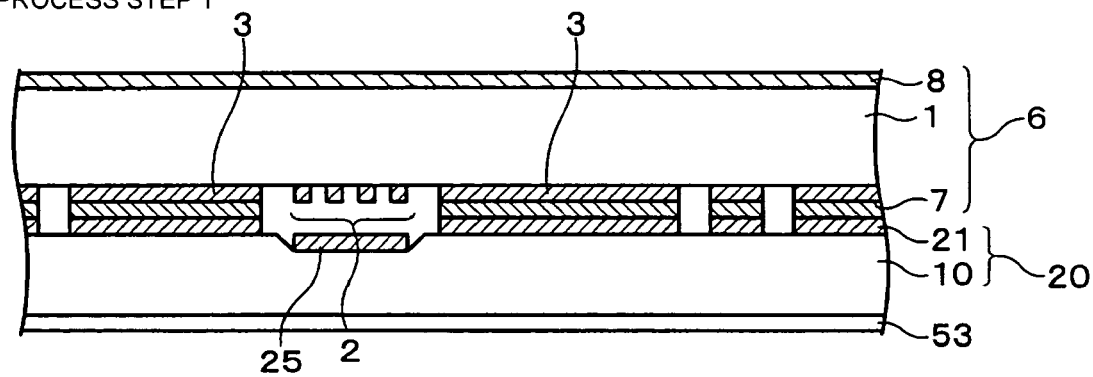
FIG. 8 illustrates, in cross section, process steps of manufacturing a surface acoustic wave device in accordance with a fourth preferred embodiment of the present invention.
Figure 8:
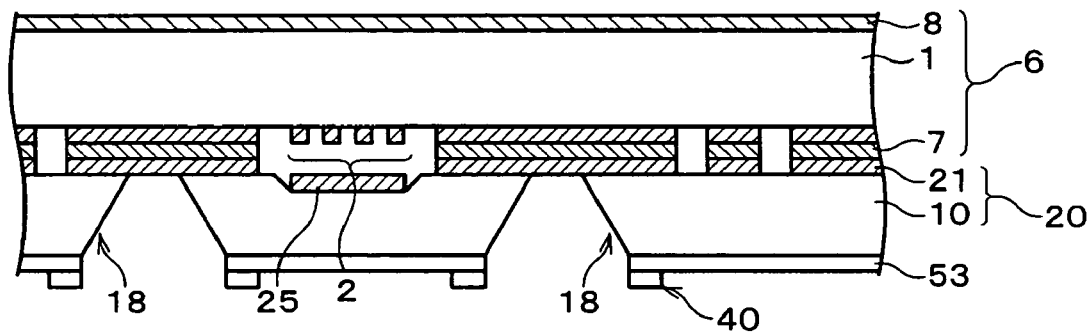
Figure 8:
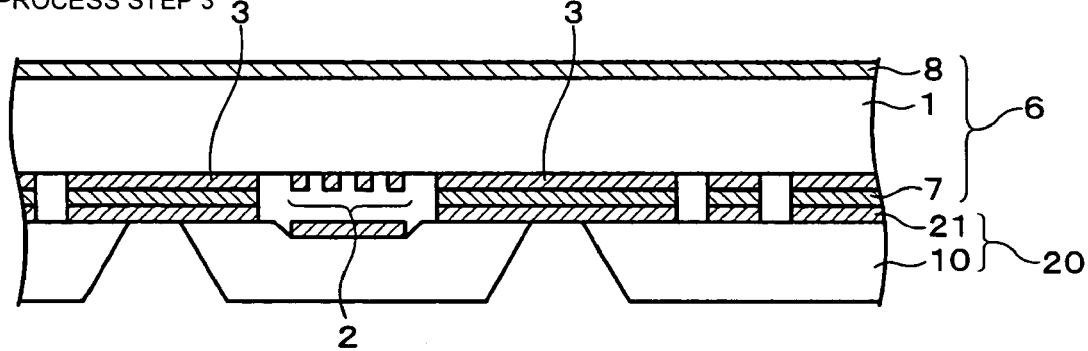

In the present preferred embodiment, process steps 8 and 9 in the third preferred embodiment are replaced with process steps 1–3 in which the through-hole 18 is formed in the bonding substrate 20 using laser as shown in FIG. 8.

In process step 1, a resist 53 is applied on substantially the entire surface of the glass substrate 10 of the bonding substrate 20 that is already bonded to the SAW element 6 produced in process steps 1–7 in the third preferred embodiment.

In process step 2, the through-holes 18 are formed in the glass substrate 10 using a laser. The etching process is performed to expose at least the adhesive layer 21 of the bonding substrate 20. This arrangement eliminates the need for the formation of a resist pattern, thereby reducing the number of process steps. Dross 40, created during the laser etching, is removed by a hydrofluoric acid treatment. By adjusting the power of laser output during the laser etching process, only glass is removed while the metal remains.

In process step 3, the resist 53 is removed from the glass substrate 10.

Process step 10 and subsequent process steps in the third preferred embodiment are performed. Dicing the laminate at a predetermined location completes the manufacturing of the SAW filter.

Fifth Preferred Embodiment

Still another preferred embodiment of the present invention will now be discussed with reference to FIG. 14 through FIG. 18. For convenience of explanation, elements identical in function to those described in connection with the first through fourth preferred embodiments are designated with the same reference numerals, and the discussion thereof is omitted.

Figure 14:
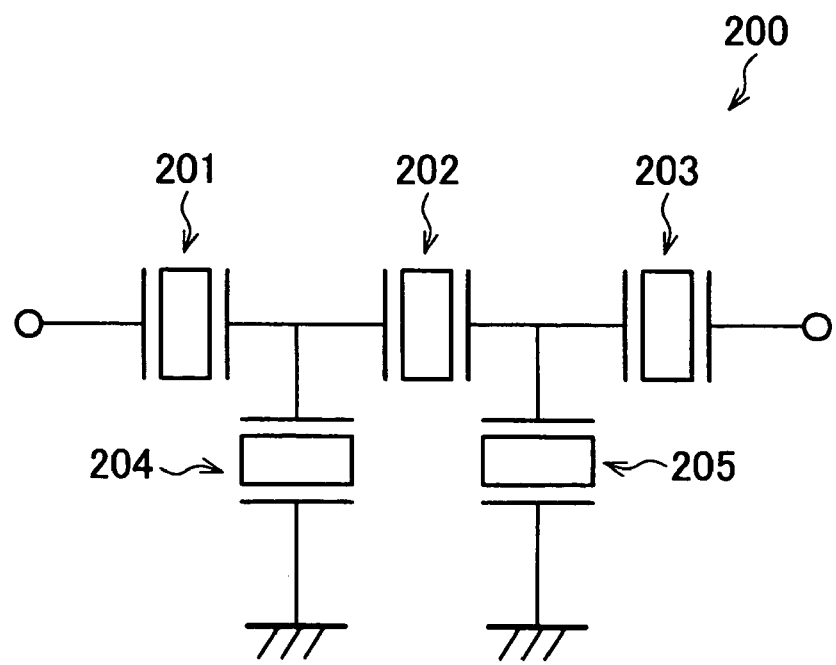
FIG. 14 is a circuit diagram of a surface acoustic wave device in accordance with a fifth preferred embodiment of the present invention.

FIG. 14 illustrates a surface acoustic wave filter 200 of the present preferred embodiment. The surface acoustic wave filter 200 includes surface acoustic wave resonators 201–205, each having an IDT (vibrator), arranged in a ladder configuration. The surface acoustic wave resonators 201–203 are serial resonators, and the surface acoustic wave resonators 204 and 205 are parallel resonators.

The method for manufacturing the surface acoustic wave filter 200 is now discussed with reference to FIG. 15 through FIG. 17.

Figure 15:
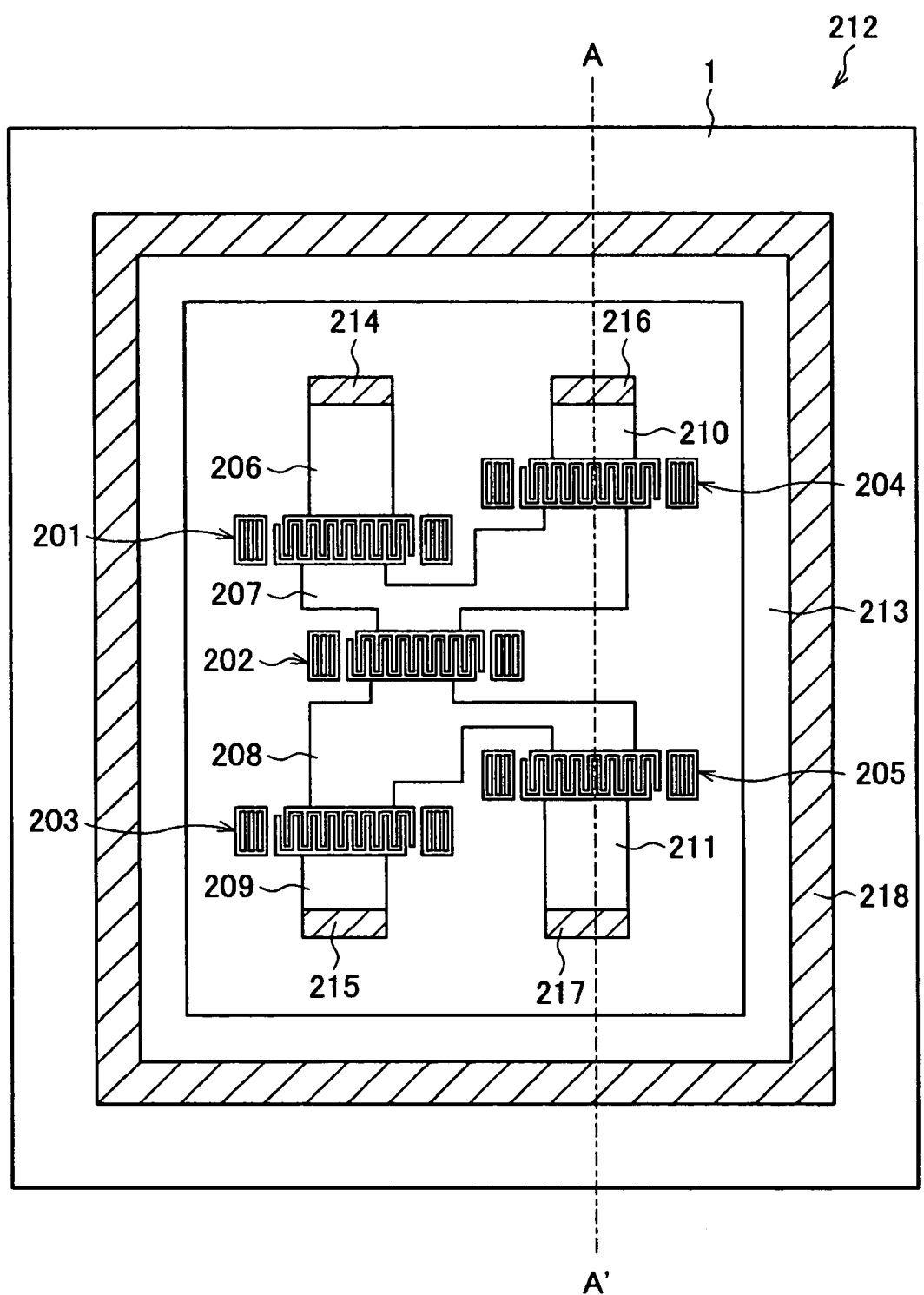
FIG. 15 is a plan view of a surface acoustic wave element of the surface acoustic wave device in accordance with the fifth preferred embodiment of the present invention.

Referring to FIG. 15, the surface acoustic wave resonators 201–205, and routed wiring lines (element wiring lines) 206–211 are disposed on the piezoelectric substrate 1 to produce a SAW element 212. A resin layer 213 is disposed on the piezoelectric substrate 1 such that the resin layer 213 surrounds the surface acoustic wave resonators 201–205, and the routed wiring lines 206–211. Adhesive layers 214–217 made of an electrically conductive material, such as solder, are disposed partially on the routed wiring lines 206–211, and an adhesive layer 218 made of solder is disposed on the piezoelectric substrate 1 surrounding the resin layer 213 on the piezoelectric substrate 1. The adhesive layers 214–217 and the adhesive layer 218 may be concurrently disposed.

Figure 16:
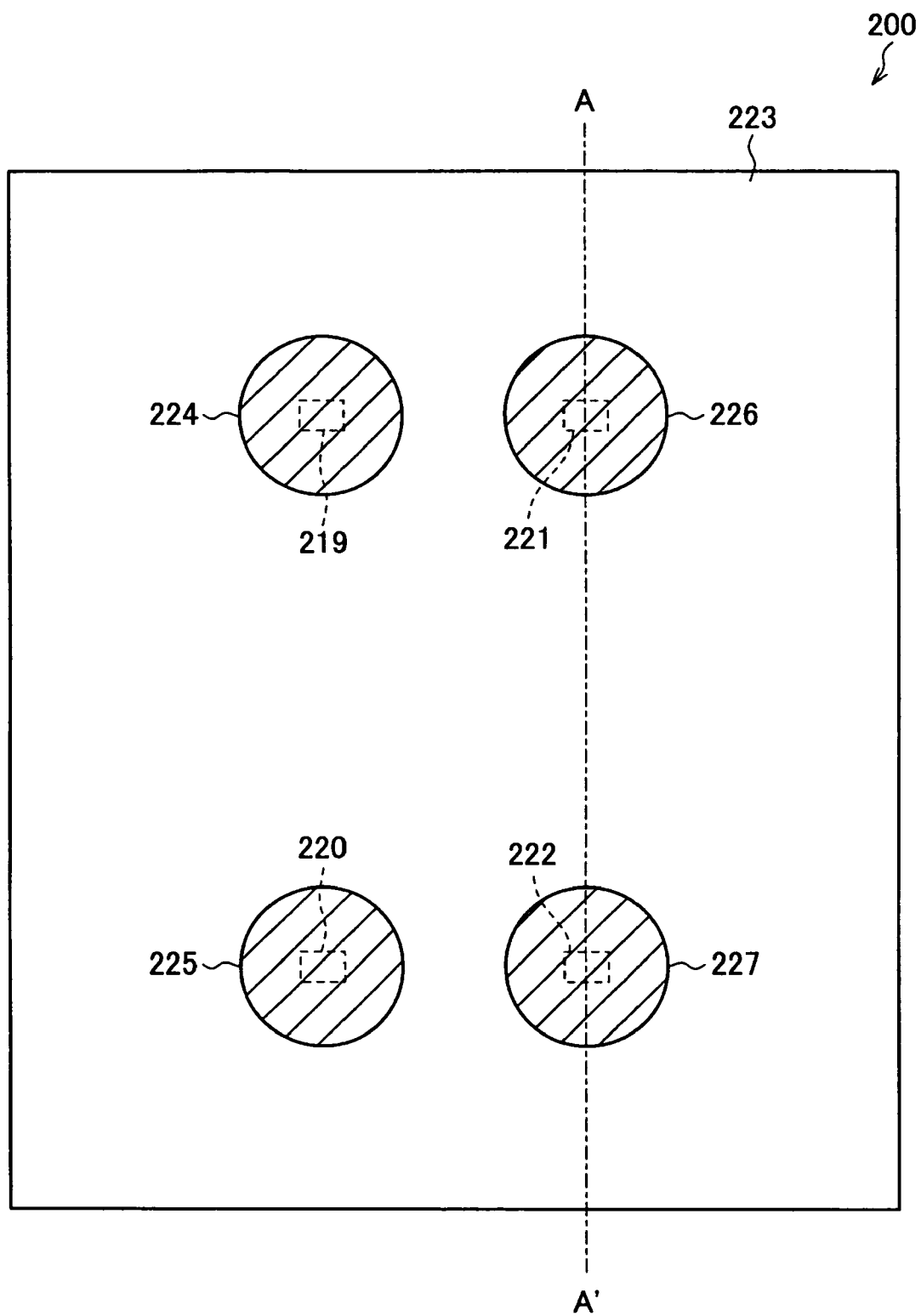
FIG. 16 is a plan view of the surface acoustic wave element of FIG. 15 with a bonding substrate placed thereon to produce an external terminal.

Referring to FIG. 16, a bonding substrate 223 having through-holes 219–222 to expose the adhesive layers 214–217 is aligned with and disposed on the SAW element 212. The SAW element 212 is then bonded to the bonding substrate 223. By producing external terminals 224–227 along the through-holes 219–222 of the bonding substrate 223, the manufacturing of the surface acoustic wave filter is completed. The external terminals 224–227 are connected to the adhesive layers 214–217, which in turn are electrically connected to wiring lines 206, 209, 210, and 211. Portions of the external terminals 224–227 within the regions of the through-holes 219–222 define external terminal connection members. In other words, each of the external terminals 224–227 has a unitary body including the external terminal connection member and the external terminal. The external terminal connection members and the external terminals 224–227 are produced, for example, by filling the through-holes 219–222 with Au—Sn solder using a printing technique, and by heat treating the solder. The external terminals may be a thin film produced using a liftoff process. The external terminal connection member and the external terminal may be elements that are separately produced using different methods.

Figure 17:
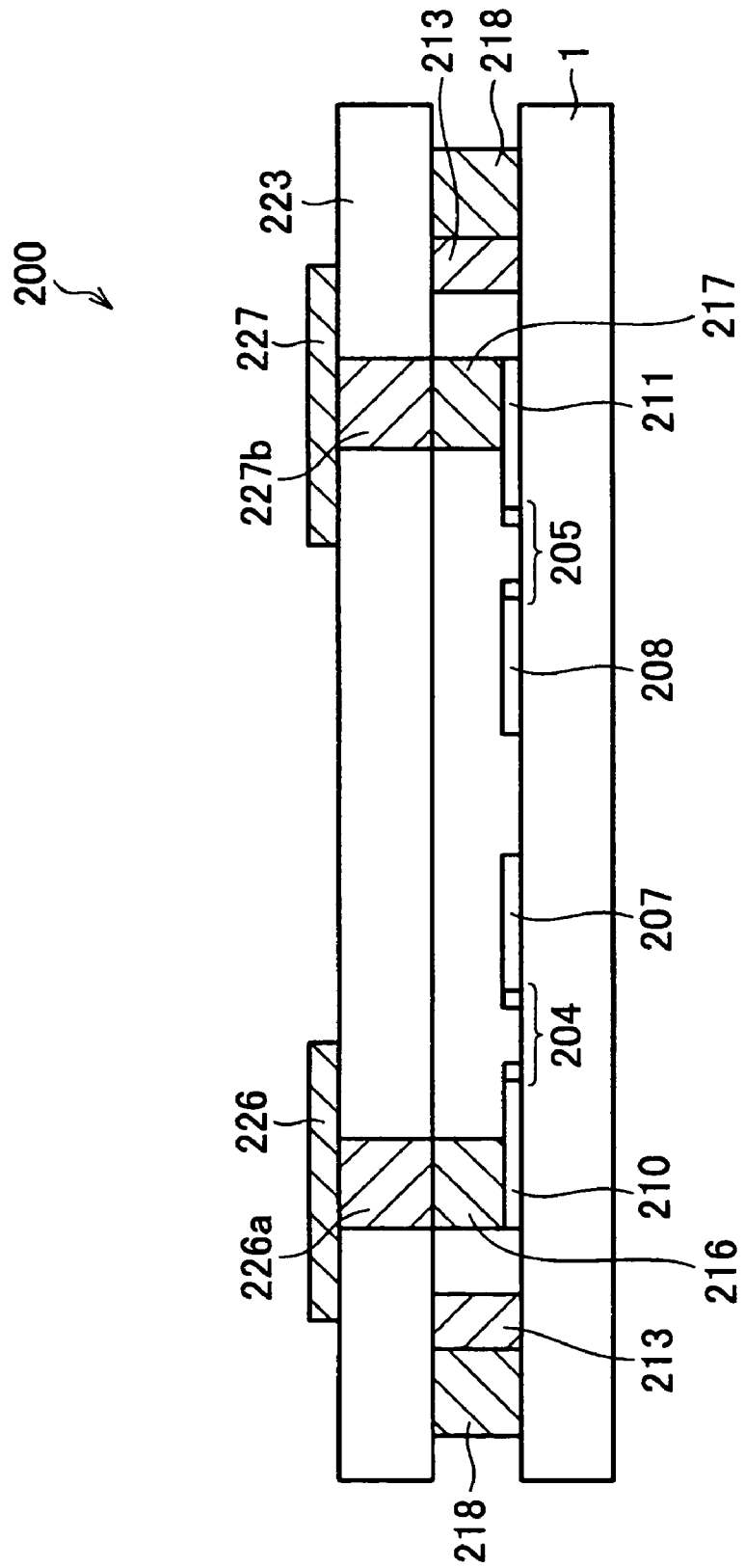
FIG. 17 is a cross sectional view of the surface acoustic wave device in accordance with the fifth preferred embodiment of the present invention.

FIG. 17 is a cross sectional view of the finished surface acoustic wave filter 200 taken along line A–A' in FIG. 15 and FIG. 16.

In the surface acoustic wave filter 200 shown in FIG. 17, the external terminals 226 and 227 are shown separately from external terminal connection members 226a and 227a, respectively. The wiring lines 210 and 211 are electrically connected to the external terminals 226 and 227 through the adhesive layers 216 and 217 and the external terminal connection members 226a and 227a.

In the surface acoustic wave filter 200, the resin layer 213 is arranged to maintain the protective space for the IDT in each surface acoustic wave resonator. Only the thickness of the adhesive layer may maintain the protective space without using the resin layer.

Figure 18:
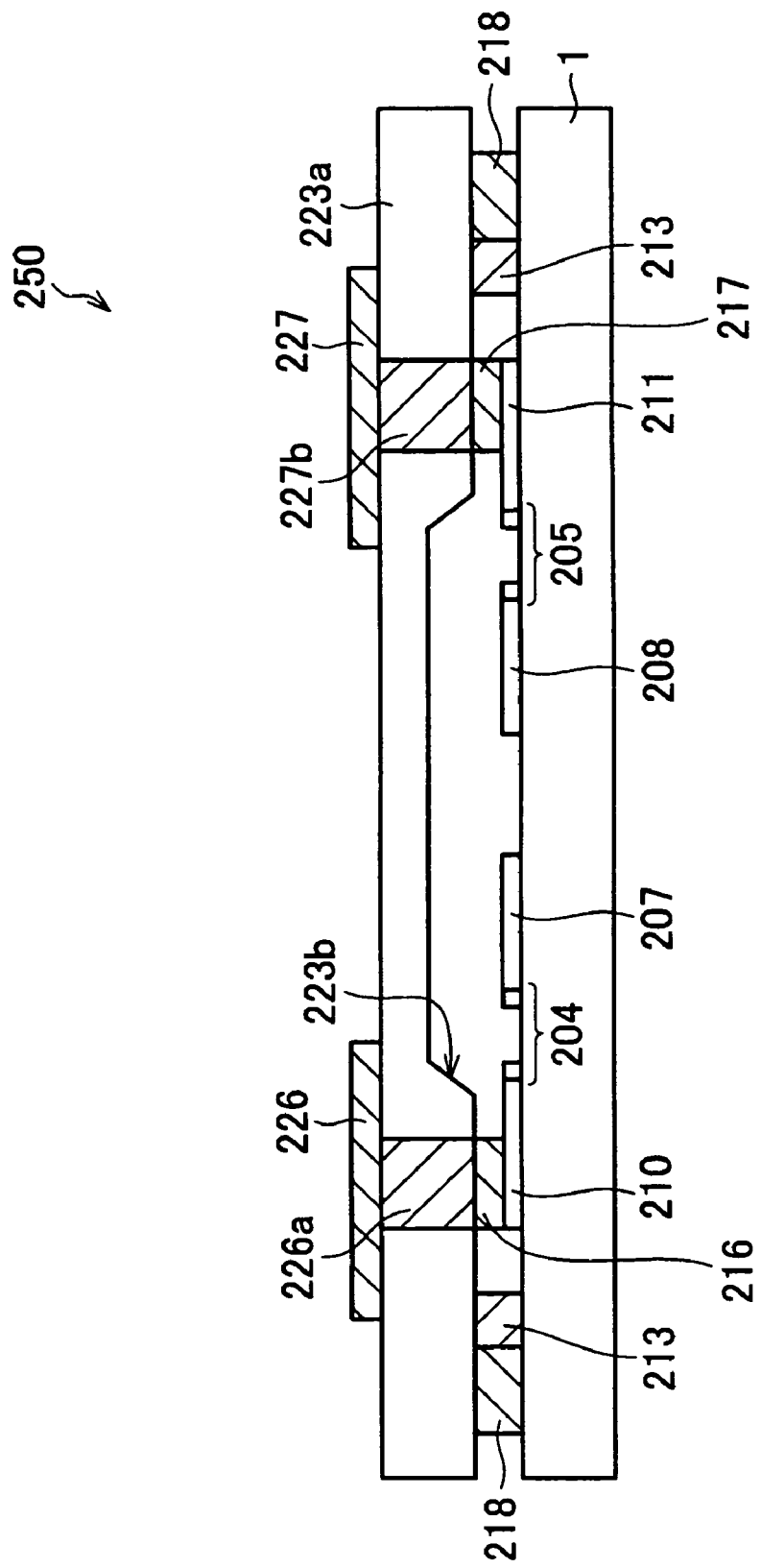
FIG. 18 is a cross sectional view of the surface acoustic wave device in accordance with a modification of the fifth preferred embodiment of the present invention.

In a surface acoustic wave filter 250 shown in FIG. 18, the bonding substrate 223 in the surface acoustic wave filter 200 is replaced with a bonding substrate 223a that includes a recess 223b at a location facing the IDT of each surface acoustic wave resonator. The protective space of the IDT of each surface acoustic wave resonator is thus maintained.

The surface acoustic wave filter of the present preferred embodiment requires no bumps, and electrode pads for the bumps are not required. The surface acoustic wave filter is accordingly miniaturized, and costs of the filter are reduced.

Sixth Preferred Embodiment

A still another preferred embodiment of the present invention will now be discussed with reference to FIG. 19 through FIG. 23. For convenience of explanation, elements identical in function to those described in connection with the first through fifth preferred embodiments are designated with the same reference numerals, and the discussion thereof is omitted.

Figure 19:
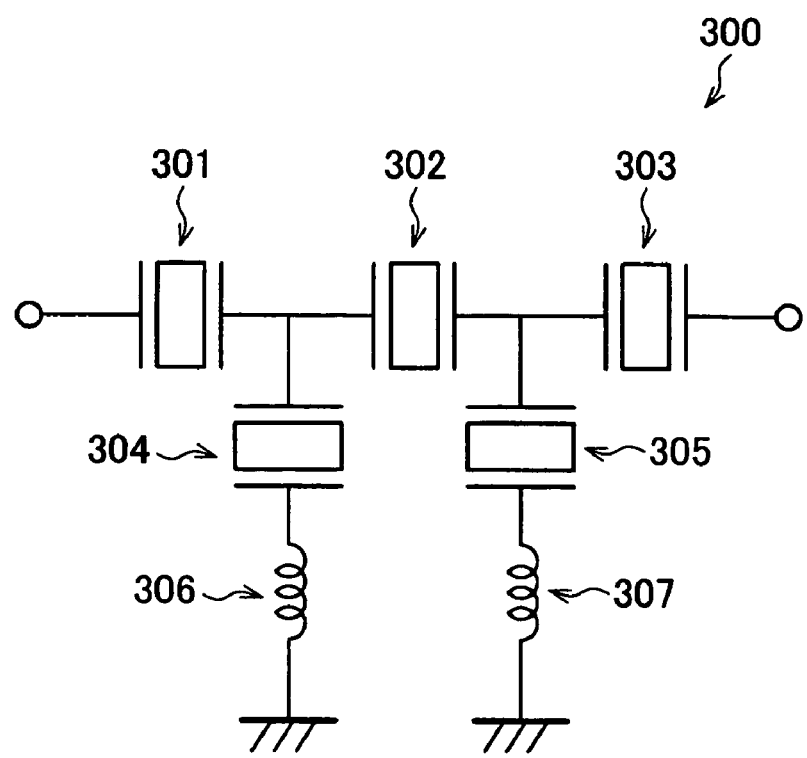
FIG. 19 is a circuit diagram of a surface acoustic wave device in accordance with a sixth preferred embodiment of the present invention.

FIG. 19 illustrates a surface acoustic wave filter 300 of the present preferred embodiment. The surface acoustic wave filter 300 includes surface acoustic wave resonators 301–305, each having an IDT (vibrator), arranged in a ladder configuration. The surface acoustic wave resonators 301–303 are serial resonators, and the surface acoustic wave resonators 304 and 305 are parallel resonators. Inductors 351 and 352 are connected in series with the surface acoustic wave resonators 304 and 305, respectively.

The surface acoustic wave filter 300 is now discussed with reference to FIG. 20 through FIG. 23.

Figure 20:
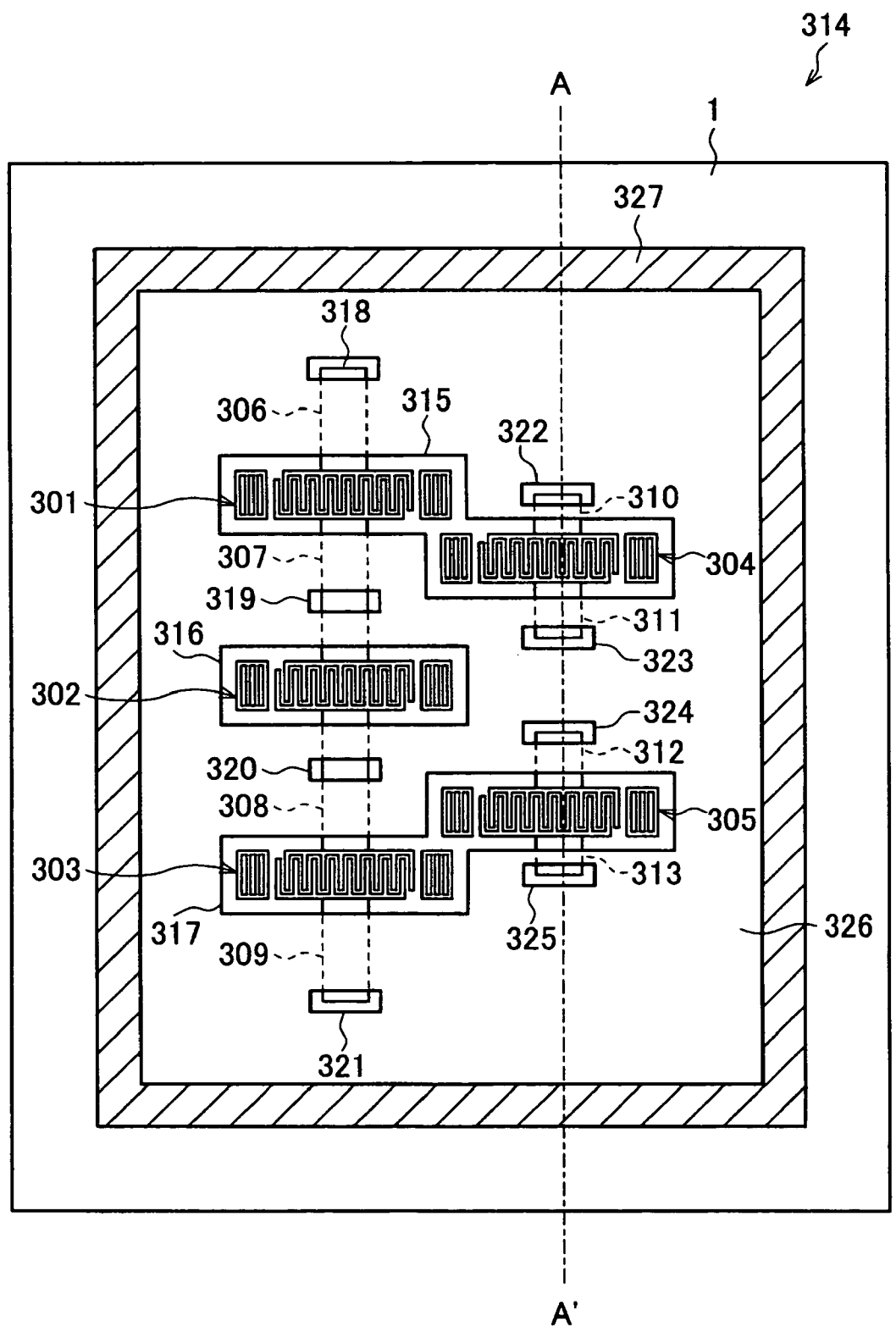
FIG. 20 is a plan view of a surface acoustic wave element of the surface acoustic wave device in accordance with the sixth preferred embodiment of the present invention.

Referring to FIG. 20, the surface acoustic wave resonators 301–305, and routed wiring lines (element wiring lines) 306–313 are disposed on the piezoelectric substrate 1 to produce a SAW element 314. A resin layer 326, having resin opening portions 315–317 exposing the surface acoustic wave resonators 301–305 and resin opening portions 318–325 partially exposing the routed wiring lines 306–313, is disposed on the piezoelectric substrate 1. An adhesive layer 327, made of an electrically conductive material such as solder, is arranged on the piezoelectric substrate 1 so as to surround the resin layer 326.

Figure 21:
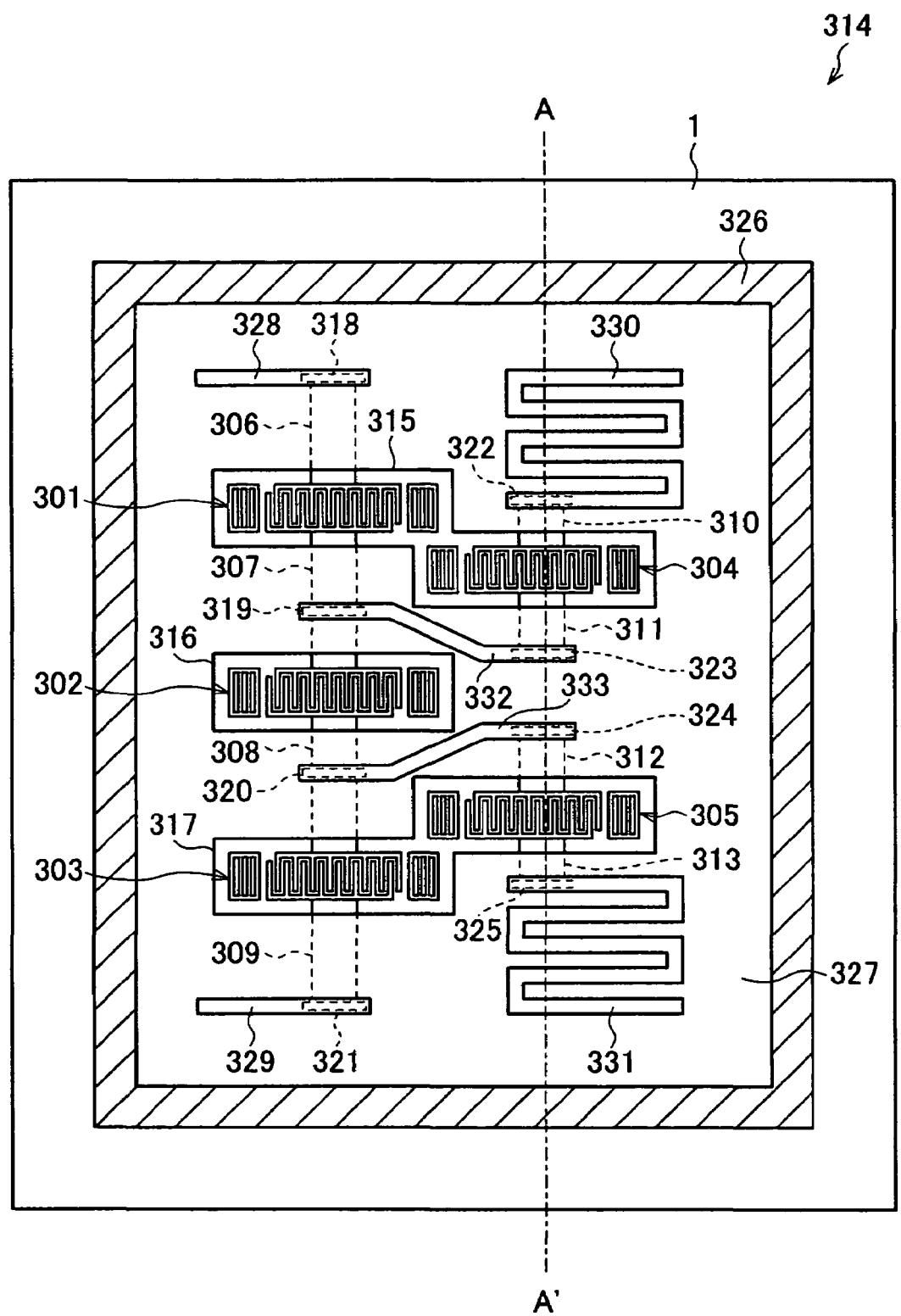
FIG. 21 is a plan view of the surface acoustic wave element of FIG. 20 with a resin layer disposed thereon to produce a first wiring line.

Referring to FIG. 21, first wiring lines 328–331, to be connected to wiring lines 306, 309, 310, and 313 through the resin opening portions 318, 321, 322, and 325, are disposed. Each of the first wiring lines 330 and 331 includes an integrally formed inductor L. The inductors L of the first wiring lines 330 and 331 correspond to inductors 306 and 307. The inductor L is provided in the first wiring lines, however, a capacitance C may be provided in the first wiring lines. A connection wiring line (first wiring line) 332 that connects routed wiring lines 307 and 311 through the resin opening portions 319 and 323, and a connection wiring line (first wiring line) 333 that connects routed wiring lines 308 and 312 through the resin opening portions 320 and 324 are also provided.

Figure 22:
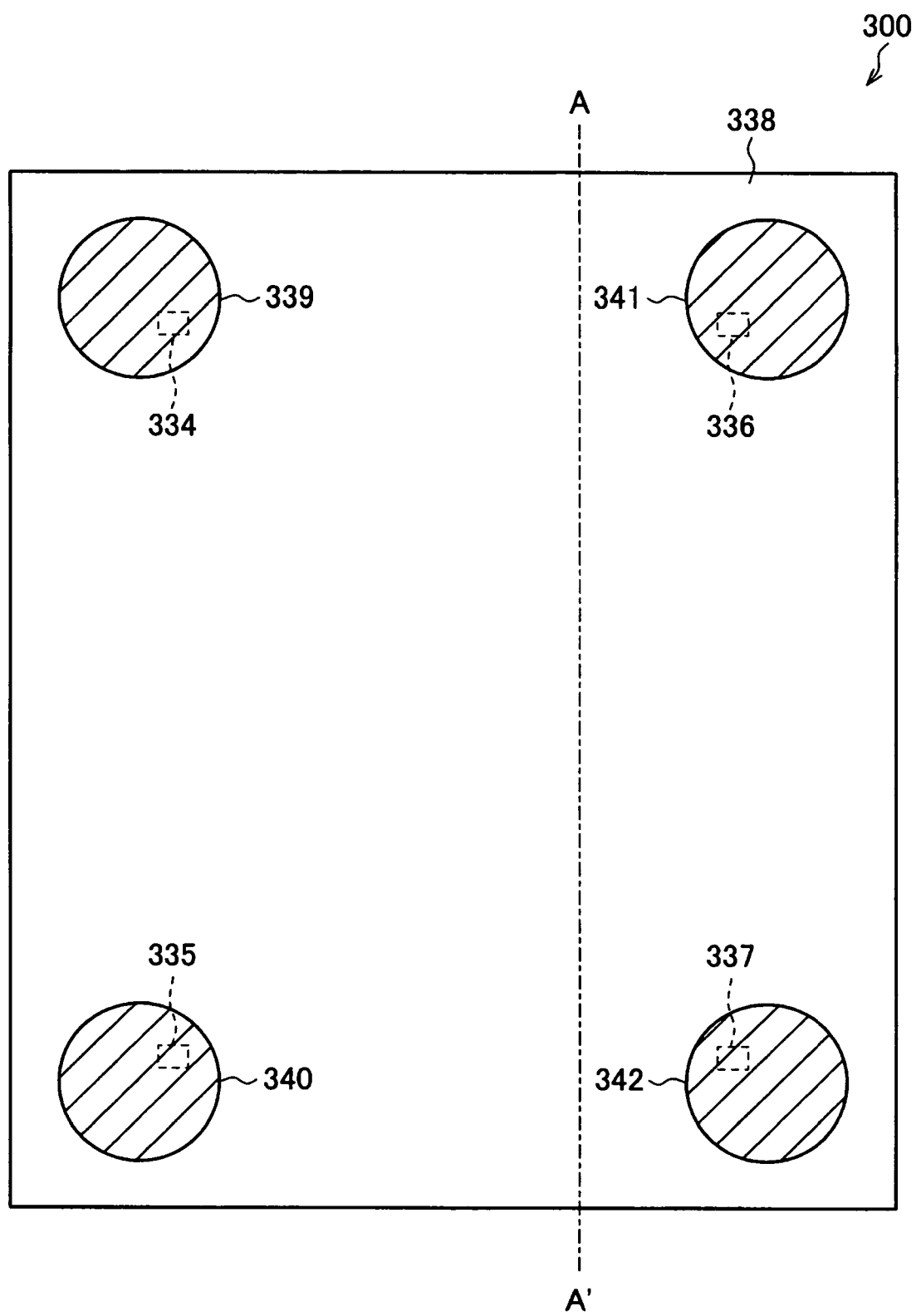
FIG. 22 is a plan view of the resin layer of FIG. 21 with a bonding substrate placed thereon to produce an external terminal.

Referring to FIG. 22, a bonding substrate 338 having through-holes 334–337 to expose ends of the first wiring lines 328–331 is aligned with and disposed on the adhesive layer 327. The SAW element 314 is thus bonded to the bonding substrate 338 via the adhesive layer 327. The manufacturing of the surface acoustic wave filter 300 is completed by disposing external terminals 339–342 connected to the first wiring lines 328–331 through the through-holes 334–337. Portions of the external terminals 339–342 within the regions of the through-holes 334–337 define external terminal connection members. In other words, each of the external terminals 339–342 has a unitary body including the external terminal connection member and the external terminal. The external terminal connection members and the external terminals 339–342 are produced, for example, by filling the through-holes 334–337 with Au—Sn solder using a printing technique, and by heat treating the solder. The external terminals may be a thin film produced using a liftoff process. The external terminal connection member and the external terminal may be separate elements produced using a different methods.

Figure 23:
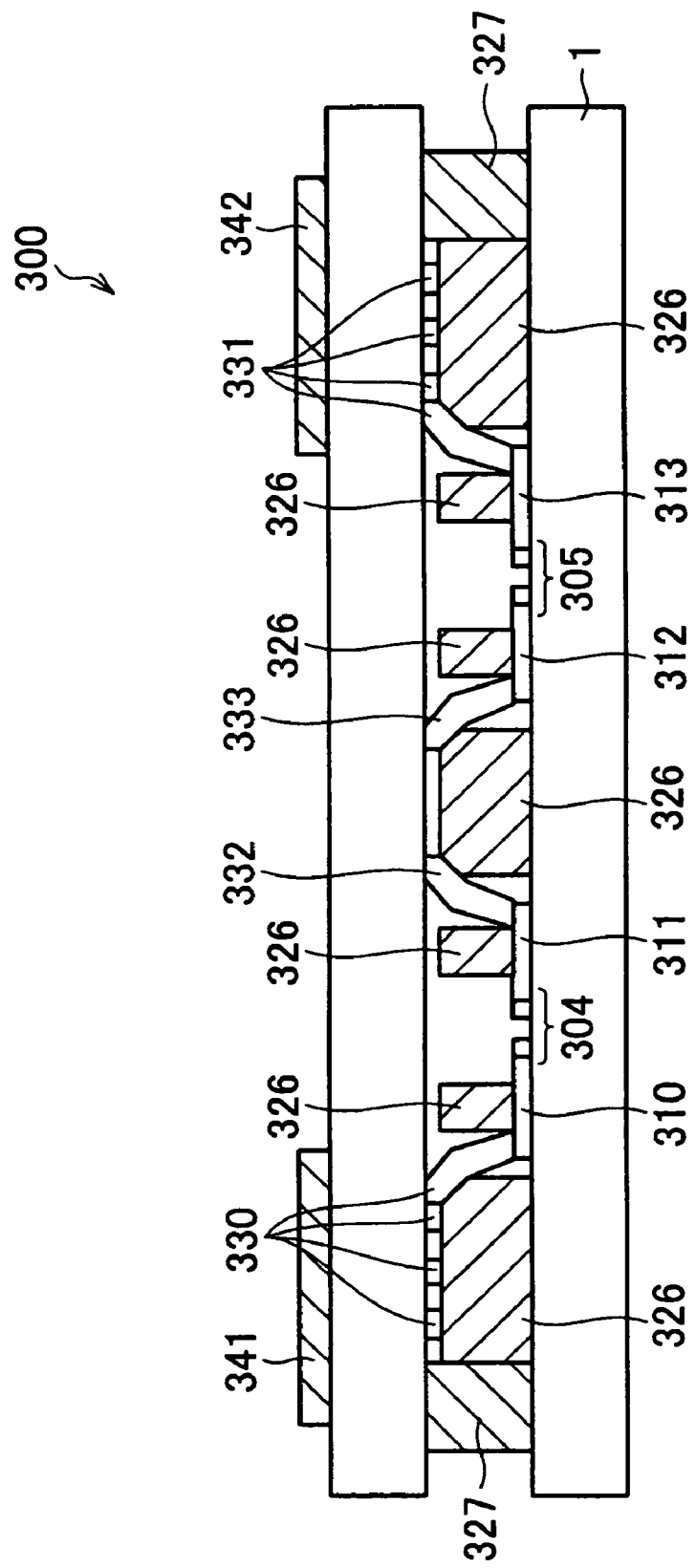
FIG. 23 is a cross sectional view of the surface acoustic wave device of the sixth preferred embodiment of the present invention.

FIG. 23 is a cross sectional view of the finished surface acoustic wave filter 300 taken along line A–A' in FIG. 20 through FIG. 22.

In the surface acoustic wave filter 300 shown in FIG. 23, the resin layer 226 maintains the protective space of the IDT of each surface acoustic wave resonator.

The surface acoustic wave filter of the present preferred embodiment requires no bumps, and electrode pads for the bumps are not required. The surface acoustic wave filter is thus miniaturized, and costs of the filter are reduced.

Seventh Preferred Embodiment

A further preferred embodiment of the present invention will now be discussed with reference to FIG. 24 through FIG. 35. For convenience of explanation, elements identical in function to those described in connection with the first through sixth preferred embodiments are designated with the same reference numerals, and the discussion thereof is omitted.

Figure 24:
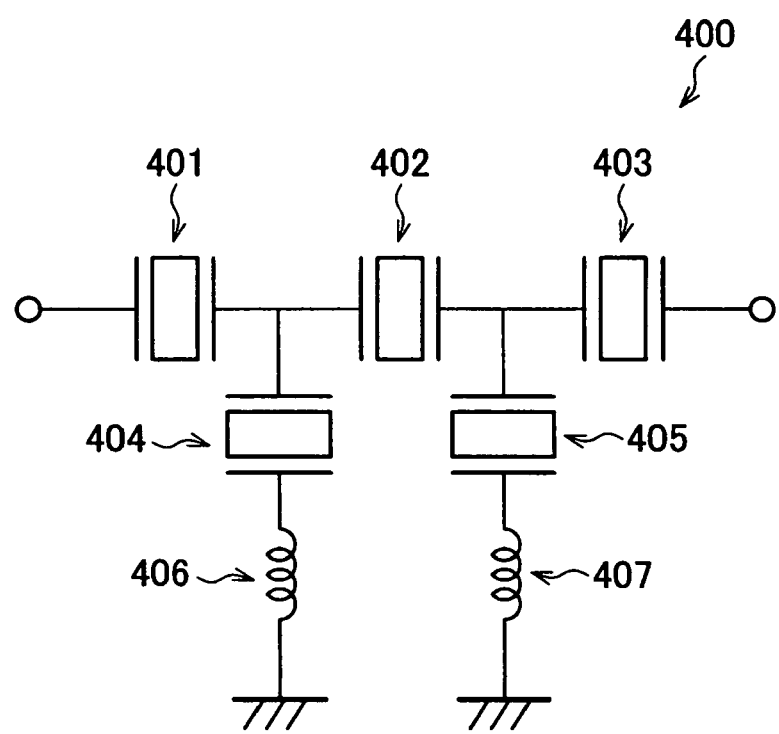
FIG. 24 is a circuit diagram of a surface acoustic wave device in accordance with a seventh preferred embodiment of the present invention.

FIG. 24 is a circuit diagram of a surface acoustic wave filter 400 of the present preferred embodiment. The surface acoustic wave filter 400 includes surface acoustic wave resonators 401–405, each having an IDT (vibrator), arranged in a ladder configuration. The surface acoustic wave resonators 401–403 are serial resonators, and the surface acoustic wave resonators 404 and 405 are parallel resonators. Inductors 451 and 452 are connected in series with surface acoustic wave resonators 404 and 405, respectively.

The surface acoustic wave filter 400 is now discussed with reference to FIG. 25 through FIG. 29.

Figure 25:
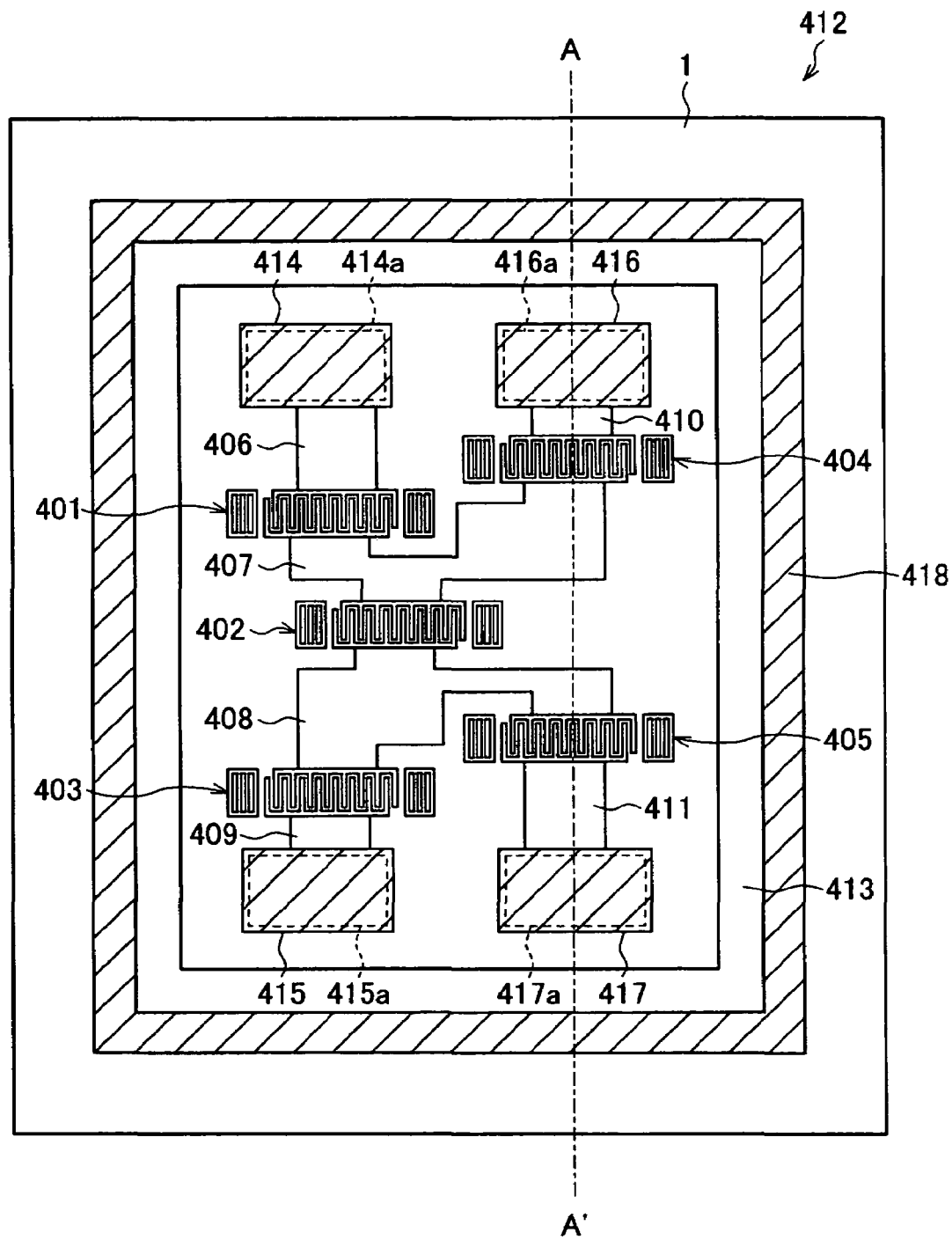
FIG. 25 is a plan view of a surface acoustic wave element of the surface acoustic wave device in accordance with the seventh preferred embodiment of the present invention.

Referring to FIG. 25, the surface acoustic wave resonators 401–405, electrode pads (element wiring lines) 414a–417a, and routed wiring lines (element wiring lines) 406–411 are disposed on the piezoelectric substrate 1 to produce a SAW element 412. A resin layer 413 is disposed on the piezoelectric substrate 1 so as to surround the surface acoustic wave resonators 401–405, the electrode pads 414a–417a, and the routed wiring lines 406–411. Adhesive layers 414–417, made of an electrically conductive material such as solder, are disposed on the electrode pads 414a–417a, and an adhesive layer 418, made of solder, is arranged so as to surround the resin layer 413 on the piezoelectric substrate 1. The adhesive layers 414–417 and the adhesive layer 418 are concurrently formed.

Figure 26:
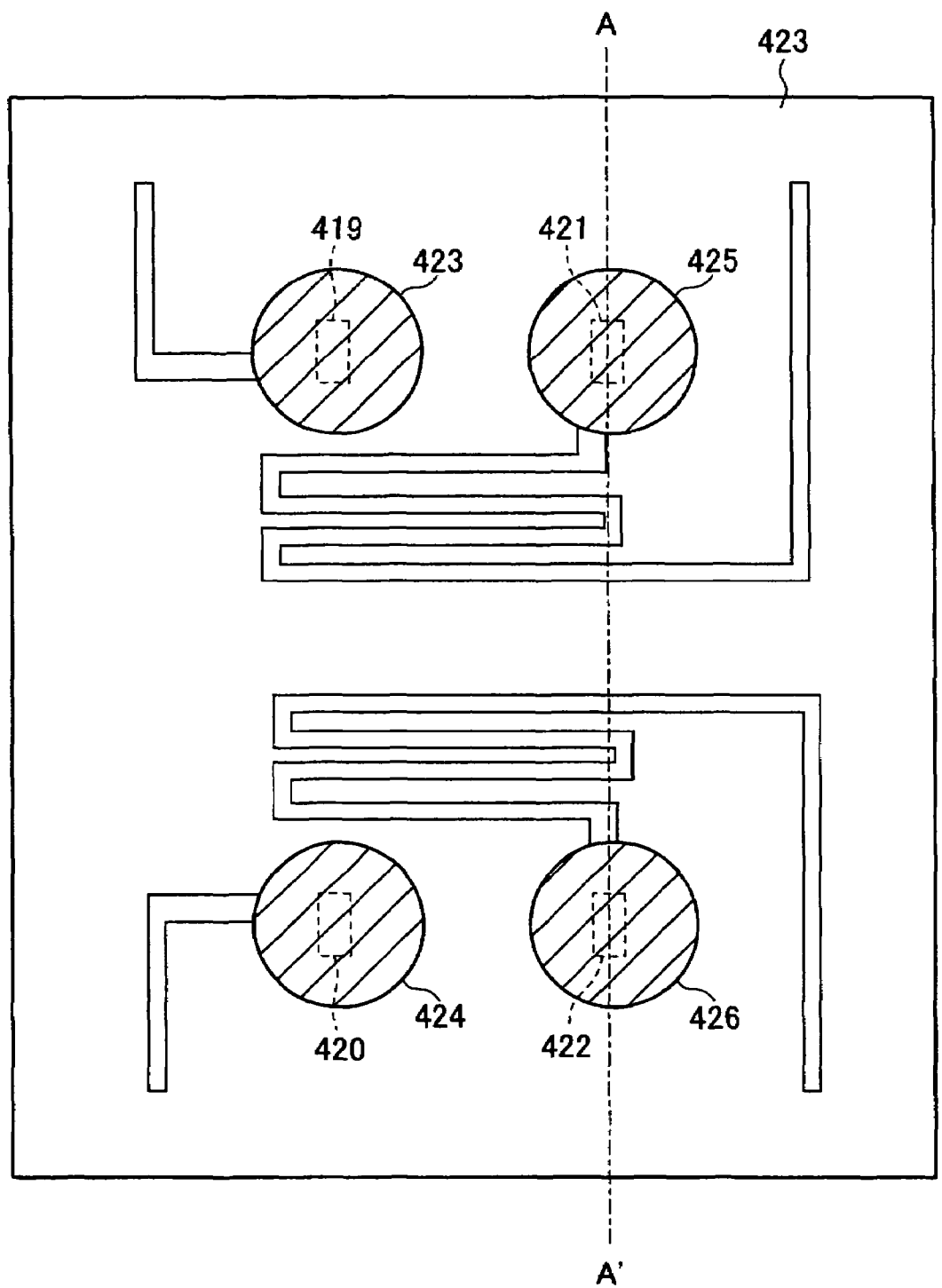
FIG. 26 is a plan view of the surface acoustic wave element of FIG. 25 with a bonding substrate placed thereon to produce a second wiring line.

Referring to FIG. 26, a bonding substrate 423 having through-holes 419–422 to expose the adhesives 414–417 is aligned with and disposed on the SAW element 412. The SAW element 412 is thus bonded to the bonding substrate 423. Second wiring lines 423–426 to be connected to the adhesive layers 414–417 through the through-holes 419–422 of the bonding substrate 423 are disposed. Each of the second wiring lines 425 and 426 includes an integrally formed inductor L. The inductors L of the second wiring lines 425 and 426 correspond to inductors 406 and 407. The inductor L is preferably included in the second wiring lines in this preferred embodiment. However, a capacitance C may be included in the second wiring lines.

Figure 27:
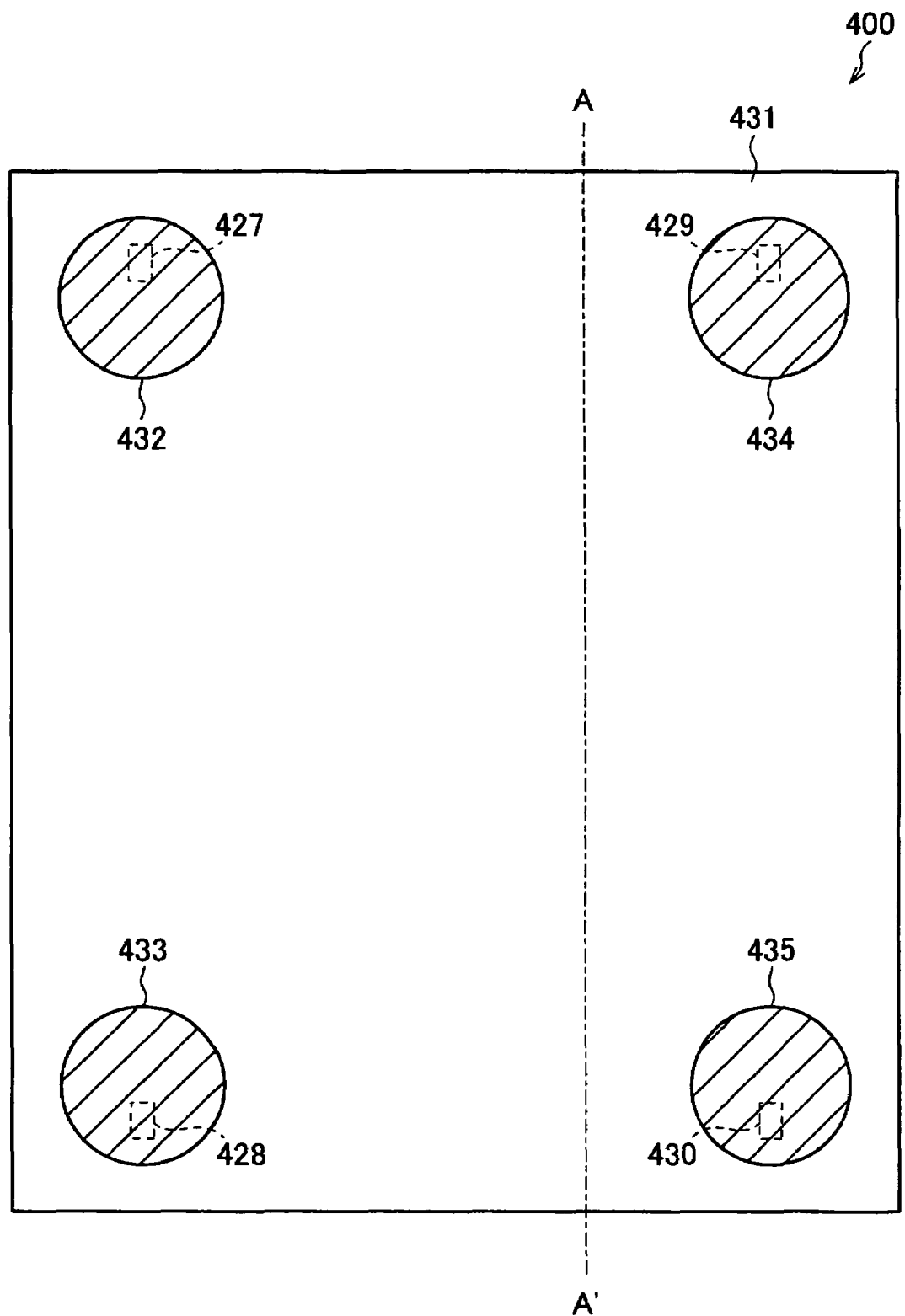
FIG. 27 is a plan view of the bonding substrate of FIG. 26 with an upper resin layer disposed thereon to produce an external terminal.

Referring to FIG. 27, an upper resin layer 431 having upper resin layer opening portions 427–430 to expose ends of the second wiring lines 423–426 is disposed on the bonding substrate 423. The manufacturing of the surface acoustic wave filter 400 is completed by disposing external terminals 432–435 to be connected to the second wiring lines 423–426 through the upper resin layer opening portions 427–430. Portions of the external terminals 432–435 within the regions of the upper resin layer opening portions 427–430 define external terminal connection members. In other words, each of the external terminals 432–435 has a unitary body including the external terminal connection member and the external terminal. The external terminal connection members and the external terminals 432–435 are produced, for example, by filling the upper resin layer opening portions 427–430 with Au—Sn solder using a printing technique, and by heat treating the solder. The external terminals may be a thin film produced using a liftoff process. The external terminal connection member and the external terminal may be separate elements produced in a different method.

Figure 28:
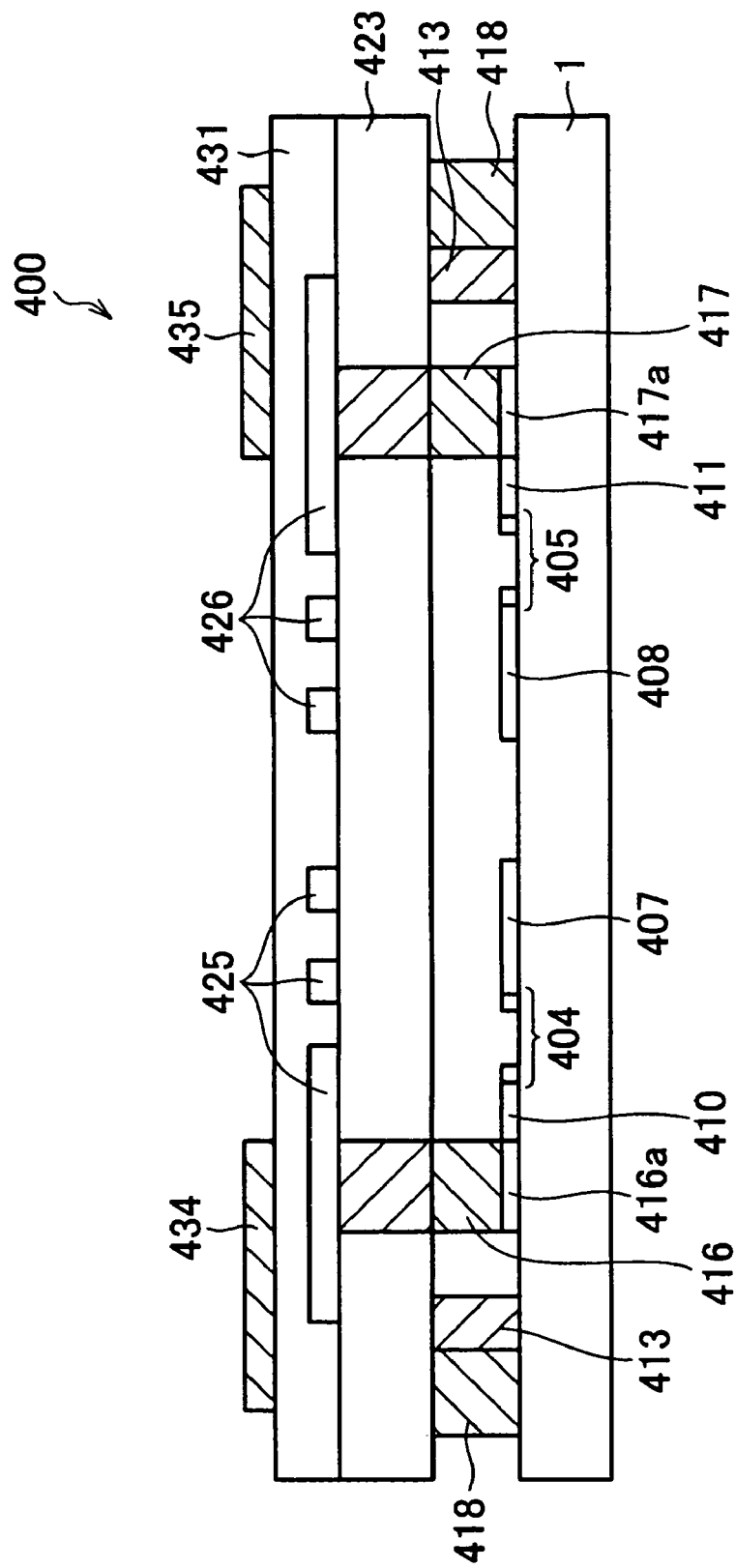
FIG. 28 is a cross sectional view of the surface acoustic wave device in accordance with the seventh preferred embodiment of the present invention.

FIG. 28 is a cross sectional view of the finished surface acoustic wave filter 400 taken along line A–A' in FIG. 25 through FIG. 27.

In the surface acoustic wave filter 400 shown in FIG. 28, a resin layer 417 maintains the protective space of the IDT of each surface acoustic wave resonator. Only the thickness of the adhesive layers 418 may maintain the protective space without using the resin layer.

Figure 29:
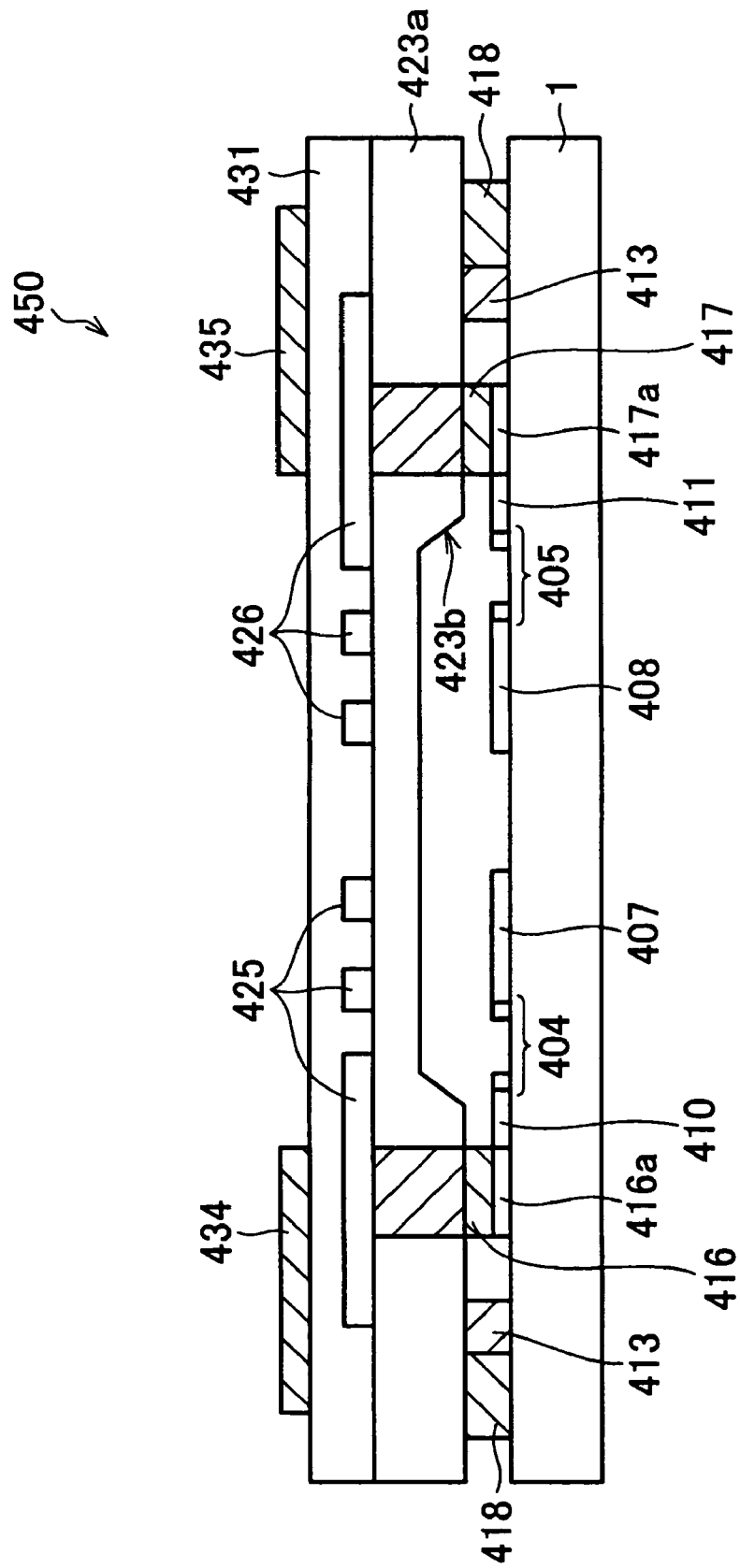
FIG. 29 is a cross sectional view of the surface acoustic wave device in accordance with a modification of the seventh preferred embodiment of the present invention.

As in a surface acoustic wave filter 450 shown in FIG. 29 in accordance with a modification of the present preferred embodiment, a bonding substrate 423a having a recess 423b at a location facing the IDT of each surface acoustic wave resonator may be used to maintain the protective space of the IDT of each surface acoustic wave resonator, instead of the bonding substrate 423 of the surface acoustic wave filter 400.

Another modification of the surface acoustic wave resonator of the present preferred embodiment will now be discussed with reference to FIG. 30 through FIG. 34.

Figure 30:
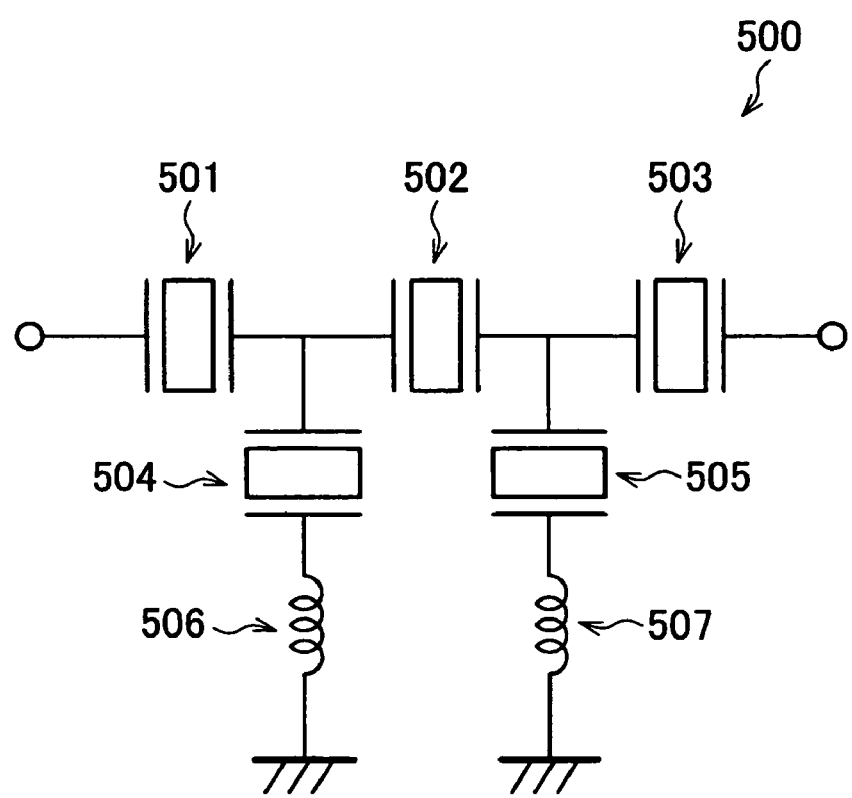
FIG. 30 is a circuit diagram of a surface acoustic wave device in accordance with another modification of the seventh preferred embodiment of the present invention.

FIG. 30 is a circuit diagram of a surface acoustic wave filter 500 in accordance with the other modification of the present preferred embodiment of the present invention. The surface acoustic wave filter 500 includes surface acoustic wave resonators 501–505, each having an IDT (vibrator), arranged in a ladder configuration. The surface acoustic wave resonators 501–503 are serial resonators, and the surface acoustic wave resonators 504 and 505 are parallel resonators. Inductors 506 and 507 are connected in series with the surface acoustic wave resonators 504 and 505, respectively.

The surface acoustic wave filter 500 is now discussed with reference to FIG. 30 through FIG. 34.

Figure 31:
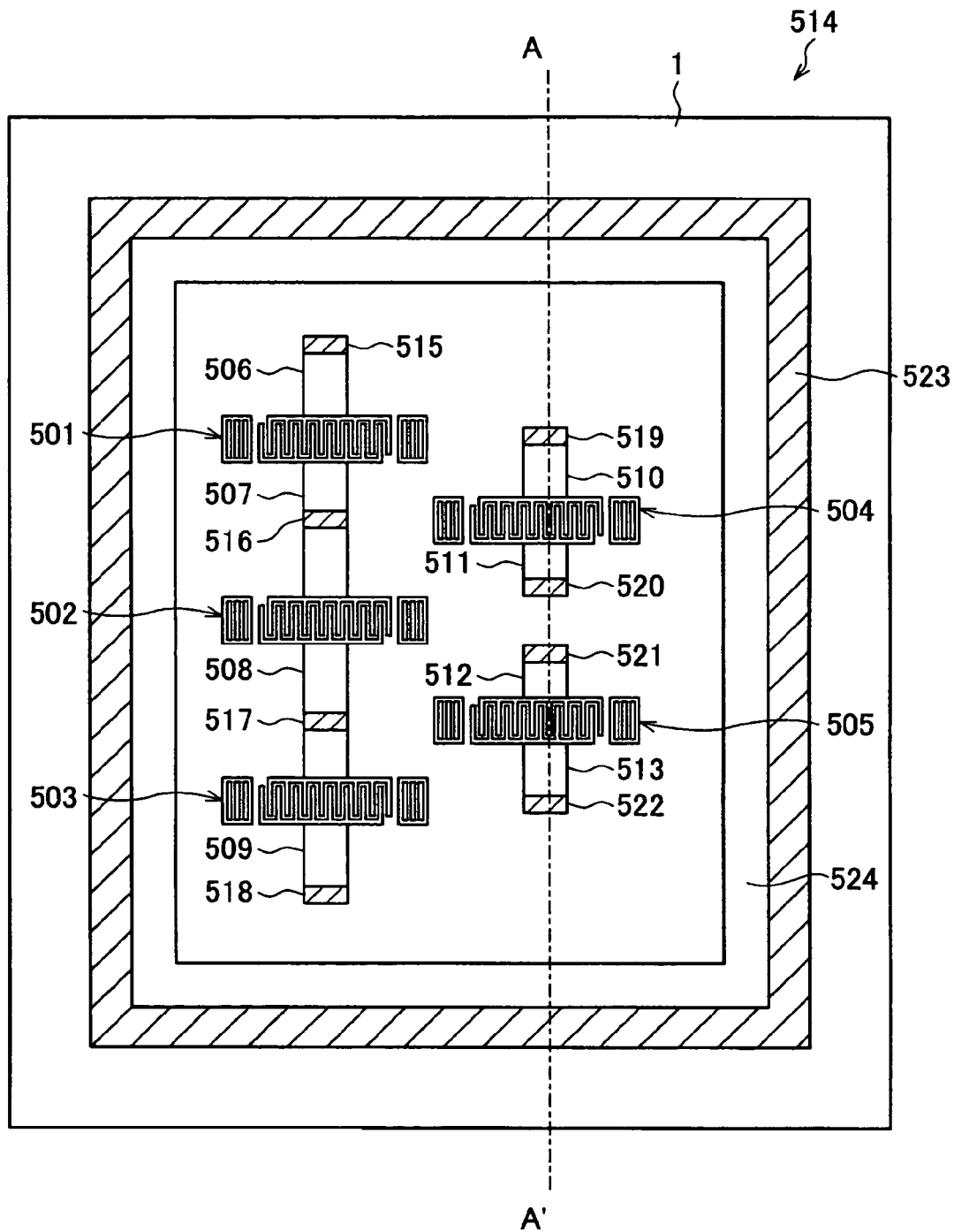
FIG. 31 is a plan view of the surface acoustic wave element of the surface acoustic wave device in accordance with the other modification of the seventh preferred embodiment of the present invention.

Referring to FIG. 31, the surface acoustic wave resonators 501–505, and routed wiring lines (element wiring lines) 506–513 are disposed on the piezoelectric substrate 1 to produce a SAW element 514. A resin layer 524 is disposed on the piezoelectric substrate 1 so as to surround the surface acoustic wave resonators 501–505, and the routed wiring lines 506–513. Adhesive layers 515–522, made of an electrically conductive material such as solder, are disposed on portions of the routed wiring lines 506–513, and an adhesive layer 523, made of solder, is arranged so as to surround the resin layer 524 on the piezoelectric substrate 1. The adhesive layers 515–522 and the adhesive layer 523 may be concurrently deposited.

Figure 32:
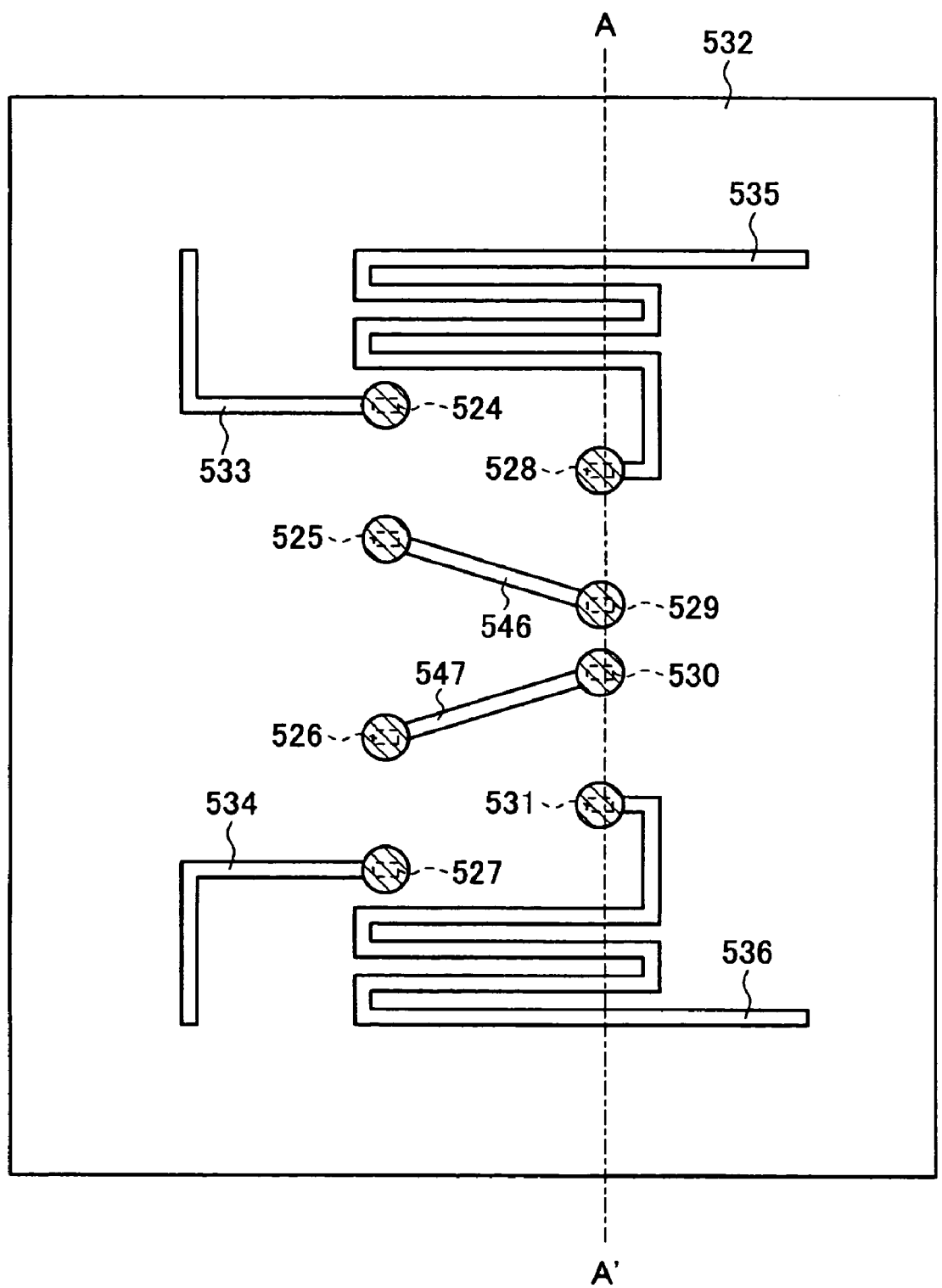
FIG. 32 is a plan view of the surface acoustic wave element of FIG. 31 with a bonding substrate placed thereon to produce a second wiring line.

Referring to FIG. 32, a bonding substrate 532 having through-holes 524–531 to expose the adhesive layers 515–522 is aligned with and disposed on the SAW element 514. The SAW element 514 is thus bonded to the bonding substrate 532. Second wiring lines 533 and 536 connected to the adhesive layers 515–522 through the through-holes 524–531 of the bonding substrate 532 are disposed. Each of the second wiring lines 535 and 536 includes an integrally formed inductor L. The inductors L of the first wiring lines 535 and 536 correspond to inductors 506 and 507. The inductor L is included in the second wiring lines here, but alternatively, a capacitance C may be included in the second wiring lines. A wiring line 546 for connecting wiring lines 507 and 511 through the through-holes 525 and 529 is disposed, and a wiring line 547 for connecting wiring lines 508 and 512 through the through-holes 526 and 530 is disposed.

Figure 33:
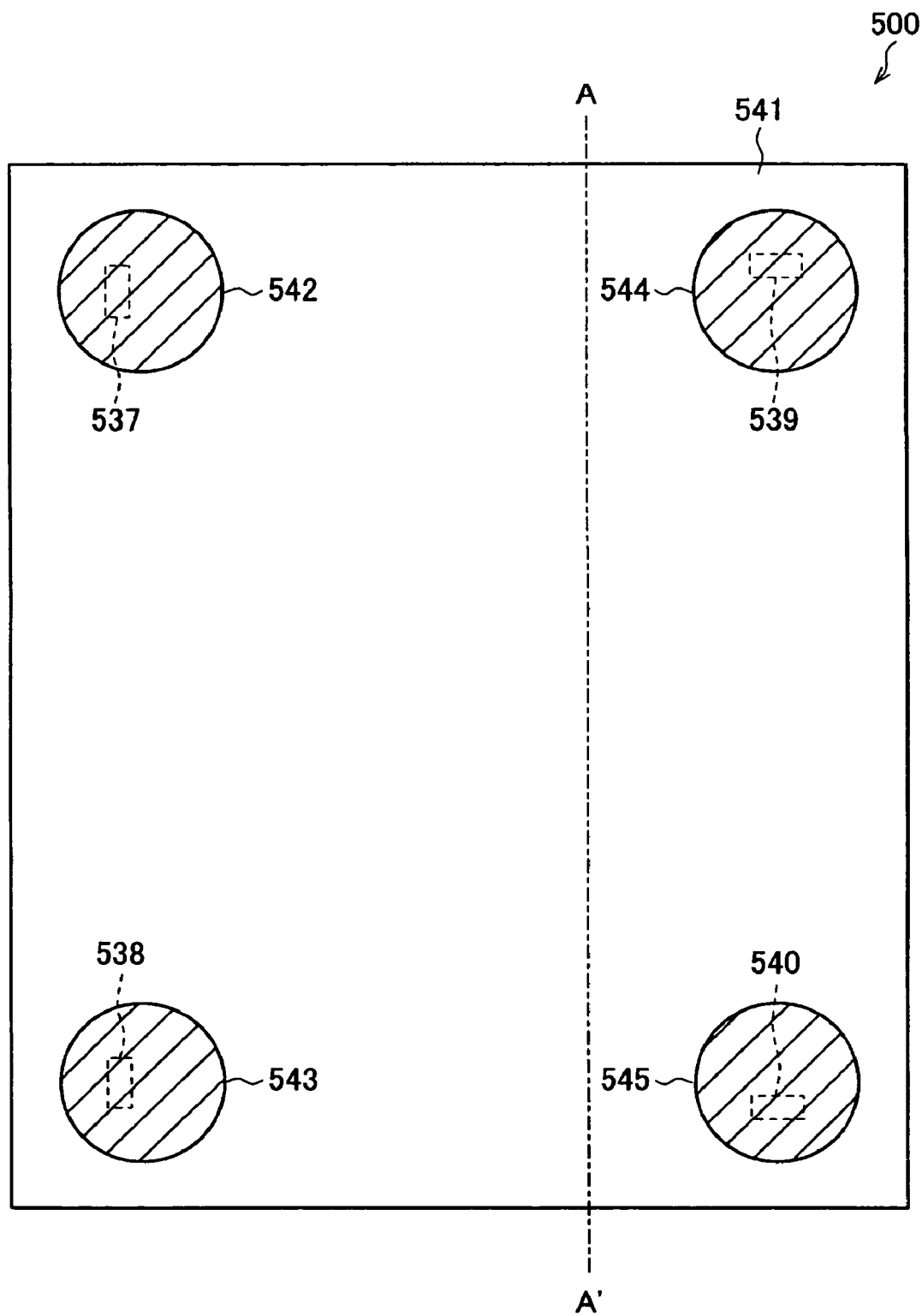
FIG. 33 is a plan view of the bonding substrate of FIG. 32 with an upper resin layer disposed thereon to produce an external terminal.

Referring to FIG. 33, an upper resin layer 541 having upper resin layer opening portions 537–540 to expose ends of the second wiring lines 533–536 is disposed on the bonding substrate 532. The manufacturing of the surface acoustic wave filter 500 is completed by disposing external terminals 542–545 to be connected to the second wiring lines 533–536 through the upper resin layer opening portions 537–540. Portions of the external terminals 542–545 within the regions of the upper resin layer opening portions 537–540 define external terminal connection members. In other words, each of the external terminals 542–545 has a unitary body including the external terminal connection member and the external terminal.

Figure 34:
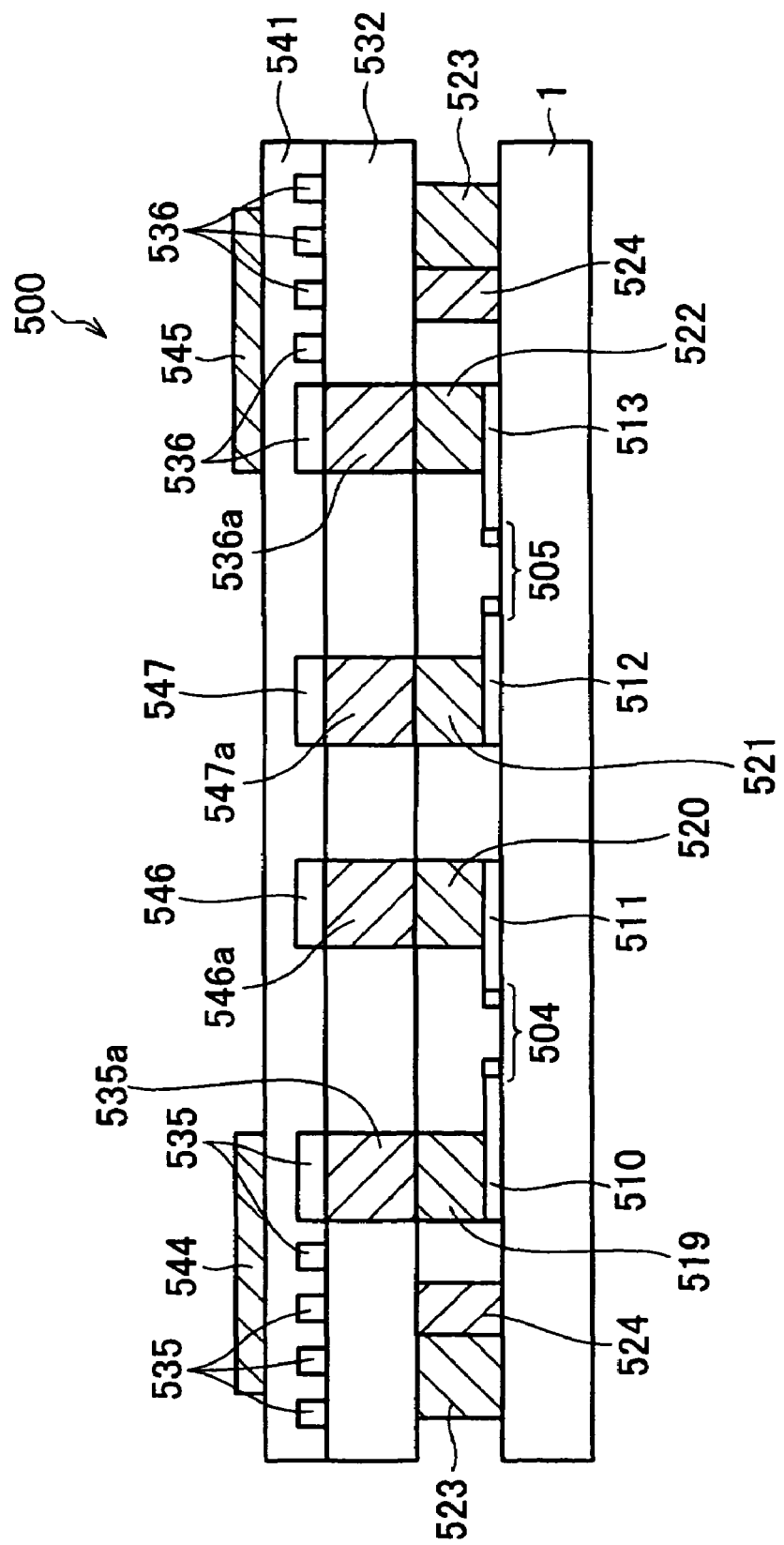
FIG. 34 is a cross sectional view of the surface acoustic wave device in accordance with another modification of the preferred seventh embodiment of the present invention.

FIG. 34 is a cross sectional view of the finished surface acoustic wave filter 500 taken along line A–A' in FIG. 31 through FIG. 33.

In the surface acoustic wave filter 500 shown in FIG. 34, a resin layer 514 maintains the protective space of the IDT of each surface acoustic wave resonator. Only the thickness of the adhesive layer 523 may maintain the protective space without using the resin layer. As shown in FIG. 34, portions of the second wiring lines 535, 536, 546, and 547 within the through-holes 528–531 in the surface acoustic wave filter 500 are designated as second wiring lines 535a, 536a, 546a, and 547a. The second wiring lines 535, 536, 546, and 547 and the second wiring lines 535a, 536a, 546a, and 547a are produced, for example, by filling the through-holes 528–531 with Au—Sn solder using a printing technique, and by heat treating the solder. The second wiring lines 535, 536, 546, and 547 and the second wiring lines 535a, 536a, 546a, and 547a may be a thin film produced using a liftoff process. The second wiring lines 535, 536, 546, and 547 may be separate elements from the second wiring lines 535a, 536a, 546a, and 547a, and may be produced using a method that is different from a method of producing the second wiring lines 535a, 536a, 546a, and 547a.

Figure 35:
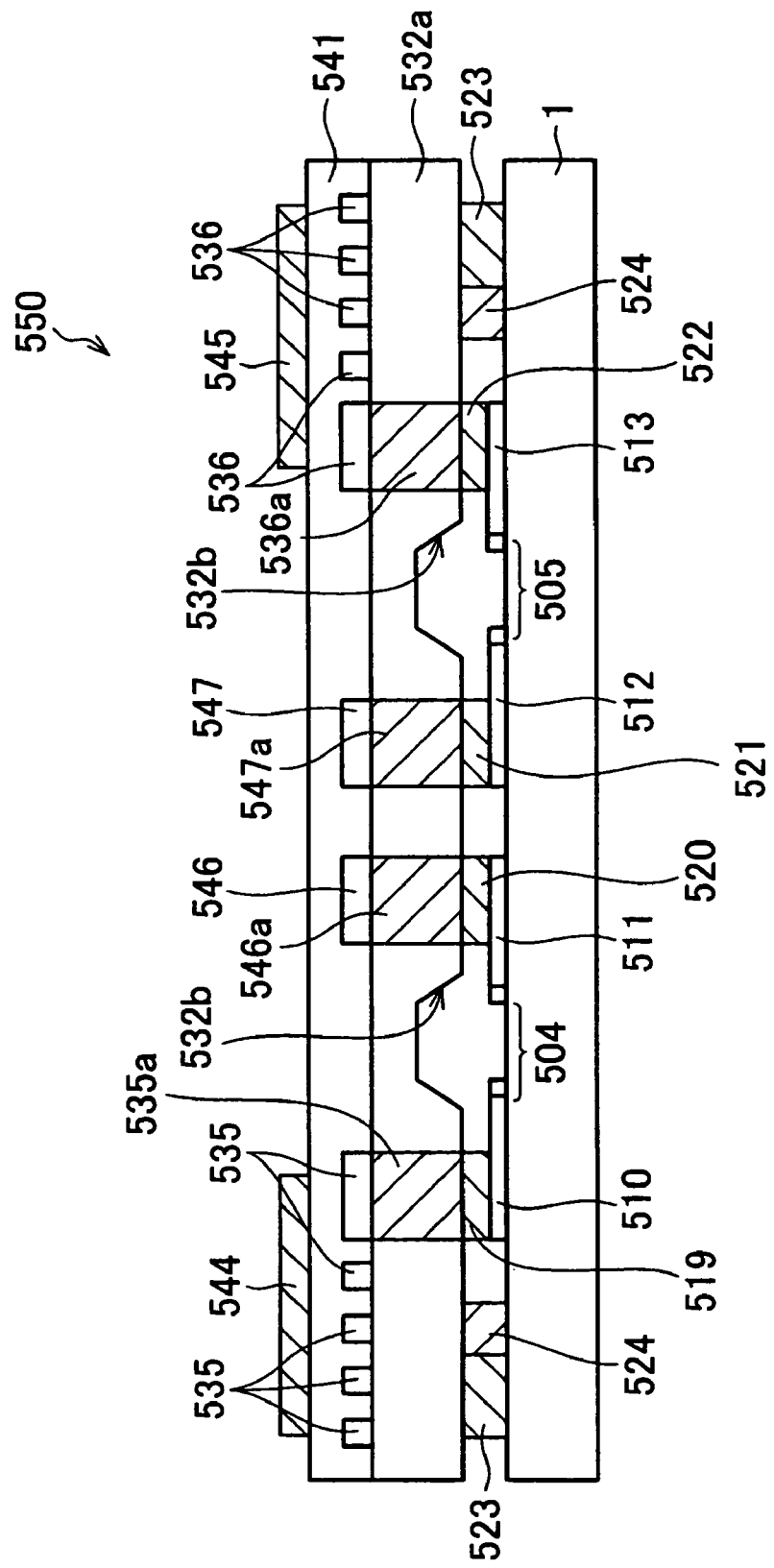
FIG. 35 is a cross sectional view of a surface acoustic wave device in accordance with yet another modification of the seventh preferred embodiment of the present invention.

As in a surface acoustic wave filter 550 shown in FIG. 35 in accordance with yet another modification of the present preferred embodiment, a bonding substrate 532a having a recess 532b at a location facing the IDT of each surface acoustic wave resonator may be used to maintain the protective space of the IDT of each surface acoustic wave resonator, instead of the bonding substrate 532 of the surface acoustic wave filter 500.

Eighth Preferred Embodiment

A further preferred embodiment of the present invention will now be discussed with reference to FIG. 36 through FIG. 40. For convenience of explanation, elements identical in function to those described in connection with the first through seventh preferred embodiments are designated with the same reference numerals, and the discussion thereof is omitted.

Figure 36:
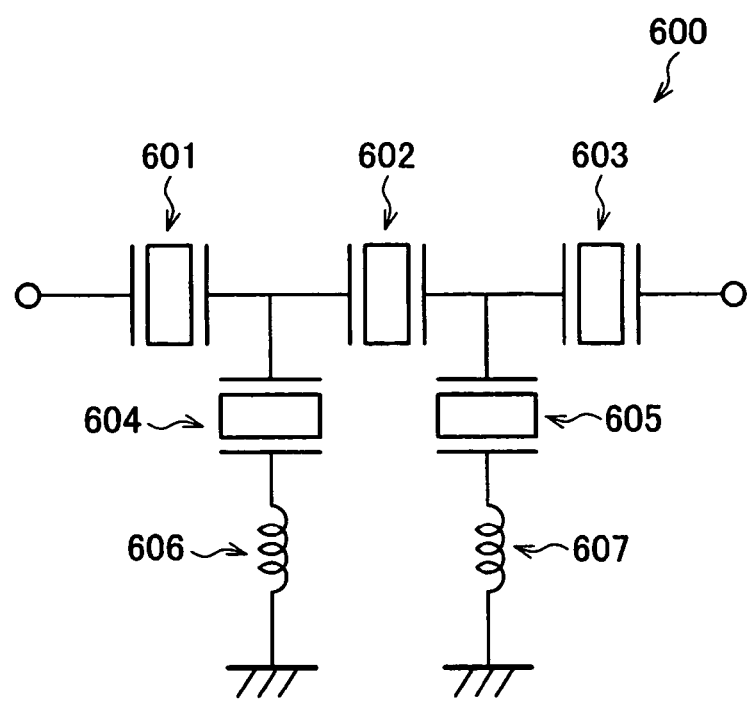
FIG. 36 is a circuit diagram of a surface acoustic wave device in accordance with an eighth preferred embodiment of the present invention.

FIG. 36 is a circuit diagram of a surface acoustic wave filter 600 of the present preferred embodiment. The surface acoustic wave filter 600 includes surface acoustic wave resonators 601–605, each having an IDT (vibrator), arranged in a ladder configuration. The surface acoustic wave resonators 601–603 are serial resonators, and the surface acoustic wave resonators 604 and 605 are parallel resonators. Inductors 606 and 607 are connected in series with surface acoustic wave resonators 604 and 605, respectively.

The surface acoustic wave filter 600 is now discussed with reference to FIG. 37 through FIG. 40.

Figure 37:
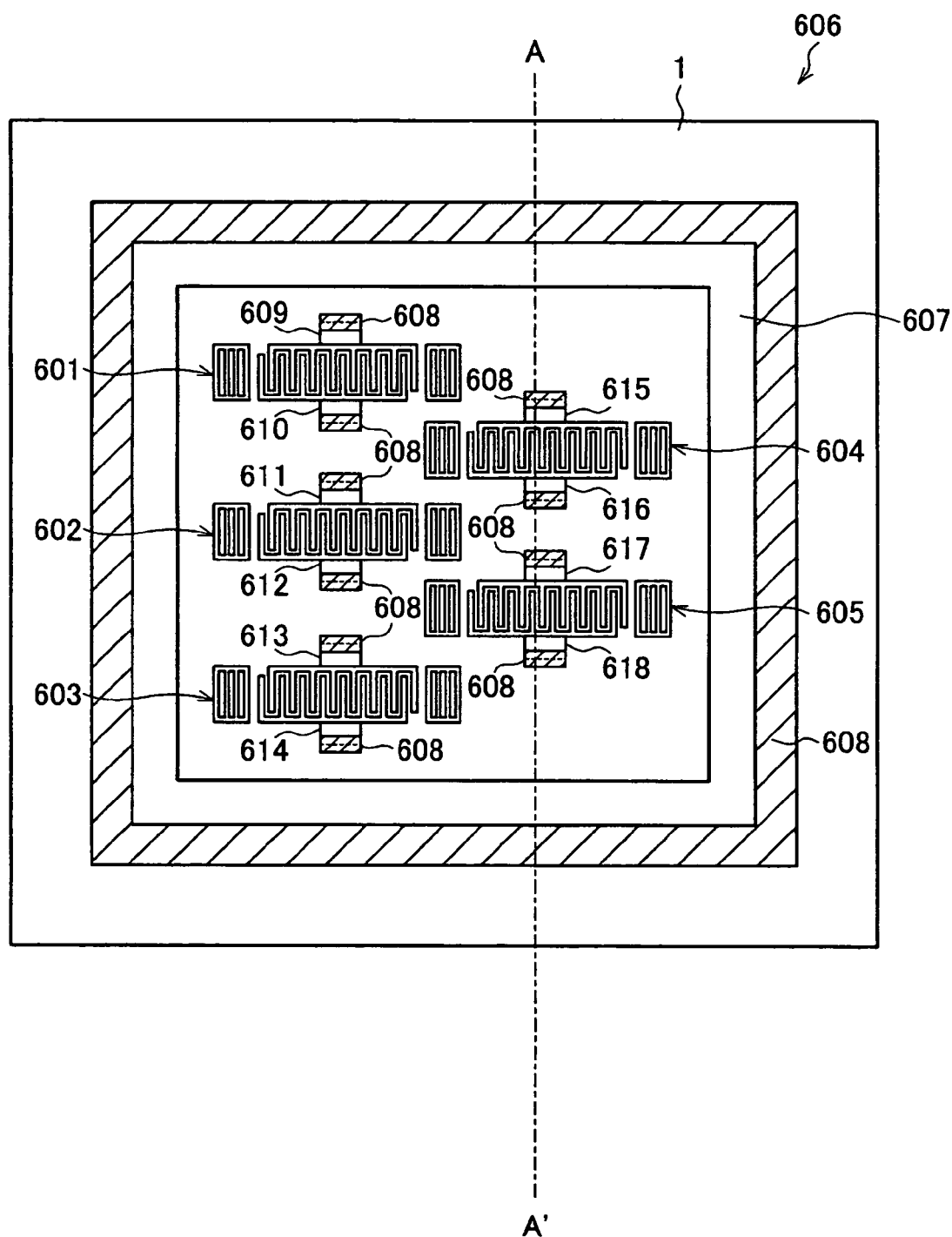
FIG. 37 is a plan view of a surface acoustic wave element of the surface acoustic wave device in accordance with the eighth preferred embodiment of the present invention.

Referring to FIG. 37, the surface acoustic wave resonators 601–605 and routed wiring lines (element wiring lines) 609–618 are disposed on the piezoelectric substrate 1 to produce a SAW element 606. A resin layer 607 is disposed on the piezoelectric substrate 1 so as to surround the surface acoustic wave resonators 601–605 and the routed wiring lines 609–618. An adhesive layer 608, made of solder, is arranged so as to surround the resin layer 607 on the piezoelectric substrate 1.

Figure 38:
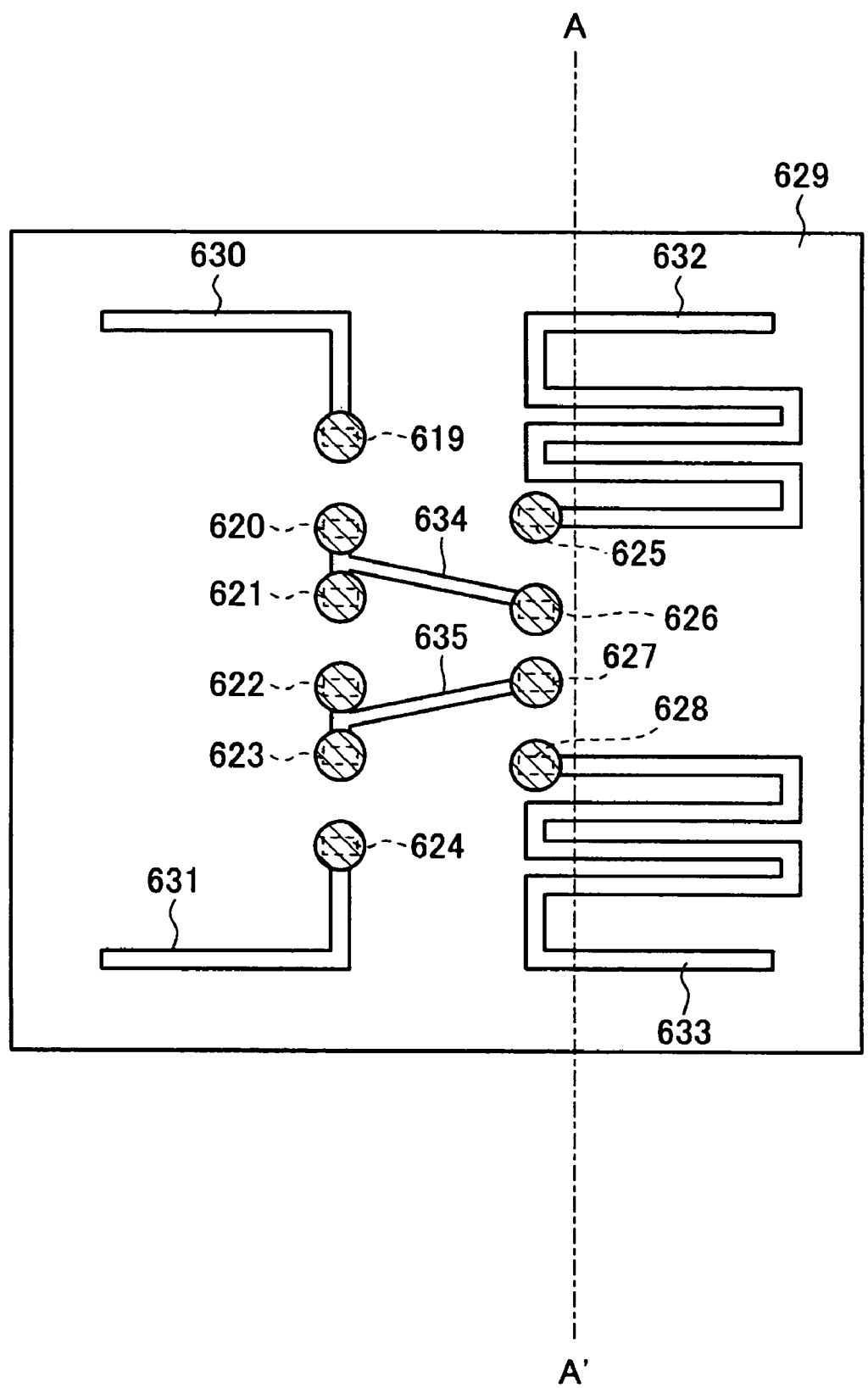
FIG. 38 is a plan view of the surface acoustic wave element of FIG. 37 with a bonding substrate placed thereon to product a second wiring line.

Referring to FIG. 38, a bonding substrate 629 having through-holes 619–628 to expose the routed wiring lines 609–618 is aligned with and disposed on the SAW element 606. The SAW element 606 is thus bonded to the bonding substrate 629. Second wiring lines 630–633 connected to the routed wiring lines 609, 614, 615, and 618 through the through-holes 619, 624, 625, and 628 of the bonding substrate 629 are disposed. Each of the second wiring lines 632 and 633 includes an integrally formed inductor L. The inductors L of the first wiring lines 632 and 633 correspond to the above-mentioned inductance 606 and 607. The inductor L is included in the second wiring lines here, but alternatively, a capacitance C may be included in the second wiring lines. A connection wiring line (second wiring line) 634 for connecting the routed wiring lines 610, 611, and 616 through the through-holes 620, 621, and 626 is disposed, and a connection wiring line (second wiring line) 635 for connecting the routed wiring lines 612, 613, and 617 through the through-holes 622, 623, and 627 is disposed. Bus bars of the surface acoustic wave resonators 601–605 are preferably partially thickened. In this manner, connectivity of the bus bars with the second wiring lines 630–633 or the connection wiring lines 634 and 635 is improved. Since the connection wiring lines 634 and 635 are disposed on the bonding substrate 629, the surface acoustic wave resonators 601–605 are arranged with narrow spacing therebetween on the SAW element 606. The surface acoustic wave filter is thus miniaturized.

Figure 39:
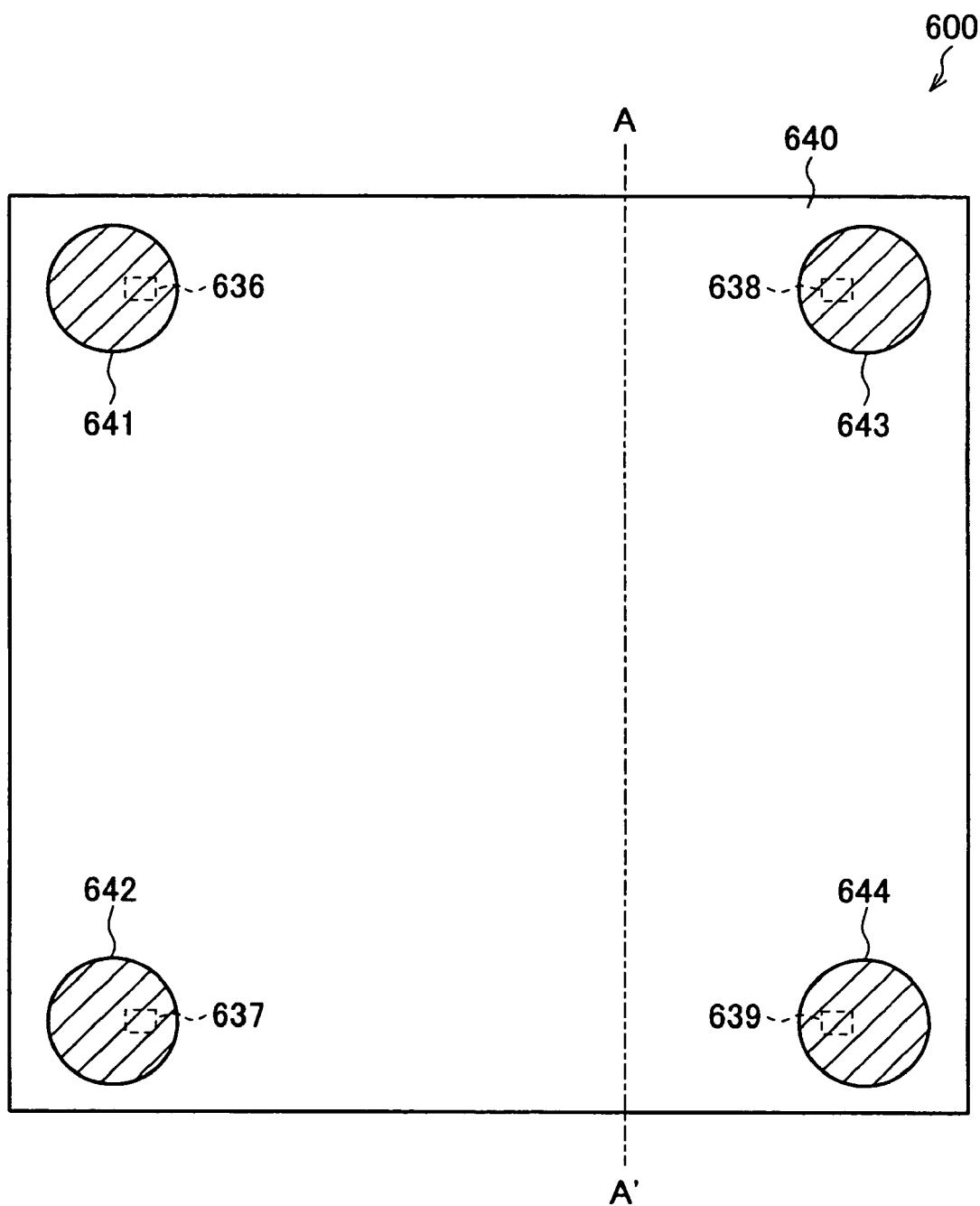
FIG. 39 is a plan view of the bonding substrate of FIG. 38 with an upper resin layer disposed thereon to produce an external terminal.

An upper resin layer (upper insulating layer) 640 having upper resin opening portions 636–639 to expose the ends of the second wiring lines 630–633 is disposed on the bonding substrate 629 as shown in FIG. 39. The manufacturing of the surface acoustic wave filter 600 is completed by disposing external terminals 641–644 to be connected to the second wiring lines 630–633 through the upper resin layer opening portions 636–639. Portions of the external terminals 641–644 within the regions of the upper resin layer opening portions 636–639 define external terminal connection members. In other words, each of the external terminals 641–644 has a unitary body including the external terminal connection member and the external terminal. The external terminal connection members and the external terminals are produced, for example, by filling the upper resin layer opening portions 636–639 with Au—Sn solder using a printing technique, and by heat treating the solder. The external terminals may be a thin film produced using a liftoff process. The external terminal connection member and the external terminal may be separate elements produced in a different method.

Figure 40:
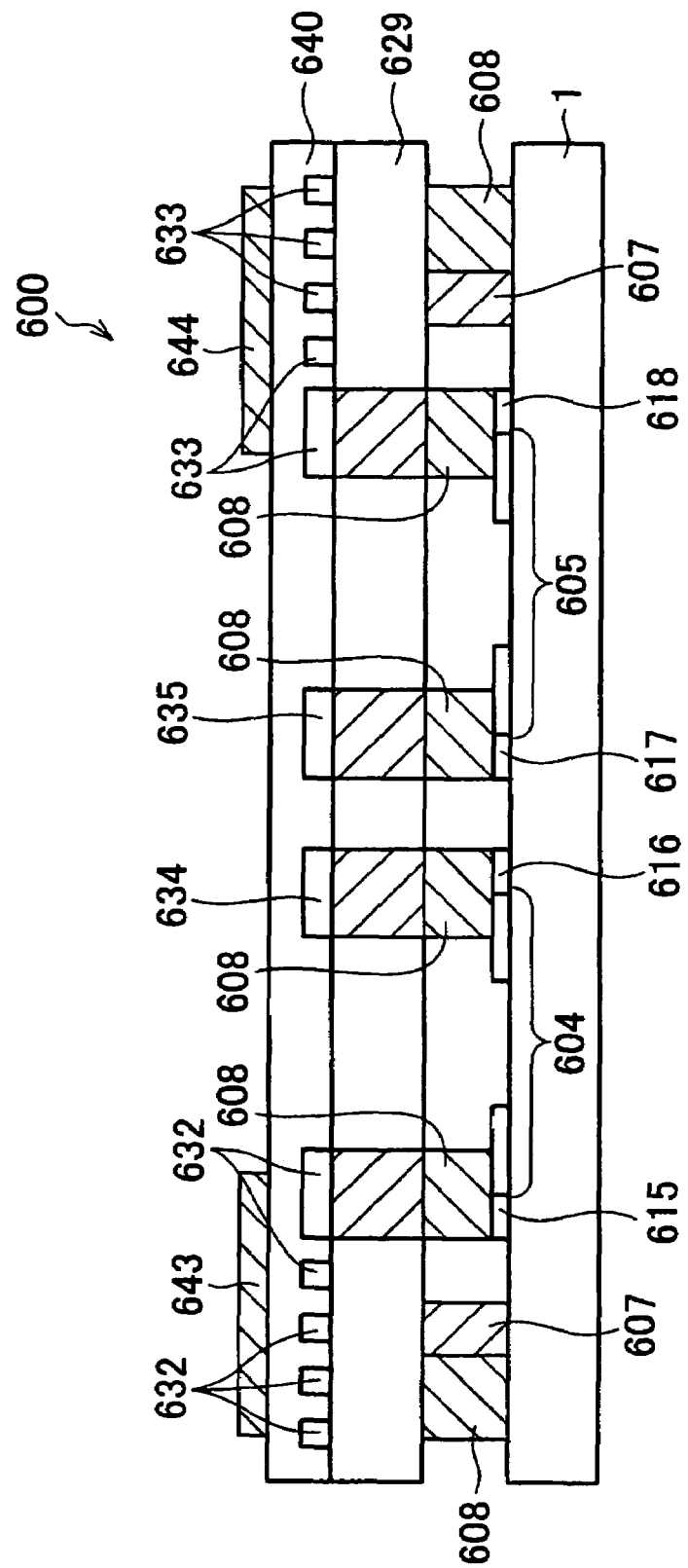
FIG. 40 is a cross sectional view of the surface acoustic wave device in accordance with the eighth preferred embodiment of the present invention.

FIG. 40 is a cross sectional view of the finished surface acoustic wave filter 600 taken along line A–A' in FIG. 37 through FIG. 39.

In the surface acoustic wave filter 600 shown in FIG. 40, the thickness of the resin layer 607 maintains the protective space of the IDT of each of the surface acoustic wave resonators 604 and 605 of the SAW element 606. Similarly, the thickness of the resin layer maintains the protective space of the IDT in each of the surface acoustic wave resonators 601–603. The protective space is maintained by arranging recesses in the bonding substrate 629 at a location facing the surface acoustic wave resonators 601–605. The recesses are formed at the same time that the through-holes 619–628 are formed in the bonding substrate 629.

In the first through eighth preferred embodiments, the resin opening portion, the through-hole, and the upper resin opening portion are shifted in position from each other. Alternatively, the resin opening portion, the through-hole, and the upper resin opening portion may be aligned with each other. In this arrangement, the conductive pads and a portion of wiring lines may be eliminated, and the surface acoustic wave filter is further miniaturized. With the conductive pads and the portion of the wiring lines eliminated, parasitic capacitance is also reduced.

The surface acoustic wave element includes the piezoelectric substrate. If wiring lines having different potentials face each other on the piezoelectric substrate in a plan view, a parasitic capacitance occurs depending upon the value of dielectric constant of the piezoelectric substrate, and an insertion loss develops. The surface acoustic wave filter of preferred embodiments of the present invention reduces the number of wiring lines disposed on the piezoelectric substrate. At the same time, the resin layer, made of a material having a dielectric constant that is less than the piezoelectric substrate, is used, and required wiring lines are arranged on the bonding substrate. This arrangement controls the generation of parasitic capacitance even where wiring lines having different potentials face each other in a plan view.

The above-referenced surface acoustic wave filter enables an L component or a C component to be included in the wiring line arranged on the resin layer or the bonding substrate. In other words, an L component element or a C component element is added without increasing the size of the surface acoustic wave filter.

Ninth Preferred Embodiment

The SAW elements as the piezoelectric element have been discussed in connection with the first through eighth preferred embodiments. A piezoelectric thin-film element may be used for the piezoelectric element in the first through eight preferred embodiments to provide the same advantages.

A method for manufacturing one example of the piezoelectric thin-film filter (piezoelectric component) using the piezoelectric thin-film element will now be discussed with reference to FIG. 41 through FIG. 45. The present preferred embodiment is substantially identical to the first preferred embodiment except that the SAW element is replaced with the piezoelectric thin-film element.

Figure 44:
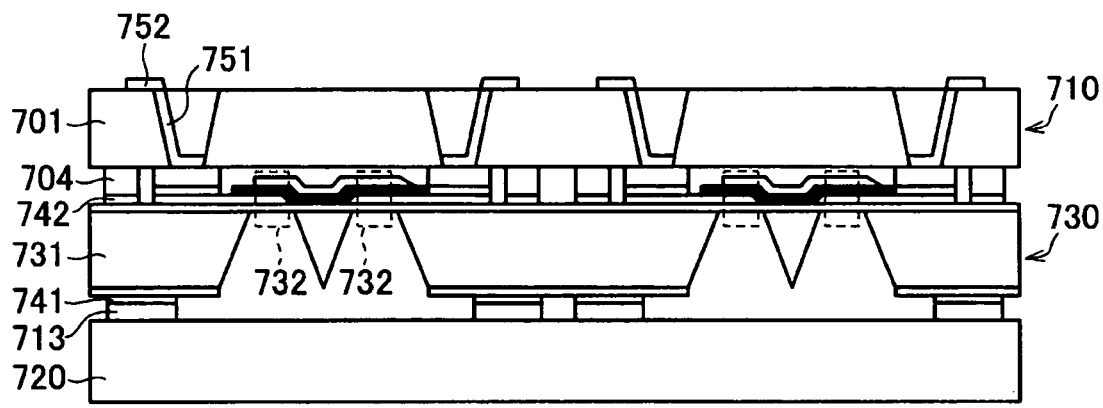
FIG. 44 illustrates, in cross section, process steps of the piezoelectric thin-film filter in accordance with the ninth preferred embodiment of the present invention.
Figure 44:
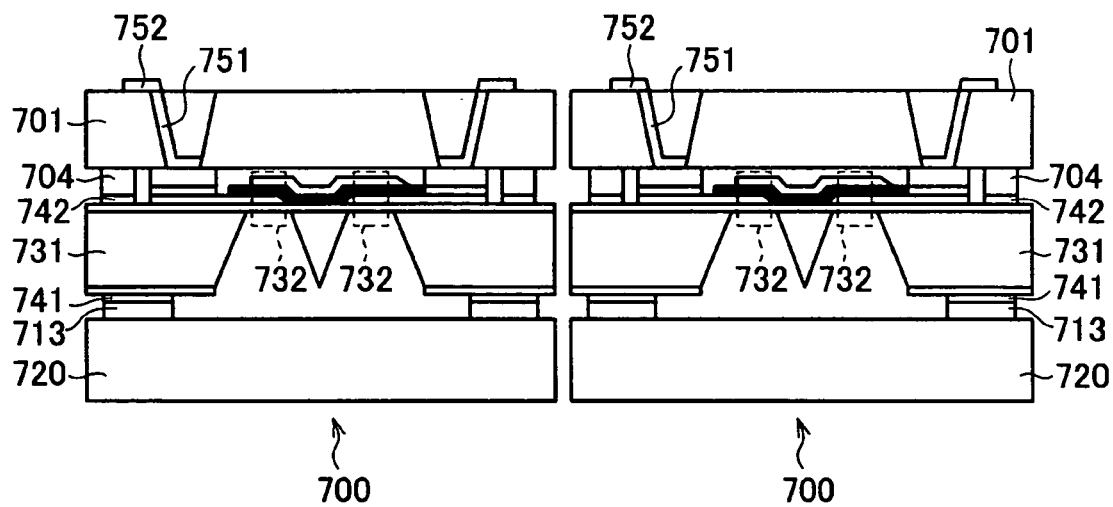

Referring to FIG. 44, a chip-size packaged piezoelectric thin-film filter 700 of the present preferred embodiment is discussed. The piezoelectric thin-film filter 700 includes a piezoelectric thin-film element (piezoelectric element) 730 and a bonding substrate 710 bonded to the piezoelectric thin-film element 730 by an adhesive layer made of an electrically conductive material, such as solder. The piezoelectric thin film element 730 of the present preferred embodiment includes a piezoelectric thin film resonator (vibrator) that faces the bonding substrate 720. The piezoelectric thin film resonator includes a thin film section including at least one piezoelectric thin film layer on a diaphragm thereof that is sandwiched between a pair of lower electrode and upper electrode with the upper surface and the lower surface of the thin film section facing the upper electrode and the lower electrode. In accordance with the present preferred embodiment, a lid substrate 720 is bonded to the surface of the piezoelectric thin film element 730 opposite from the surface of the piezoelectric thin film element 730 bonded to the bonding substrate 710.

Figure 41:
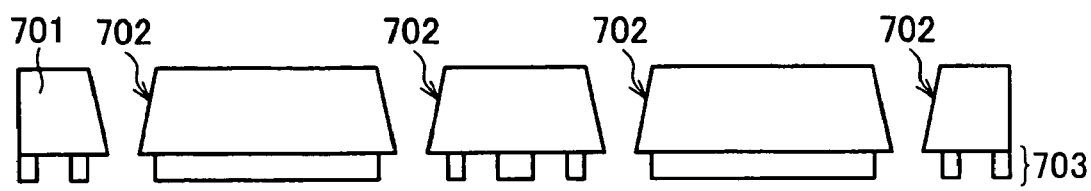
FIG. 41 illustrates, in cross section, process steps of a piezoelectric thin-film filter in accordance with a ninth preferred embodiment of the present invention.
Figure 41:
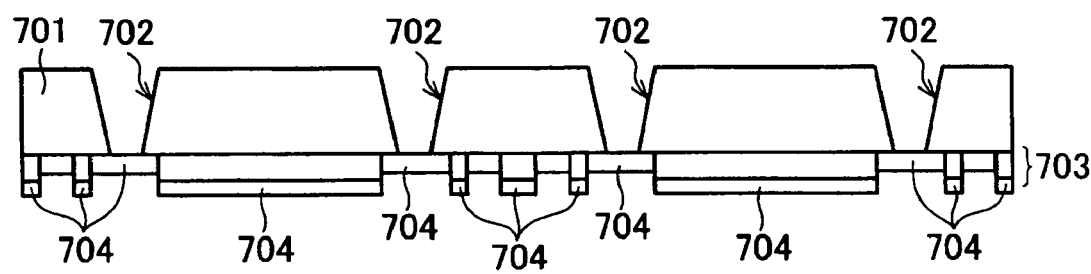
Figure 41:
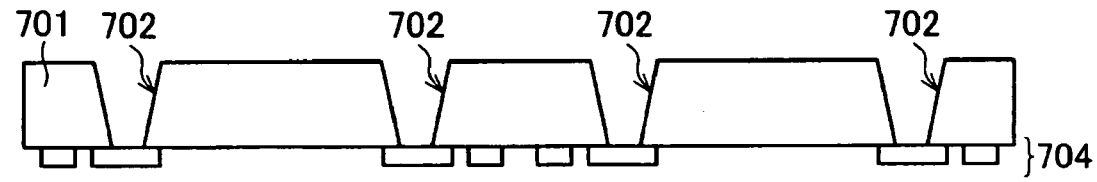

Referring to FIG. 41, the bonding substrate 710 is manufactured in process step 1 through process step 3.

In process step 1, through-holes 702 are provided at predetermined positions of a substrate 701 made of glass, hard glass, or other suitable material. A recess is preferably provided at a location of the substrate 701 facing the piezoelectric thin film resonator. A resist pattern 703 for depositing an adhesive layer is disposed on the substrate 701.

In process step 2, an adhesive layer 704 having a multilayer structure of Sn (4 μm)/Au (2 μm)/Ni (1 μm)/Ti (0.3 μm), for example, is deposited in accordance with the resist pattern 703. In the case of the adhesive layer 704 having the multi-layer structure of Sn (4 μm)/Au (2 μm)/Ni (1 μm)/Ti (0.3 μm), the layers are successively laminated on the substrate 701 starting with the Ti layer. The adhesive layer 704 is deposited using a thin-film formation process such as electron beam vapor deposition, plating, sputtering, or other technique.

In process step 3, the resist pattern 703 is lifted off, and the bonding substrate 710 is thus produced.

Figure 42:
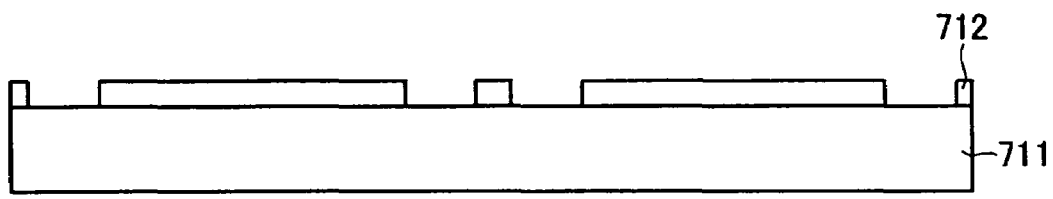
FIG. 42 illustrates, in cross section, process steps of the piezoelectric thin-film filter in accordance with the ninth preferred embodiment of the present invention.
Figure 42:
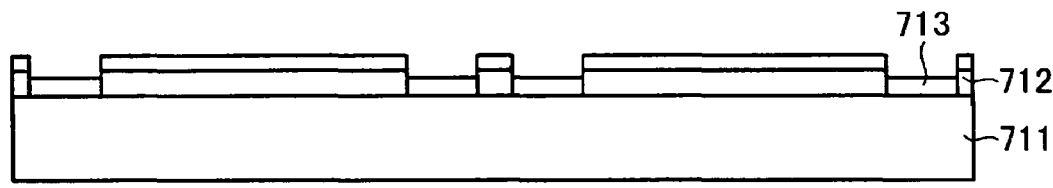
Figure 42:
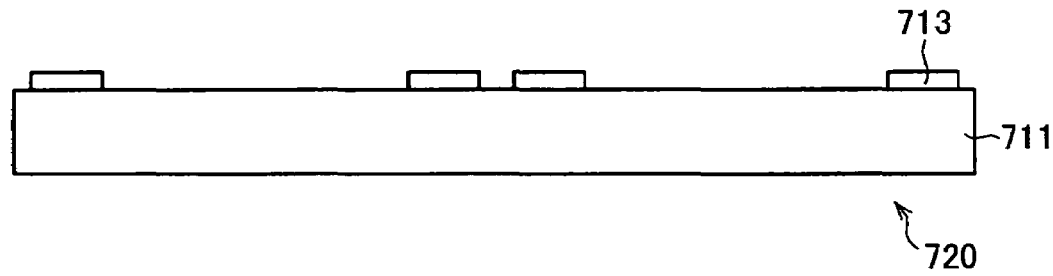

Referring to FIG. 42, the lid substrate 720 is manufactured in process step 4 through process step 6.

In process step 4, a resist pattern 712 for disposing an adhesive layer is arranged on a substrate 711 made of glass, hard glass, or other suitable material.

In process step 5, the adhesive layer 713 including a solder layer and a bonding layer is deposited in accordance with the resist pattern 712. The adhesive layer 713 has a multi-layer structure of Sn (4 μm)/Au (2 μm)/Ni (1 μm)/Ti (0.3 μm), for example. A laminate of Sn (4 μm)/Au (2 μm) corresponds to a solder layer, and a laminate of Ni (1 μm)/Ti (0.3 μm) corresponds to the bonding layer. The Ti layer serves as an adhesive layer with the substrate 711, and the Ni layer is provided between the adhesive layer and the solder layer to prevent spread of the solder. The bonding layer is disposed on the substrate 711, using a thin film formation process, such as electron beam vapor deposition, plating, or sputtering.

In process step 6, the resist pattern 712 is lifted off, and the bonding substrate 720 is thus produced.

Figure 43:
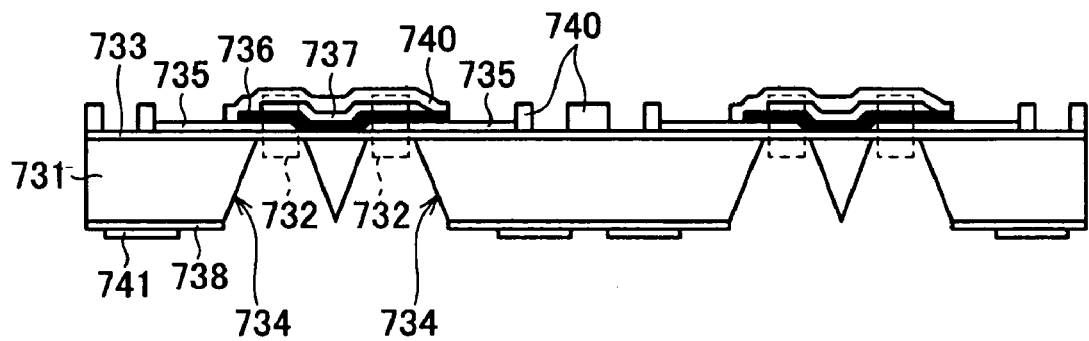
FIG. 43 illustrates, in cross section, process steps of the piezoelectric thin-film filter in accordance with the ninth preferred embodiment of the present invention.
Figure 43:
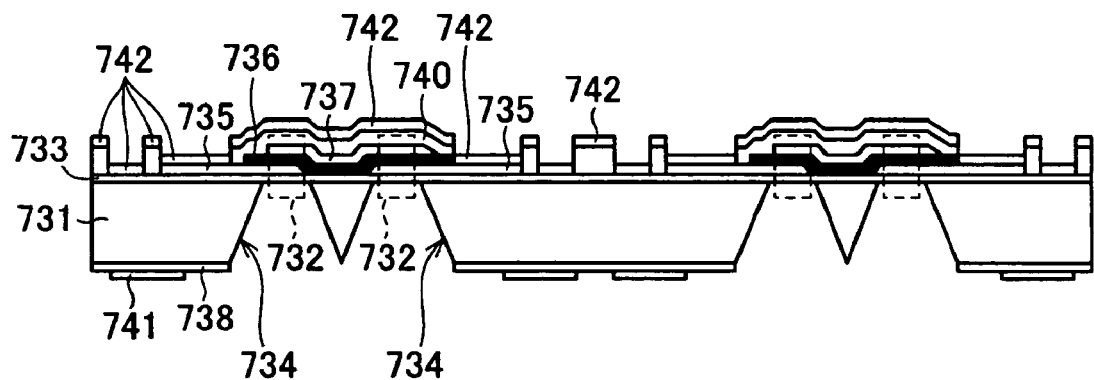
Figure 43:
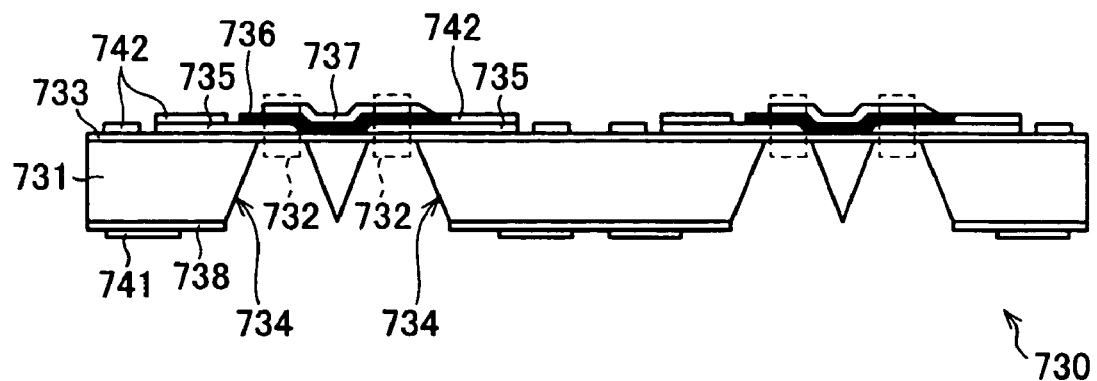

Referring to FIG. 43, the piezoelectric thin film element 730 is manufactured in process step 7 through process step 9.

In process step 7, a plurality of piezoelectric resonators 732 is disposed on a base substrate 731 made of silicon. The piezoelectric resonator 732 includes the base substrate 731 made of silicon, and an insulating layer 733 disposed on the base substrate 731, and including a layer of $SiO_2$ and layers of $SiO_2$ and $Al_2O_3$, or a layer of $Al_2O_3$ and a layer of $SiO_2$. The piezoelectric thin film resonator 732 is produced in an opening (cavity) 734 that penetrates the base substrate 731 in the direction of thickness thereof, and reaches an insulating layer 733. An opening 735 of the insulating layer 733 defines a diaphragm structure. The piezoelectric thin film resonator 732 includes, from the insulating layer 733, a lower electrode (electrode) 735 made of Al, Al/Ti, or other suitable material, a piezoelectric thin film 736 made of ZnO, AlN, or other suitable material, and an upper electrode (electrode) 737 made of Al, Al/Ti, or other suitable material. The piezoelectric thin film resonator 732 includes a vibrator having a structure in which a thin film section, including at least one layer of piezoelectric thin film, is sandwiched between a pair of lower electrode and upper electrode with the upper surface and the lower surface thereof facing the lower electrode and the upper electrode. An insulating layer 738 is disposed on the surface of the base substrate 731 opposite from the surface of the base substrate 731 bearing the insulating layer 733.

A resist pattern 740 for disposing the adhesive layer is provided on the piezoelectric resonator 732. An adhesive layer 741 is disposed on the insulating layer 738 arranged on the surface of the base substrate 731 opposite from the surface of the base substrate 731 bearing the insulating layer 733. The adhesive layer 741 has a multi-layer structure of Au (1 μm)/Ni (1 μm)/Ti (0.3 μm). These layers function in substantially the same manner to the base substrate 713.

In process step 8, an adhesive layer 742 identical in structure to the adhesive layer 741 is disposed in accordance with the resist pattern 740.

In process step 9, the resist pattern 740 is lifted off, and the piezoelectric thin film element 730 is thus manufactured.

Referring to FIG. 44, the piezoelectric thin film filter is manufactured by bonding the bonding substrate 710, the piezoelectric thin film element 730, and the lid substrate 720 in process steps 10–11.

In process step 10, the bonding substrate 710, the piezoelectric thin film element 730, and the lid substrate 720 are aligned, and a heat treatment is performed to bond the adhesive layer 742 of the piezoelectric thin film element 730 to the adhesive layer 704 of the bonding substrate 710 and to bond the adhesive layer 741 of the piezoelectric thin film element 730 to the adhesive layer 713 of the lid substrate 720. An external terminal connection member 751 and an external terminal 752 are produced along the through-hole 702.

In process step 11, the piezoelectric thin-film filter 700 is completed by performing a dicing operation at a desired position. When the piezoelectric thin film element is diced, the rotational speed and advance speed of a blade must be slowed to avoid damage to the diaphragms during dicing. Since the diaphragm is protected in the present preferred embodiment, the dicing operation is performed at standard dicing speeds. Thus, the surface acoustic wave filter is efficiently manufactured.

The above-referenced surface acoustic wave filter maintains the vibratory space of the piezoelectric resonator 732 between the piezoelectric thin film element 730 and the bonding substrate 710.

The resist patterns 703, 712, 740 are formed such that the adhesive layers 704 and 742 face each other, and such that the adhesive layers 713 and 741 face each other. Since the adhesive layers are produced using the resist patterns, pattern precision and alignment accuracy of each adhesive layer is improved. Margins during manufacturing are thus reduced, and the filters are miniaturized. The use of the resist pattern enables the features of each substrate to be concurrently processed. The manufacturing of the filter is simplified and the costs are reduced. The resist pattern is processed using a developer and a peeling liquid. In comparison with etching, the use of the resist pattern forms the adhesive layer without damaging the piezoelectric thin film element.

Figure 45:
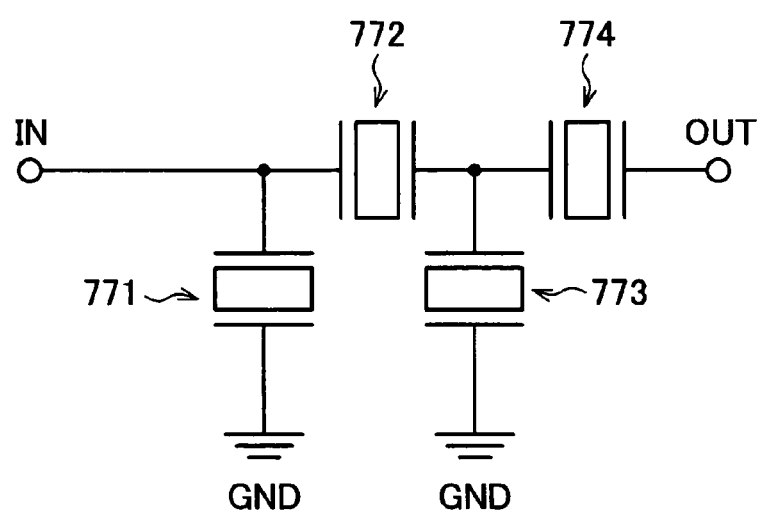
FIG. 45 is a circuit diagram of the piezoelectric thin-film filter in accordance with the ninth preferred embodiment of the present invention.

FIG. 45 illustrates piezoelectric thin film resonators (vibrators) 771–774 arranged in a ladder configuration as the piezoelectric thin-film filter 700. In the piezoelectric thin-film filter 700, the piezoelectric thin film resonators 771 and 773 are parallel resonators, and the piezoelectric thin film resonators 772 and 774 are serial resonators.

Figure 46:
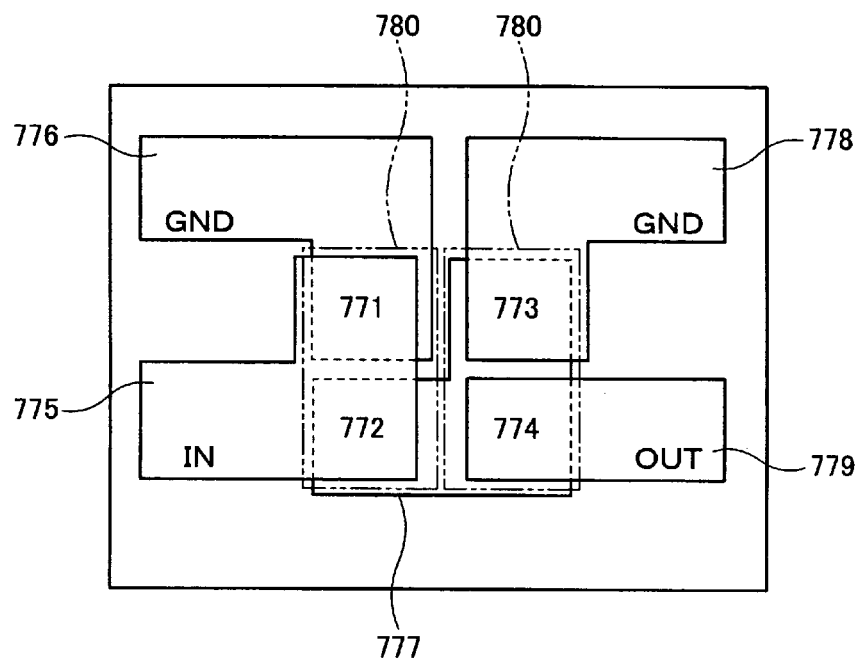
FIG. 46 is a plan view of a piezoelectric thin film filter of FIG. 45.

In this arrangement as shown in FIG. 46, the upper electrodes of the serial resonator 772 and the parallel resonator 771 are integrated into an upper electrode 775. The lower electrode of the parallel resonator 771 defines a GND 776. The lower electrodes of the serial resonators 772 and 774 and the parallel resonator 773 are integrated into a lower electrode 777. The upper electrode of the parallel resonator 773 defines a GND 778. The upper electrode of the serial resonator 774 defines an upper electrode 779. Broken lines 780 and 780 in FIG. 46 represent the diaphragms of the thin-film filter 770 and this piezoelectric thin film resonator includes two diaphragms. The piezoelectric thin film is not shown in FIG. 46.

An Sn/Au/Ni/Ti layer is used for the adhesive layer 704 of the bonding substrate 710, and the adhesive layer 713 of the lid substrate, and Au/Ni/Ti layer is used for the adhesive layers 741 and 742 of the piezoelectric thin film element 730. Within a low temperature range from about 280° C.–330° C., the adhesive layer 704 is bonded to the adhesive layer 742 and the adhesive layer 713 is bonded to the adhesive layer 741. At a composition ratio of Sn:Au= about 2:3, the bonding operation is preferably performed at a bonding temperature of about 300° C. for about 60 seconds. The Pressure used is preferably about 0.5 Pa or higher. This condition may be modified depending upon the composition ratio. The Au layer may be replaced with a Cu layer or an Ag layer.

Within the above-mentioned temperature range, almost no damage is caused to the piezoelectric thin film resonator. Stress, deflection, and distortion due to a difference in linear thermal expansion coefficient between the bonding substrate, the lid substrate, and films formed on these substrate are effectively controlled. The reliability of the filter is improved. In the above discussion, the Sn layer is deposited on one adhesive layer of the substrate to be bonded. Alternatively, Sn layers may be deposited on the adhesive layers of both substrates. However, if the Sn layers are deposited on the adhesive layers of both substrates, Sn easily spreads which improves bonding strength and air-tightness and enhances the reliability of the filter.

The adhesive layer accommodates the deflection of the bonding substrate, the piezoelectric thin film element, and the lid substrate. After the bonding operation, the melting point of the bonding substrate, the piezoelectric thin film element, and the lid substrate is relatively high, which enhances the reliability of the filter. A process such as a reflow operation is possible.

Preferably, the bonding substrate and the lid substrate are highly transparent, have a high degree of insulation, and have similar linear thermal expansion coefficients to that of the base substrate. Hard glass satisfies such requirements. If the substrate is transparent, alignment is easily performed, and encapsulation is easily verified in a dip test. A high degree of insulation controls adverse effects, such as parasitic capacitance even if the filter is used for a high-frequency device. The use of the substrate having a similar linear thermal expansion coefficient to that of the base substrate effectively controls stress, deflection, and distortion due to a difference in linear thermal expansion coefficient, and improves the reliability of the filter. Hard glass satisfies such requirements. Hard glass is inexpensive, which reduces the cost of the filter. Hard glass is chemically stable, and even if hard glass is used in a process such as plating, or vacuum film forming, film degradation and reduced bonding strength of the formed film are effectively controlled.

These arrangements are applicable to the surface acoustic wave filters of the first through eighth preferred embodiments.

The thickness of the adhesive layer maintains the protective space of the piezoelectric thin film resonator. As already discussed in connection with the first through eighth preferred embodiments, the resin layer disposed on the surface of the adhesive layer facing the piezoelectric thin film resonator maintains the protective space. As already discussed in connection with the first through eighth preferred embodiments, routed wiring lines, L patterns and C patterns are arranged on the resin layer.

The present invention is not limited to the above-described preferred embodiments, a variety of modifications is possible within the scope defined by the claims, and a preferred embodiment that is obtained as a result of appropriately combining technical aspects of different preferred embodiments is within the technical scope of the present invention.

The piezoelectric component, such as the surface acoustic wave device and the piezoelectric filter, for use in a delay line or a filter is miniaturized. The piezoelectric component is used in a communication apparatus, such as a cellular phone, and the communication apparatus is miniaturized.

The invention claimed is:

1. A piezoelectric component comprising:
a piezoelectric element including a substrate, at least one vibrator and an element wiring line connected to the vibrator disposed on the substrate, and a bonding substrate that is bonded to the vibrator such that a protective space is provided for the vibrator; wherein
the piezoelectric element is bonded to the bonding substrate by an adhesive layer including a solder layer;
the piezoelectric component includes a resin layer disposed between the piezoelectric element and the bonding substrate and having a desired thickness to provide the protective space of the vibrator and having an opening portion, and a first wiring line arranged in the opening portion in the resin layer and connected to the element wiring line; and the bonding substrate includes a through-hole and the first wiring line is connected to an external terminal through an external connection terminal member disposed in the through-hole.

2. A piezoelectric component according to claim 1, wherein the first wiring line includes at least one of a capacitance and an inductor.

3. A piezoelectric component according to claim 1, wherein the resin layer includes an opening portion corresponding to at least the vibrator and a portion of the element wiring line connected to the vibrator.

4. A piezoelectric component comprising:
a piezoelectric element including a substrate, at least one vibrator and an element wiring line connected to the vibrator disposed on the substrate, and a bonding substrate that is bonded to the vibrator such that a protective space is provided for the vibrator; wherein
the bonding substrate includes a through-hole and an external terminal that is connected to the element wiring line through an external connection terminal member disposed in the through-hole; and
the piezoelectric element is bonded to the bonding substrate by an adhesive layer including a solder layer.

5. A piezoelectric component according to claim 4, further comprising a resin layer disposed between the piezoelectric element and the bonding substrate and having a desired thickness to provide the protective space of the vibrator.

6. A piezoelectric component according to claim 4, wherein the adhesive layer including the solder layer is disposed in an outline frame extending along a periphery of at least the piezoelectric element and the bonding substrate.

7. A piezoelectric component according to claim 4, wherein the protective space is maintained by the thickness of the adhesive layer.

8. A piezoelectric component according to claim 4, wherein the protective space is maintained by a recess that is provided in the bonding substrate at a location facing the vibrator of the piezoelectric element.

9. A piezoelectric component according to claim 8, wherein a metal layer is disposed in the recess.

10. A piezoelectric component according to claim 4, wherein the solder layer includes a plurality of sublayers including at least an Sn sublayer and a sublayer made of one of Au, Ag, Cu, and Ni.

11. A piezoelectric component according to claim 4, further comprising a bonding layer disposed between the element wiring line of the piezoelectric element and the solder layer of the adhesive layer.

12. A piezoelectric component according to claim 4, wherein the bonding layer includes a plurality of sublayers, and a bottom most sublayer of said plurality of sublayers is made of one of Ti and NiCr.

13. A piezoelectric component according to claim 4, wherein the bonding layer includes an underlayer disposed between the bonding substrate and the solder layer, wherein the underlayer is a laminate of a layer made of one of Ni, Cu, Pt, and Pd and a layer made of one of Ti and NiCr.

14. A piezoelectric component according to claim 4, wherein the piezoelectric element is a surface acoustic wave element having the vibrator including at least one interdigital transducer disposed on a piezoelectric substrate as the substrate.

15. A piezoelectric component according to claim 4, wherein the piezoelectric element is a thin-film piezoelectric element disposed in a recess or an opening portion of the substrate, the thin-film piezoelectric element includes at least one piezoelectric resonator having the vibrator that includes a thin film section including at least one piezoelectric thin film layer that is sandwiched between at least a pair of opposed upper and lower electrodes with a top surface and a bottom surface of the thin film section respectively facing the upper electrode and the lower electrode.

16. A piezoelectric component according to claim 15, wherein the substrate of the piezoelectric element is made of Si, and wherein the bonding substrate is made of hard glass.

17. A piezoelectric component according to claim 4, wherein the piezoelectric element is a thin-film piezoelectric element including the vibrator disposed on the substrate, and including a thin film section, including at least one piezoelectric thin film layer that is sandwiched between at least a pair of opposed upper and lower electrodes with a top surface and a bottom surface of the thin film section respectively facing the upper electrode and the lower electrode, and the piezoelectric thin film element includes a space between the substrate and the lower electrode of the vibrator.

* * * * *